(12) United States Patent
Yamaguchi et al.

(10) Patent No.: US 7,521,368 B2
(45) Date of Patent: Apr. 21, 2009

(54) METHOD FOR MANUFACTURING SEMICONDUCTOR DEVICE

(75) Inventors: Tetsuji Yamaguchi, Atsugi (JP); Etsuko Asano, Atsugi (JP); Naomi Yazaki, Atsugi (JP); Tomoya Futamura, Atsugi (JP); Tomoko Nishikawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 130 days.

(21) Appl. No.: 11/121,110

(22) Filed: May 4, 2005

(65) Prior Publication Data

US 2005/0250308 A1 Nov. 10, 2005

(30) Foreign Application Priority Data

May 7, 2004 (JP) ............................. 2004-139148
Jul. 13, 2004 (JP) ............................. 2004-205413

(51) Int. Cl.
*H01L 21/302* (2006.01)
*H01L 21/461* (2006.01)

(52) U.S. Cl. ...................... 438/706; 438/197; 438/513; 438/637; 438/680; 257/E21.17; 257/E21.245; 257/E21.585; 257/E21.632; 257/E21.229

(58) Field of Classification Search .................. 438/706, 438/30, 142, 197, 258, 289, 290, 291, 474, 438/475, 513, 660, 662, 663, 637, 680, 618, 438/740, 752, 753, 782, 933, 954
See application file for complete search history.

(56) References Cited

U.S. PATENT DOCUMENTS

| | | | | |
|---|---|---|---|---|
| 5,877,083 A | * | 3/1999 | Yamazaki | .................... 438/635 |
| 5,946,561 A | * | 8/1999 | Yamazaki et al. | ............ 438/166 |
| 6,072,221 A | * | 6/2000 | Hieda | .......................... 257/382 |
| 6,259,505 B1 | * | 7/2001 | Makino | ....................... 349/153 |
| 6,403,395 B2 | * | 6/2002 | Hirabayashi et al. | .......... 438/69 |
| 6,613,621 B2 | * | 9/2003 | Uh et al. | ..................... 438/183 |
| 6,737,306 B2 | * | 5/2004 | Yamazaki et al. | ............ 438/155 |
| 6,784,457 B2 | * | 8/2004 | Yamazaki et al. | ............. 257/72 |
| 6,888,164 B2 | * | 5/2005 | Tanaka | ......................... 257/72 |
| 6,903,377 B2 | * | 6/2005 | Yamazaki et al. | ............. 257/88 |
| 6,909,114 B1 | * | 6/2005 | Yamazaki | .................... 257/66 |
| 7,015,080 B2 | | 3/2006 | Ishikawa | |

(Continued)

FOREIGN PATENT DOCUMENTS

JP          05-166945          7/1993

OTHER PUBLICATIONS

Office Action (Application No. 200510068687.3) dated Feb. 1, 2008.

*Primary Examiner*—David Nhu
(74) *Attorney, Agent, or Firm*—Eric J. Robinson; Robinson Intellectual Property Law Office, P.C.

(57) ABSTRACT

The present invention provides a method for manufacturing a semiconductor device having high characteristic and reliability. The etching damage during dry etching after forming an electrode or a wiring over an insulating film is prevented. The damage is suppressed by forming a conductive layer so that charged particles due to plasma during dry etching are not generated in a semiconductor layer. Accordingly, it is an object of the invention to provide a method not for generating the deterioration of the transistor characteristic especially in a thin film transistor having a minute structure.

18 Claims, 34 Drawing Sheets

U.S. PATENT DOCUMENTS

| | | | |
|---|---|---|---|
| 7,141,822 B2 * | 11/2006 | Nakamura et al. | 257/72 |
| 2001/0055842 A1 * | 12/2001 | Uh et al. | 438/183 |
| 2002/0068394 A1 * | 6/2002 | Tokushige et al. | 438/183 |
| 2003/0186489 A1 | 10/2003 | Ishikawa | |
| 2004/0058527 A1 | 3/2004 | Yamazaki et al. | |
| 2006/0128080 A1 | 6/2006 | Ishikawa | |

* cited by examiner

Nch

Pch solid line: before treatment    broken line: after treatment

FIG. 11A
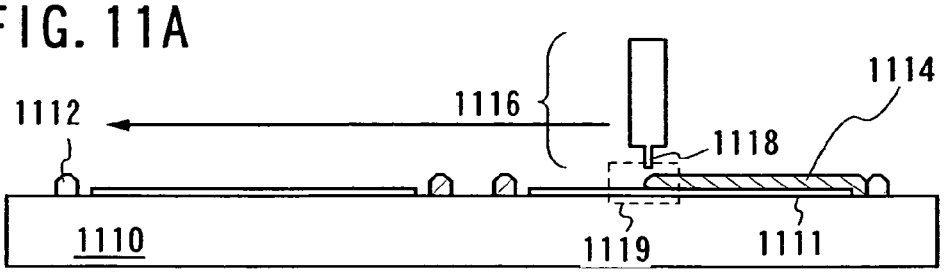
FIG. 11B
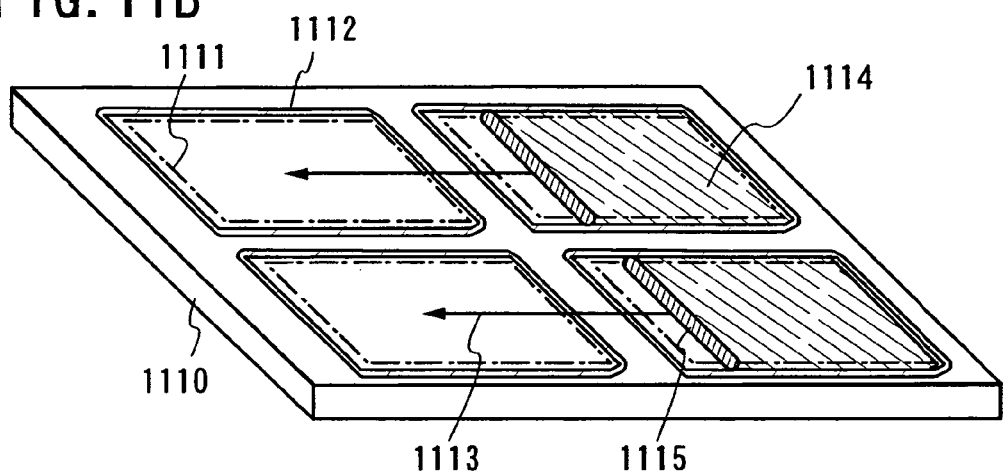
FIG. 11C ENLARGED VIEW of 1119
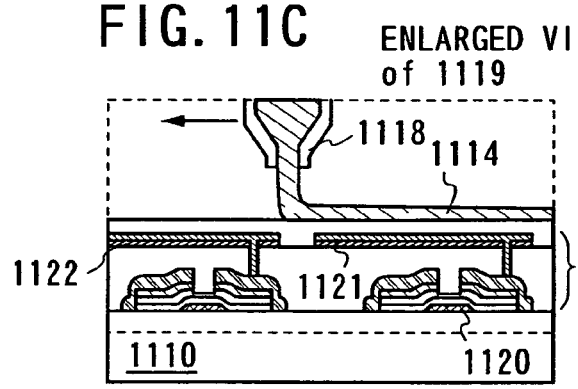
FIG. 11D ENLARGED VIEW of 1119
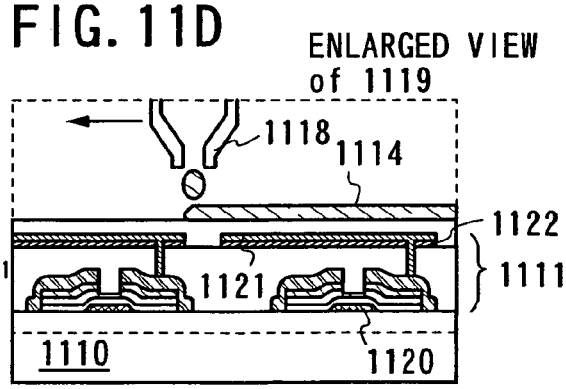

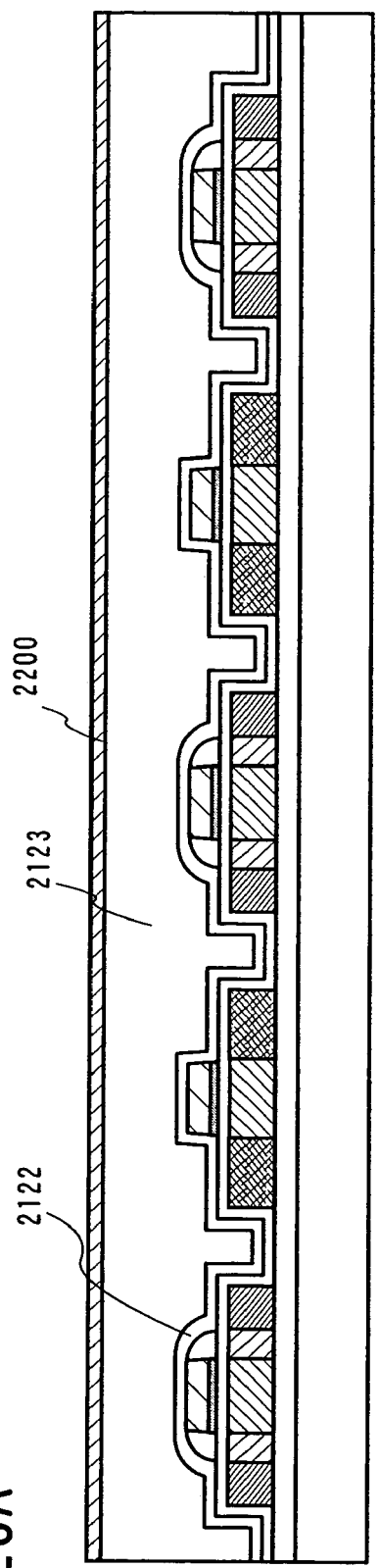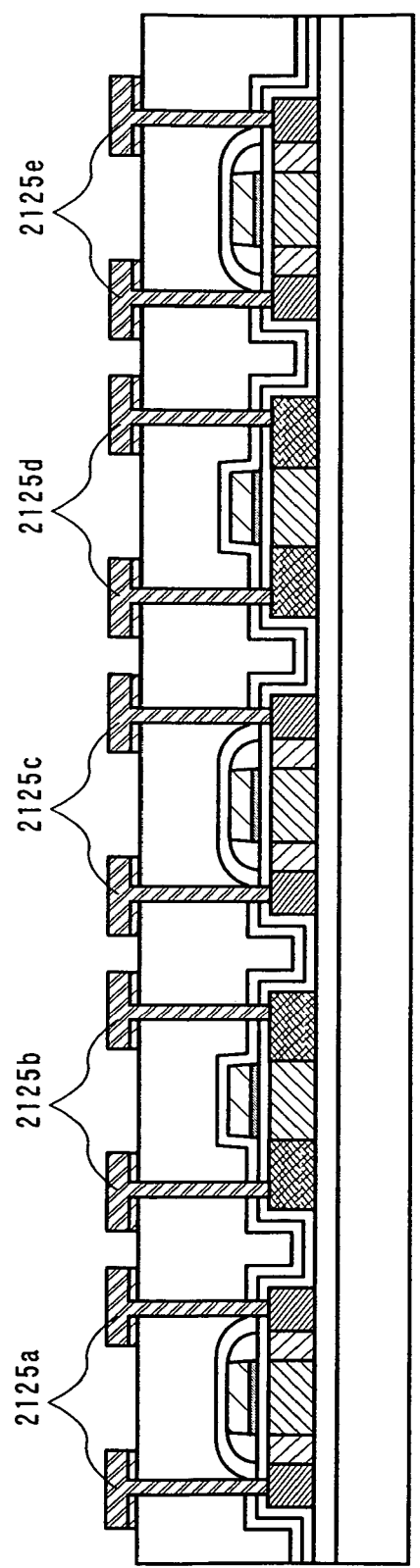
FIG. 20A
FIG. 20B

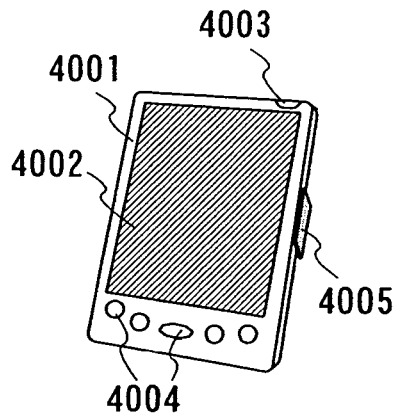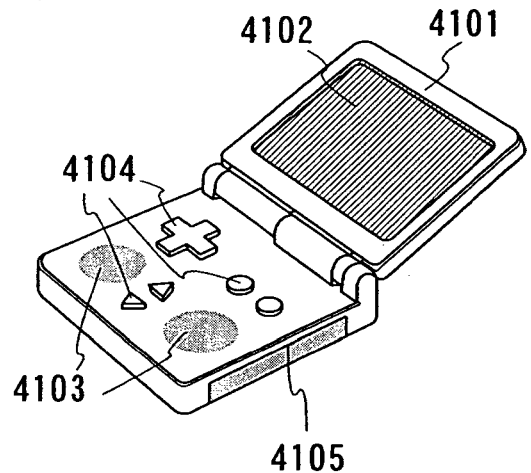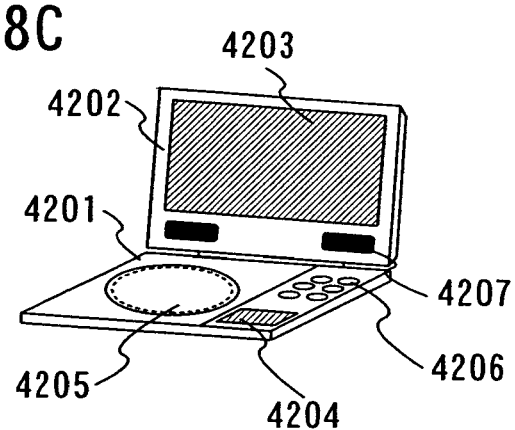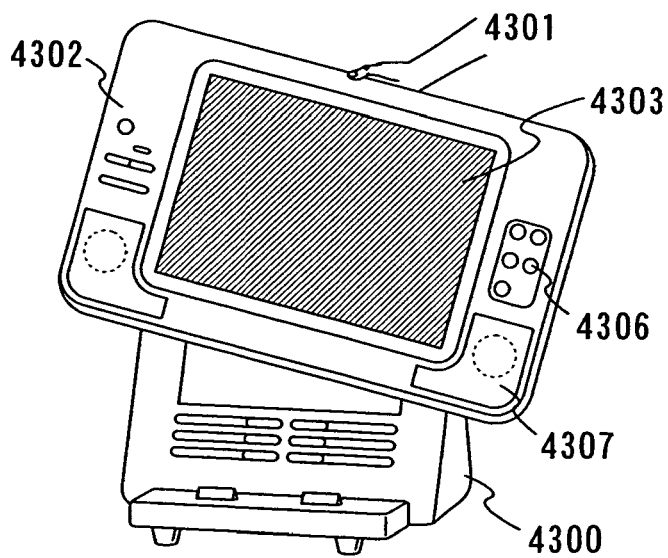

solid line: before treatment    broken line: after treatment

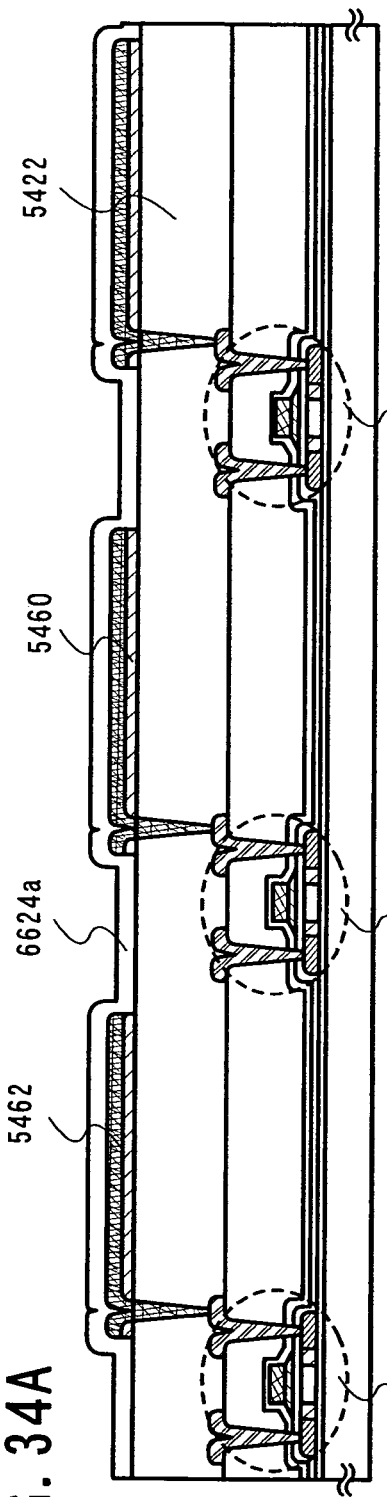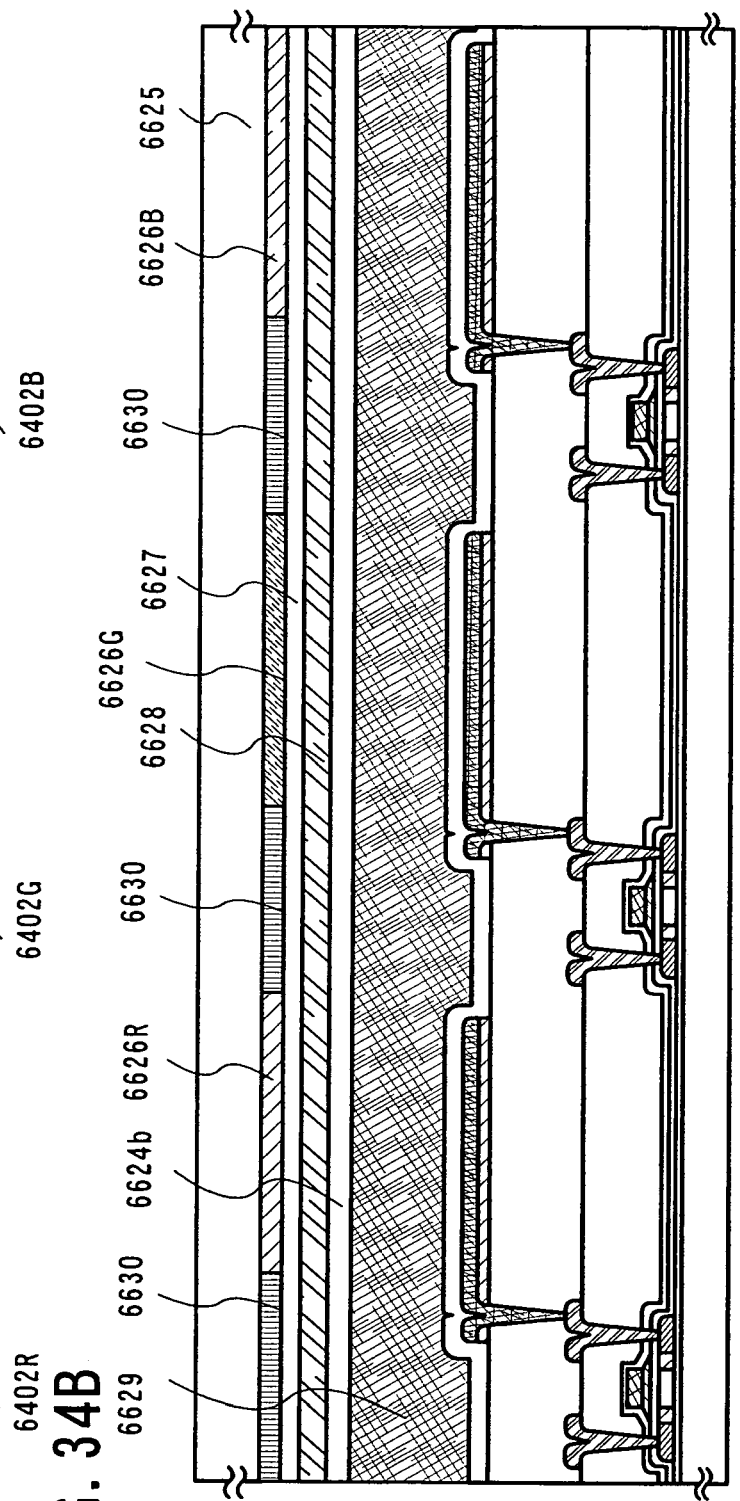

METHOD FOR MANUFACTURING SEMICONDUCTOR DEVICE

BACKGROUND OF THE INVENTION

1. Field of the Present Invention

The present invention relates to a semiconductor apparatus comprising a circuit including a thin film transistor (hereinafter, referred to as a TFT) and a method for manufacturing the semiconductor apparatus. For example, the present invention relates to an electro-optical device typified by a liquid crystal display panel, an EL (an electroluminescence) display device, an EC display device, and the like. In addition, the present invention relates to an electric device for improving processing rate formed by using the TFT, for example a central processing unit (CPU), and a method for manufacturing the electric device. Further, the present invention relates to an electric apparatus equipped with these electro-optical device and electric device as the components.

2. Description of the Related Art

In recent years, a thin film transistor (TFT) is formed using a semiconductor film formed over a substrate having an insulating surface, and a semiconductor apparatus having a large-sized integrated circuit formed of the TFT has been developed actively.

In the semiconductor apparatus having such a large-sized integrated circuit, each device for forming the semiconductor apparatus is miniaturized and integrated.

Therefore, it has become much more important to perform, for example, a process of forming a multilayer wiring after forming the TFT, as the devices are miniaturized and integrated. In the process of forming a multilayer wiring, a series of process of forming an insulating film after forming the TFT, forming a contact hole, and forming a wiring is repeated.

In this process of forming a multilayer wiring, a contact hole is usually formed in an insulating film by performing the processes of forming, patterning, and etching an insulating film.

However, it is apparent that a phenomenon to damage the insulating film occurs when this contact hole is formed (for example, see Reference 1, Japanese Patent Laid-Open No. H5-166945).

Dry etching and wet etching can be considered as the method for forming the contact hole in the insulating film. However, in order to form a minute contact hole as the size of the devices is miniaturized, it is general to employ dry etching using plasma.

However, there is a fear that the transistor characteristic of the TFT is deteriorated by physical damage, charge up damage, damage due to X-ray or ultraviolet radiation, or the like during dry etching.

In particular, when plasma is generated for etching, charged particles of an electron, an ion, or the like is injected into a gate electrode or gate wiring, or a source electrode or drain electrode of the TFT through the insulating film at the time of forming the contact hole in the insulating film over the TFT. When the contact hole is formed in an interlayer insulating film in a multilayer wiring structure, the charged particles are injected no matter how the interlayer insulating film is formed in an upper layer of the TFT. For example, when the contact hole is formed in a first interlayer insulating film being in direct contact with the TFT, the charged particles are injected into the gate electrode or gate wiring, or the source electrode or drain electrode. In addition, when a second wiring connected to the gate electrode or gate wiring, or the source electrode or drain electrode is formed over the first interlayer insulating film and a second interlayer insulating film is formed over the second wiring, the charged particles are injected into the second wiring at the time of forming the contact hole formed in the second interlayer insulating film. Further, since the second wiring is connected to the gate electrode or gate wiring, or the source electrode or drain electrode, the charged particles are injected into up to the gate electrode or gate wiring, or the source electrode or drain electrode through the second wiring. In other words, when the contact hole is formed, the charged particles are injected into up to the gate electrode or gate wiring, or the source electrode or drain electrode by operating the wiring placed in the lower layer as an antenna. Then, the charged particles that reaches the gate electrode or gate wiring, or the source electrode or drain electrode generates potential difference between the gate electrode or gate wiring and a source (or drain) region of the TFT. Therefore, an electric field is applied to a gate insulating film and the gate insulating film is given damage of dielectric breakdown when this electric field is strong. Although there is no breakdown of the gate insulating film, the transistor characteristic is deteriorated, for example, the threshold voltage of the TFT is shifted, or the variation in characteristic is increased.

In addition, this deterioration of the transistor characteristic is more apparent in the TFT having a minute structure.

This is because the injected charged particles are concentrated in a small area and the electric field generated in the gate insulating film becomes larger. Therefore, the damage to a TFT is heavier in the TFT having a minute structure.

SUMMARY OF THE PRESENT INVENTION

It is an object of the present invention to prevent the etching damage during dry etching of the interlayer insulating film after forming the TFT in the processes of manufacturing a TFT. Further, it is another object of the present invention to provide a method for not deteriorating the transistor characteristic especially in the TFT having a minute structure.

The damage during dry etching after forming the electrode is considered to result from an insulating material, such as an interlayer insulating film or a resist, only which exists over an electrode or a wiring electrically connected to the TFT at the time of forming a contact hole in the interlayer insulating film after forming the TFT. In other words, the charged particles generated during etching are injected into a conductive film, that is, an electrode or a wiring electrically connected to the TFT, through an insulating film. This is considered to result in deteriorating the TFT characteristic.

According to the present invention, when an electrode or a wiring electrically connected to the TFT which is formed beneath an insulating film in which the contact hole is formed, a conductive material film which does not have electrical contact with the TFT is formed over the electrode or wiring. Accordingly, damage during etching can be prevented at the time of performing etching for forming the contact hole.

By forming such a conductive material film, the charged particles generated by plasma can be prevented from dispersing into the conductive material film to reach the TFT in the lower layer. Therefore, it is possible to suppress the deterioration in the transistor characteristic of the TFT.

In other words, the charged particles generated by plasma are trapped in the conductive material film having floating potential and does not reach the TFT. Therefore, the deterioration of the TFT characteristic, for example generation of the damage to the gate insulating film of the TFT due to the injection of the charged particles, can be prevented.

Such a conductive material film is referred to as a "cap film" in this specification. This is because the conductive material film protects an element such as the TFT formed in the lower layer by capping it at the time of etching. Especially when the conductive material film is a metal film, the conductive material film is referred to as a "metal cap film".

The present invention includes the following structure. Hereinafter, a method for minimizing the damage at the time of forming the contact hole in the insulating film formed over the electrode or wiring after forming the electrode or wiring connected to the TFT is described. This is because a large-sized electrode in the upper part formed of the electrode or wiring functions as an antenna, which gathers the charged particles, in etching to form the contact hole after forming the large-sized electrode in the upper part connected to the TFT through the electrode or wiring. Therefore, it is apparent to suppress the etching damage and thus the advantageous effect of the present invention is prominent. Of course, an insulating film in any layer can be etched as long as etching is performed to form the contact hole.

According to the present invention, a method for manufacturing a semiconductor apparatus comprises the processes of forming a semiconductor layer, a gate insulating film, and a gate electrode over a substrate; forming an interlayer insulating film over the semiconductor layer, the gate insulating film, and the gate electrode; forming a conductive film over the interlayer insulating film; and forming a contact hole in the interlayer insulating film and the conductive film by dry etching.

According to the present invention, a method for manufacturing a semiconductor apparatus comprises the processes of forming a semiconductor layer, a gate insulating film, and a gate electrode over a substrate; forming an interlayer insulating film over the semiconductor layer, the gate insulating film, and the gate electrode; forming a conductive film over the interlayer insulating film; forming a contact hole in the interlayer insulating film and the conductive film; forming a second electrode connecting to the semiconductor layer or the gate electrode through the contact hole; and removing part of the conductive film in a self-aligned manner by using the second electrode as a mask.

According to the present invention, the conductive film contains Ti, Ta, W, or nitride thereof.

According to the present invention, a method for manufacturing a semiconductor apparatus comprises the processes of: forming a semiconductor layer, a gate insulating film, and a gate electrode over a substrate; forming a first interlayer insulating film over the semiconductor layer, the gate insulating film, and the gate electrode; forming a first conductive film which is to be a first cap film over the first interlayer insulating film; forming a first contact hole in the first interlayer insulating film and the first cap film; forming a second electrode connecting to the semiconductor layer or the gate electrode through the first contact hole; removing part of the first conductive film in a self-aligned manner by using the second electrode as a mask; forming a second interlayer insulating film over the first interlayer insulating film and the second electrode; forming a second conductive film which is to be a second cap film over the second interlayer insulating film; and forming a second contact hole in the second interlayer insulating film and the second cap film by dry etching.

According to the present invention, the gate electrode layer is part of a gate wiring.

According to the present invention, the gate electrode is electrically connected to the gate wiring.

According to the present invention, the second electrode is part of a wiring.

According to the present invention, the second electrode is electrically connected to a wiring.

According to the present invention, a third electrode is formed through the second contact hole over the second conductive film.

According to the present invention, the third electrode is part of a wiring.

According to the present invention, the third electrode is electrically connected to a wiring.

According to the present invention, the second interlayer insulating film is a planarizing film.

According to the present invention, the first conductive film contains Ti, Ta, W, or nitride thereof.

According to the present invention, the second conductive film contains Ti, Ta, W, or nitride thereof.

According to the present invention, the second interlayer insulating film contains an organic material.

According to the present invention, the second interlayer insulating film contains a silicon oxide film formed using siloxane.

According to the present invention, the part where the first conductive film is not removed is used as the part of the second electrode.

Further, the semiconductor apparatus (device) means in this specification an apparatus (a device) that can function by utilizing the semiconductor characteristic, and an electro-optical device, an electric device, a semiconductor circuit, or an electric apparatus is a semiconductor apparatus (device).

According to the present invention, although dry etching is performed to the interlayer insulating film after forming the electrode, the charged particles generated by plasma during dry etching are not injected into the TFT through an insulating film. Therefore, the transistor characteristic of the TFT is not deteriorated; thus, a reliable semiconductor apparatus can be obtained.

BRIEF DESCRIPTION OF THE DRAWINGS

FIGS. 11A to 11D are cross-sectional views and a perspective view each illustrating a process of manufacturing a liquid crystal display device using a method for dropping liquid crystals according to a certain aspect of the present invention;

FIGS. 20A and 20B are cross-sectional views each illustrating a process of manufacturing a CPU according to a certain aspect of the present invention;

FIGS. 28A to 28D are views each illustrating an example of an electric apparatus to which the present invention is applied;

FIGS. 34A and 34B are cross-sectional views each illustrating a process of manufacturing a reflective liquid crystal display device according to a certain aspect of the present invention.

DETAILED DESCRIPTION OF THE PRESENT INVENTION

EMBODIMENT MODE

Embodiment Mode of the present invention will be described below with reference to the accompanying drawings. However, it is easily understood by those skilled in the art that various modes will be applicable to the present invention and various changes and modifications will be apparent unless such changes and modifications depart from the purpose and scope of the present invention. Therefore, the present invention is not interpreted with limiting to the description in this embodiment mode.

A process of manufacturing a semiconductor apparatus according to this embodiment mode is described below with reference to FIGS. 1A to 1D, FIGS. 2A to 2C, and FIG. 3.

Figure 1A:
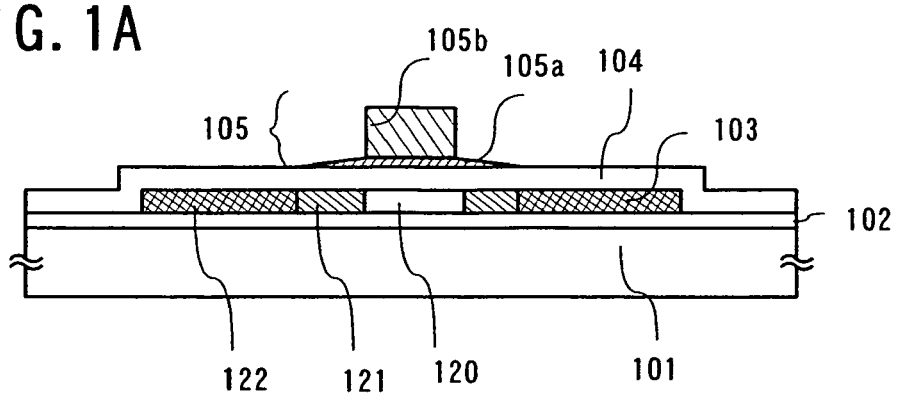
FIGS. 1A to 1D are cross-sectional views each illustrating a process of manufacturing a semiconductor apparatus according to a certain aspect of the present invention.

Firstly, a thin film transistor (TFT) is manufactured. A base film 102, a semiconductor layer 103 which is to be an active layer, a gate insulating film 104, and a gate electrode 105 are formed over a substrate 101 (FIG. 1A).

A substrate such as a glass substrate, a quartz substrate or a silicon substrate, or a metal substrate or a stainless steel substrate, in which an insulating film is formed on a surface thereof, may also be used for the substrate 101. Alternatively, a heat-resistant plastic substrate that can withstand a processing temperature may also be used In addition, the base film 102 formed of an insulating film such as a silicon oxide film (SiO), silicon nitride film (SiN), a silicon nitride film containing oxygen (SiNO film), or a silicon oxide film containing nitrogen (SiON) is formed. An example using a single-layered film for the base film 102 is described here; however, a structure in which two or more layers of the insulating film are stacked may be employed. Further, the base film may not be formed.

In addition, a semiconductor film having an amorphous structure is deposited by a known means (a sputtering method, an LPCVD method, a plasma CVD method, or the like). Thereafter, the semiconductor layer 103 is formed by patterning a crystalline semiconductor film obtained by known crystallization treatment (a laser crystallization method, a thermal crystallization method, a thermal crystallization method using a catalyst such as nickel, or the like) into a desired shape by using a photomask. Although the material of the crystalline semiconductor film is not limited, it is preferable to form the crystalline semiconductor film by using silicon (Si) or a silicon germanium (SiGe) alloy.

A microcrystalline semiconductor film formed by a plasma CVD method or the like may be used as the crystalline semiconductor film by further being crystallized with a laser.

A channel formation region 120, a low-concentration impurity region 121, and a high-concentration impurity region 122 are formed in the semiconductor layer 103 by introducing impurities.

The gate insulating film 104 is formed of an insulating film containing silicon in a single-layered structure or a multi-layered structure by using a plasma CVD method or a sputtering method.

The gate electrode 105 is formed by employing a single-layered structure of a conductive film or a structure in which two or more layers of the conductive film are stacked. When two or more layers of the conductive film are stacked, the gate electrode may be formed by stacking an element selected from tantalum (Ta), tungsten (W), titanium (Ti), molybdenum (Mo), and aluminum (Al); or an alloy material or a compound material containing the element as the main component. In addition, the gate electrode may be formed by using a semiconductor film typified by a polycrystalline silicon film doped with an impurity element such as phosphorus (P).

In this embodiment mode, the gate electrode 105 is formed by using a stacked film in which tantalum nitride (TaN) 105a and tungsten (W) 105b are each stacked in a thickness of 30 nm and 370 nm.

The gate electrode 105 may be formed as part of a gate wiring or may be formed by forming a gate wiring separately to connect the gate electrode 105 to the gate wiring.

Then, a first interlayer insulating film 106 is formed by covering the semiconductor layer 103, the gate insulating film 104, and the gate electrode 105.

The first interlayer insulating film 106 is formed of an insulating film containing silicon, for example a silicon oxide film (SiO), a silicon nitride film (SiN), a silicon oxide film containing nitrogen (SiON), or a stacked film thereof, by using a plasma CVD method or a sputtering method. Of course, the material of the first interlayer insulating film 106 is not limited to a silicon nitride film containing oxygen or a silicon nitride film, or a stacked film thereof, and another insulating film containing silicon may be used in a single-layered structure or a stacked structure.

In this embodiment mode, a stacked film in which a silicon oxide film containing nitrogen (SiON), a silicon nitride film (SiN), and a silicon oxide film containing nitrogen (SiON) are each stacked in a thickness of 50 nm, 50 nm, and 600 nm is used as the first interlayer insulating film 106.

Then, a conductive material film 130 is formed over the first interlayer insulating film 106. Since this conductive material film 130 is not in contact with an electrode or a wiring in the lower layer, the conductive material film 130 is not electrically connected to the TFT, too.

A refractory metal such as titanium (Ti), tantalum (Ta), or tungsten (W), or nitride thereof is preferably used as the conductive material film 130. Such a refractory metal or nitride thereof can also be used as a barrier metal of a wiring as well as a metal cap film at the time of forming a contact hole, which is convenient.

The conductive material film 130 has a function to suppress damage to the electrode or wiring, the insulating film, and the semiconductor layer beneath by trapping the charged particles generated during dry etching. In other words, since the conductive material film 130 caps and protects the layer structure of the lower layer, the conductive material film 130 can be referred to as a "cap film". When the conductive material film 130 is formed of a metal film, the conductive material film 130 may also be referred to as a "metal cap film".

Figure 1B:
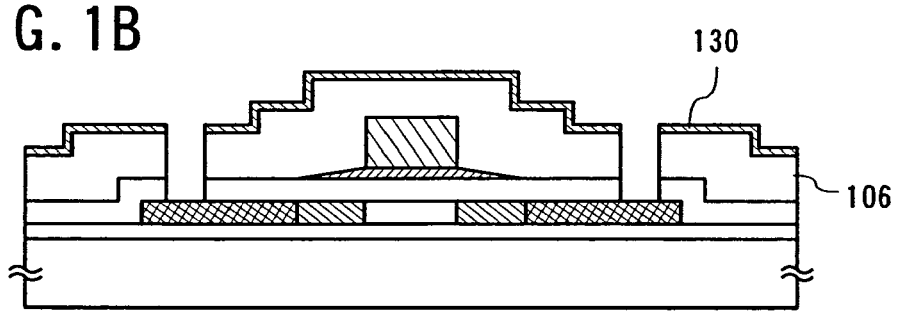

The first interlayer insulating film 106 and the conductive material film 130 are etched to form the contact holes reaching the semiconductor layer 103 in the first interlayer insulating film 106 and the conductive material film 130 (FIG. 1B).

Electrodes or wirings 107 and 108 are formed by forming a metal film and patterning the metal film through the contact holes over the first interlayer insulating film 106. At that time, the conductive material film 130 is also patterned.

A film formed of an element of aluminum (Al), titanium (Ti), molybdenum (Mo), tungsten (W), or silicon (Si), or an alloy film using these elements may be used for the metal film. In this embodiment mode, a titanium film (Ti), a titanium nitride film (TiN), a silicon-aluminum alloy film (Al—Si), and a titanium film (Ti) are each stacked in a thickness of 60 nm, 40 nm, 300 nm, and 100 nm, and thereafter patterned and etched into a desired shape to form the electrodes or wirings 107 and 108.

The electrodes or wirings 107 and 108 each may be formed by integrating an electrode and a wiring or by forming an electrode and a wiring separately to connect them to each other.

Figure 1C:
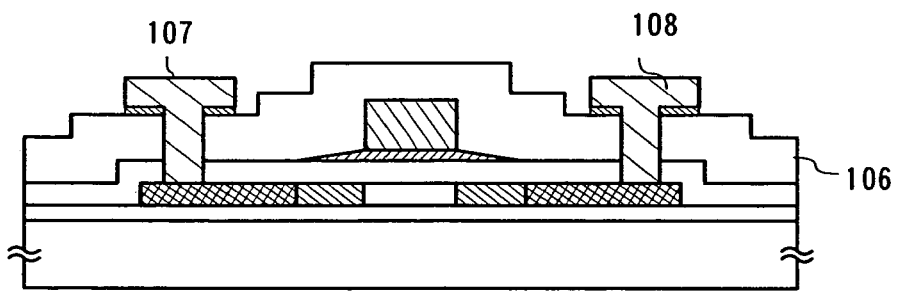

In addition, after patterning the conductive material film 130, the remaining part may be used as part of the electrodes or wirings 107 and 108 (FIG. 1C).

Figure 1D:
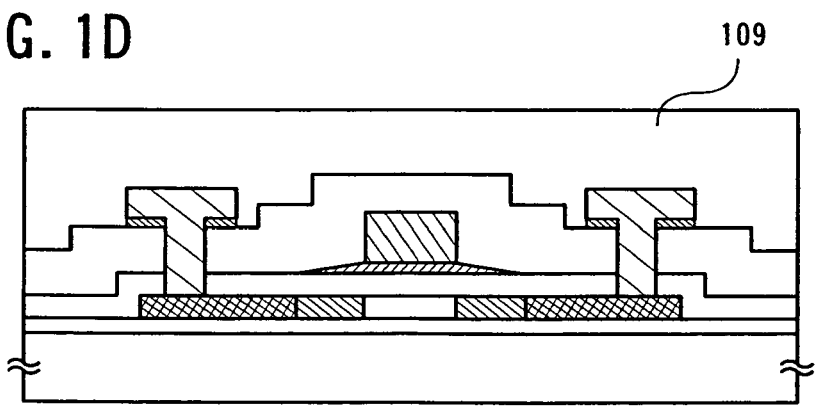

Then, a second interlayer insulating film 109 functioning as a planarizing film is formed by covering the first interlayer insulating film 106 and the electrodes or wirings 107 and 108 (FIG. 1D).

A photosensitive or non-photosensitive organic material (polyimide, acrylic, polyamide, polyimide amide, benzocyclobutene, or a resist) can be used as the second interlayer insulating film 109. A positive type photosensitive organic resin or a negative type photosensitive organic resin can be used as the organic material.

Alternatively, an insulating film formed using siloxane or a stacked structure of the insulating film can be used as the second interlayer insulating film 109.

Siloxane is composed of a skeleton formed by the bond of silicon (Si) and oxygen (O). An organic group at least including hydrogen (such as an alkyl group or aromatic hydrocarbon) is used as a substituent. Alternatively, a fluoro group may be used as a substituent. Further, alternatively, an organic group at least including hydrogen and a fluoro group may also be used as a substituent.

In this embodiment mode, an insulating film formed using siloxane is formed by a spin-coating method as the second interlayer insulating film 109.

Figure 2A:
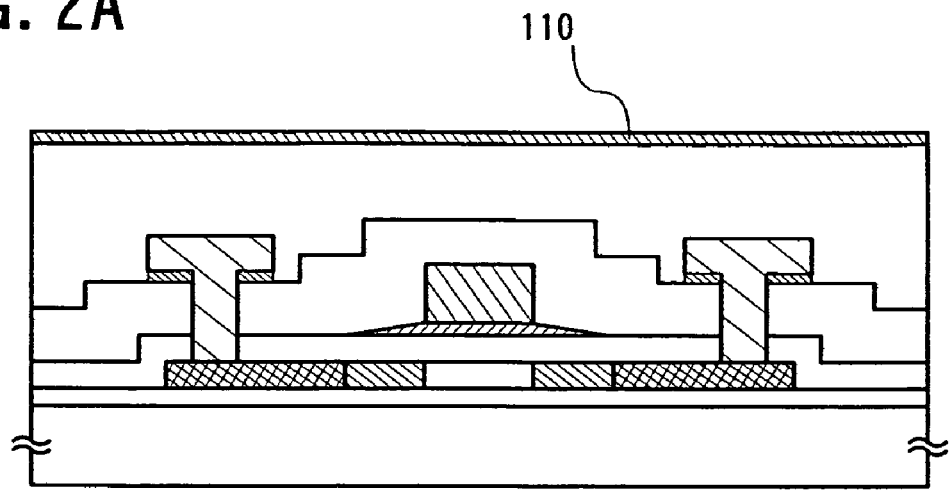
FIGS. 2A to 2C are cross-sectional views each illustrating a process of manufacturing a semiconductor apparatus according to a certain aspect of the present invention.
Figure 2B:
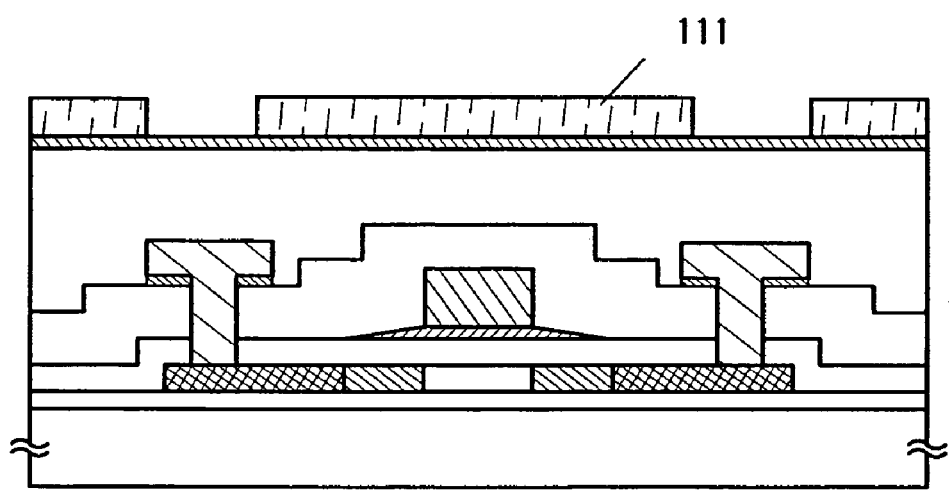
Figure 2C:
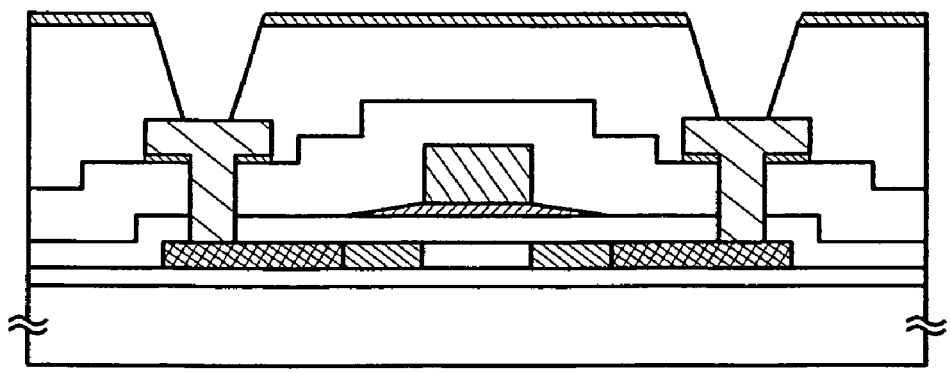
Figure 3:
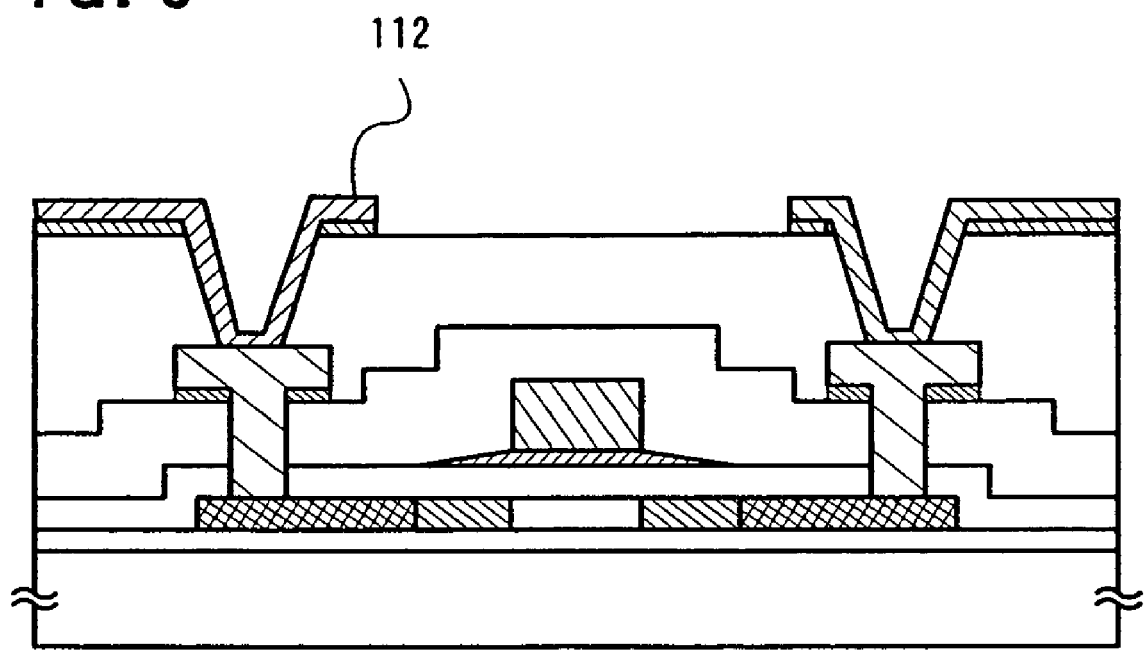
FIG. 3 is a cross-sectional view illustrating a process of manufacturing a semiconductor apparatus according to a certain aspect of the present invention.

After forming the second interlayer insulating film 109, a conductive material film 110 is formed in an upper part of the second interlayer insulating film 109 (FIG. 2A). Since this conductive material film 110 is not in contact with the electrode or wiring in the lower layer, the conductive material film 110 is not electrically connected to the TFT, too.

Further, a resist 111 is formed over the conductive material film 110 and patterned.

Using the patterned resist 111 as a mask, the conductive material film 110 and the second interlayer insulating film 109 are etched by dry etching and contact holes are formed.

In the same manner as the conductive material film 130, the conductive material film 110 has a function to suppress the damage to the electrode or wiring, the insulating film, and the semiconductor layer beneath by trapping the charged particles generated during the dry etching.

In the same manner as the conductive material film 130, the conductive material film 110 can also be used as a barrier metal of a wiring as well as a metal cap film at the time of forming the contact holes, which is convenient, when a refractory metal such as titanium (Ti), tantalum (Ta), or tungsten (W), or nitride thereof is used as the conductive material film 110.

Thereafter, a conductive film is formed and patterned by covering the contact holes to form a wiring 112. The conductive material film 110 used at the time of forming the contact holes can be used as part of the wiring when the wiring is formed.

When a photosensitive conductive material is used as the resist, it is not necessary to form the conductive material film 110. The conductive resist itself suppress the charge injection into the TFT, which is effective.

Even the contact holes are formed performing dry etching on the insulating film according to this embodiment mode, the plasma charge up damage can be suppressed. Therefore, the TFT having a high transistor characteristic can be obtained, of which reliability is improved drastically.

Embodiment 1

In this embodiment, a TFT in which a contact hole is formed with a metal cap film and a TFT in which a contact hole is formed without a metal cap film are compared in terms of the transistor characteristic with reference to FIGS. 4A and 4B, FIGS. 5 to 8, and FIGS. 29A and 29B.

Figure 4A:
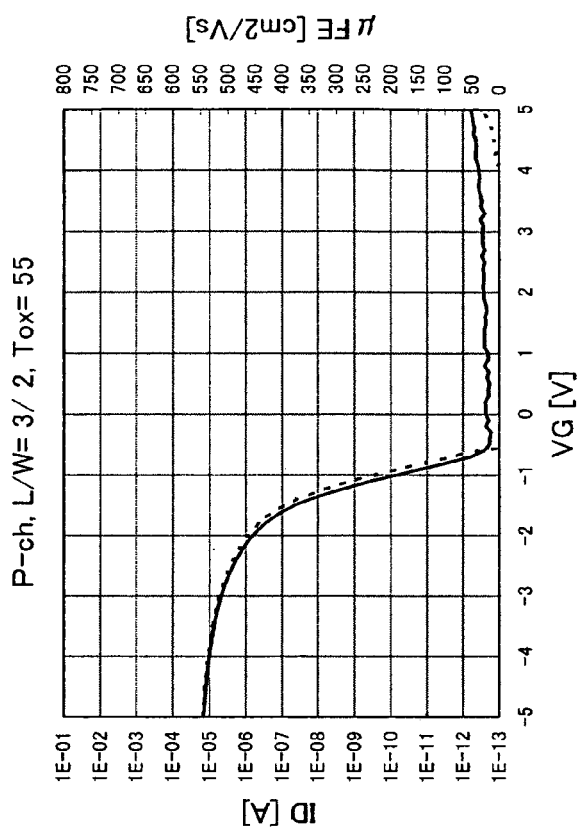
FIGS. 4A and 4B are graphs each showing the transistor characteristic of the TFT according to a certain aspect of the present invention.
Figure 29A:
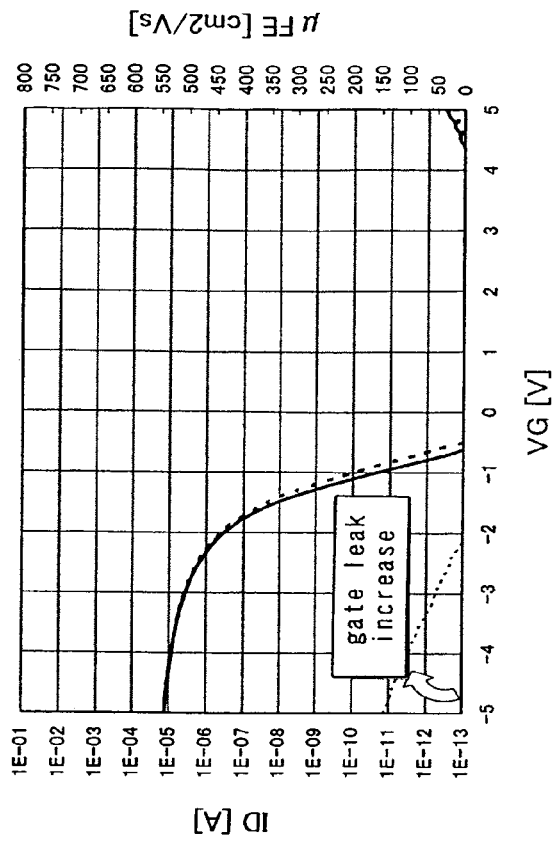
FIGS. 29A and 29B are graphs each showing the transistor characteristic of the conventional TFT.

FIG. 29A shows the characteristic of gate voltage and drain current of the n-channel TFT manufactured without forming a metal cap film. FIG. 4A shows the characteristic of gate voltage and drain current of the n-channel TFT manufactured by forming a metal cap film.

In each FIG. 4A and FIG. 29A, a horizontal axis indicates gate voltage (VG [V]), and a vertical axis indicates drain current (ID [A]).

In FIG. 4A and FIG. 29A, the channel length (L) and the channel width (W) of the n-channel TFT are each 3 μm and 2 μm, and the thickness of a gate insulating film (referred to as "Tox" in this specification) is 55 nm.

In each FIG. 4A and FIG. 29A, a solid line indicates the TFT characteristic before forming the contact hole, and a broken line indicates the TFT characteristic after forming the contact hole. As shown in FIG. 29A, the transistor characteristic is shifted or gate leak which is flown to a semiconductor film (active layer) through a gate insulating film is increased in the conventional opening. However, as shown in FIG. 4A, the transistor characteristic is scarcely shifted and there is few gate leak when a metal cap film is formed.

In other words, it is apparent from FIG. 29A that the rising of the drain current ID with respect to the gate voltage VQ that is threshold voltage, is shifted for approximately 0.5 V to a plus side than that before forming the contact hole. However, there is no fluctuation of the threshold voltage in vicinity of forming the contact hole. It is confirmed that the gate leak current is increased after forming the contact hole in FIG. 29A; however, the gate leak current can be prevented from increasing in FIG. 4A.

Figure 4B:
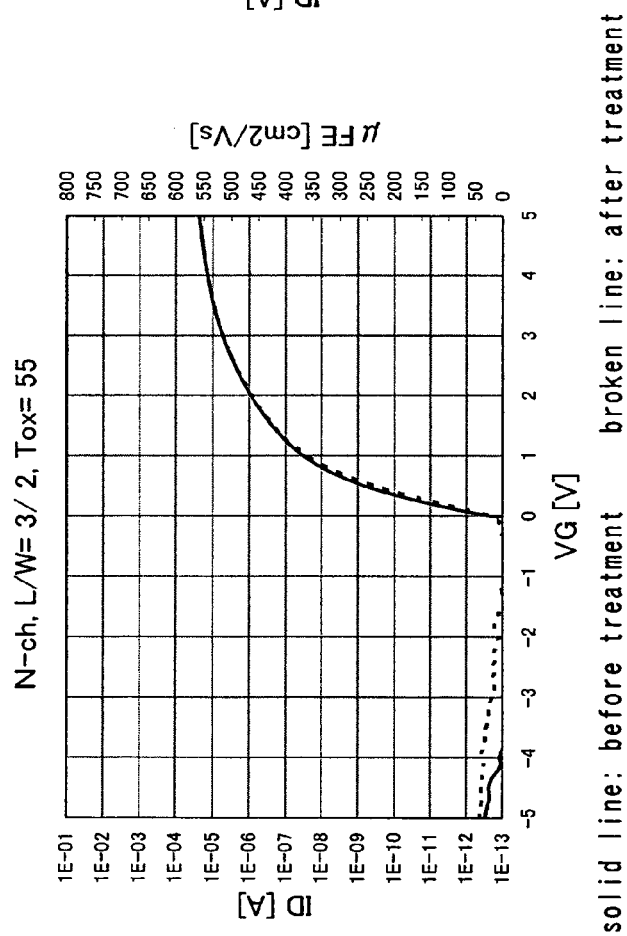
Figure 29B:
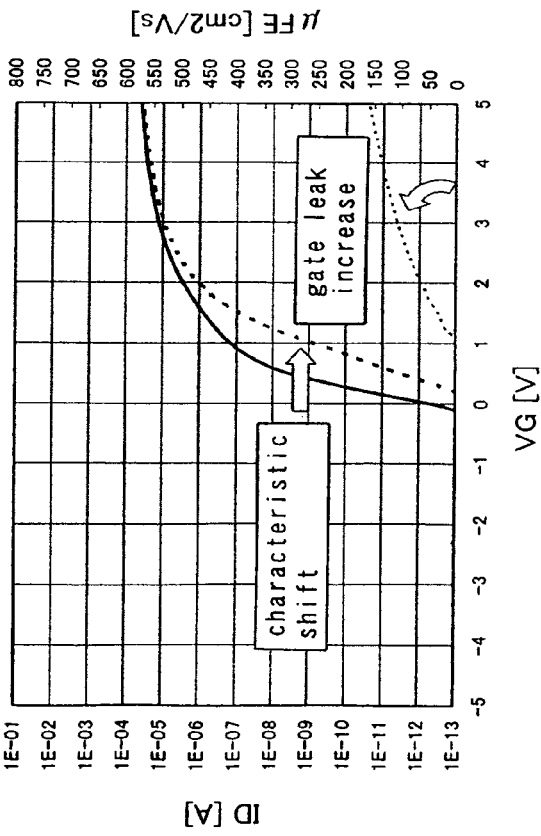

FIG. 4B and FIG. 29B each show a characteristic of gate voltage and drain current of a p-channel TFT formed according to the present invention and a p-channel TFT according to the conventional method.

In FIG. 4B and FIG. 29B, the channel length (L) and the channel width (W) of the p-channel TFT are each 3 μ, and 2 μm, and the thickness of a gate insulating film (Tox) is 55 nm.

In comparison with FIG. 4B and FIG. 29B, the gate current leak seen in FIG. 29B cannot be seen in the p-channel TFT of the present invention (FIG. 4B).

Figure 5:
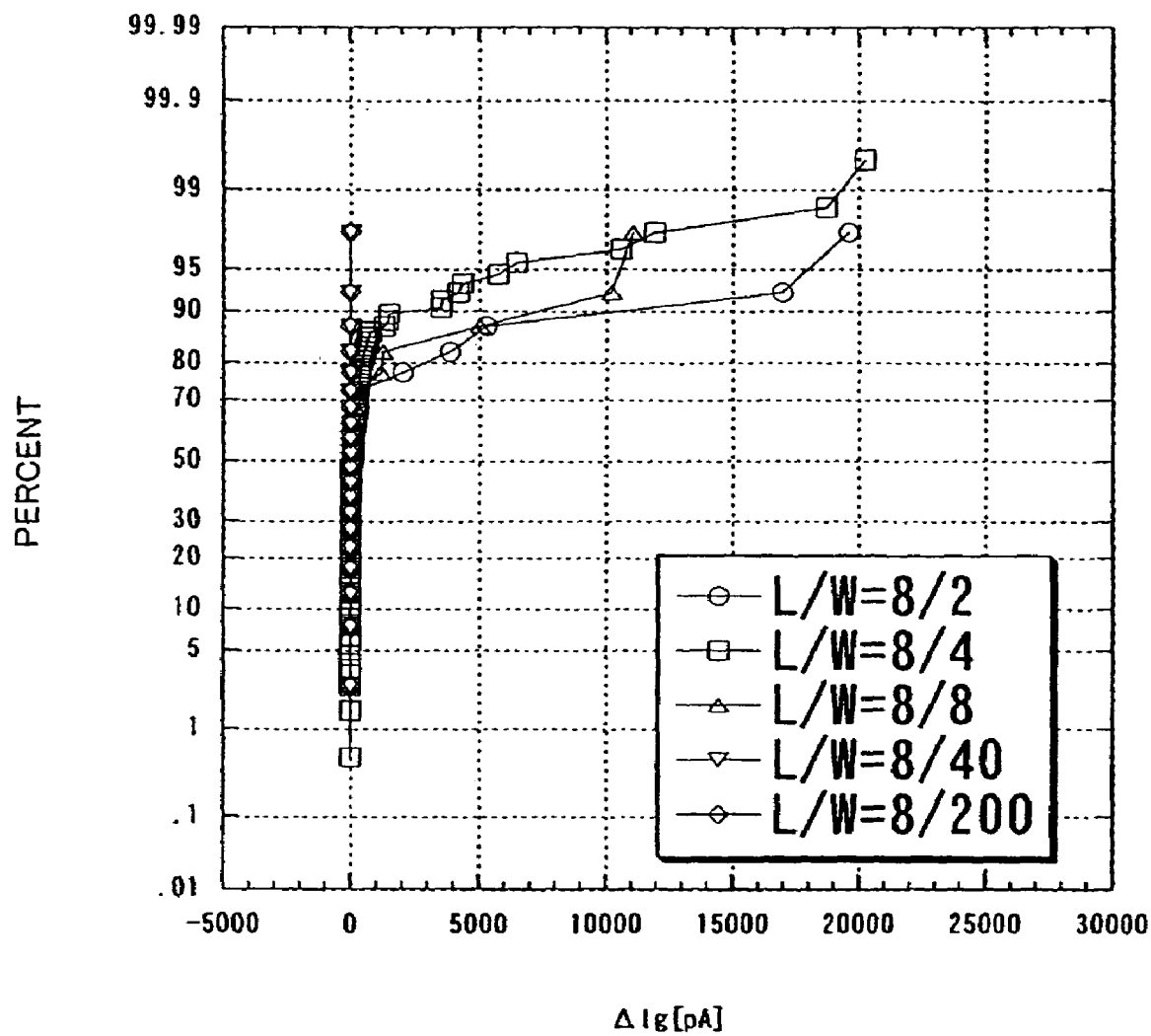
FIG. 5 is a graph showing the transistor characteristic of the TFT with conventional technique.
Figure 6:
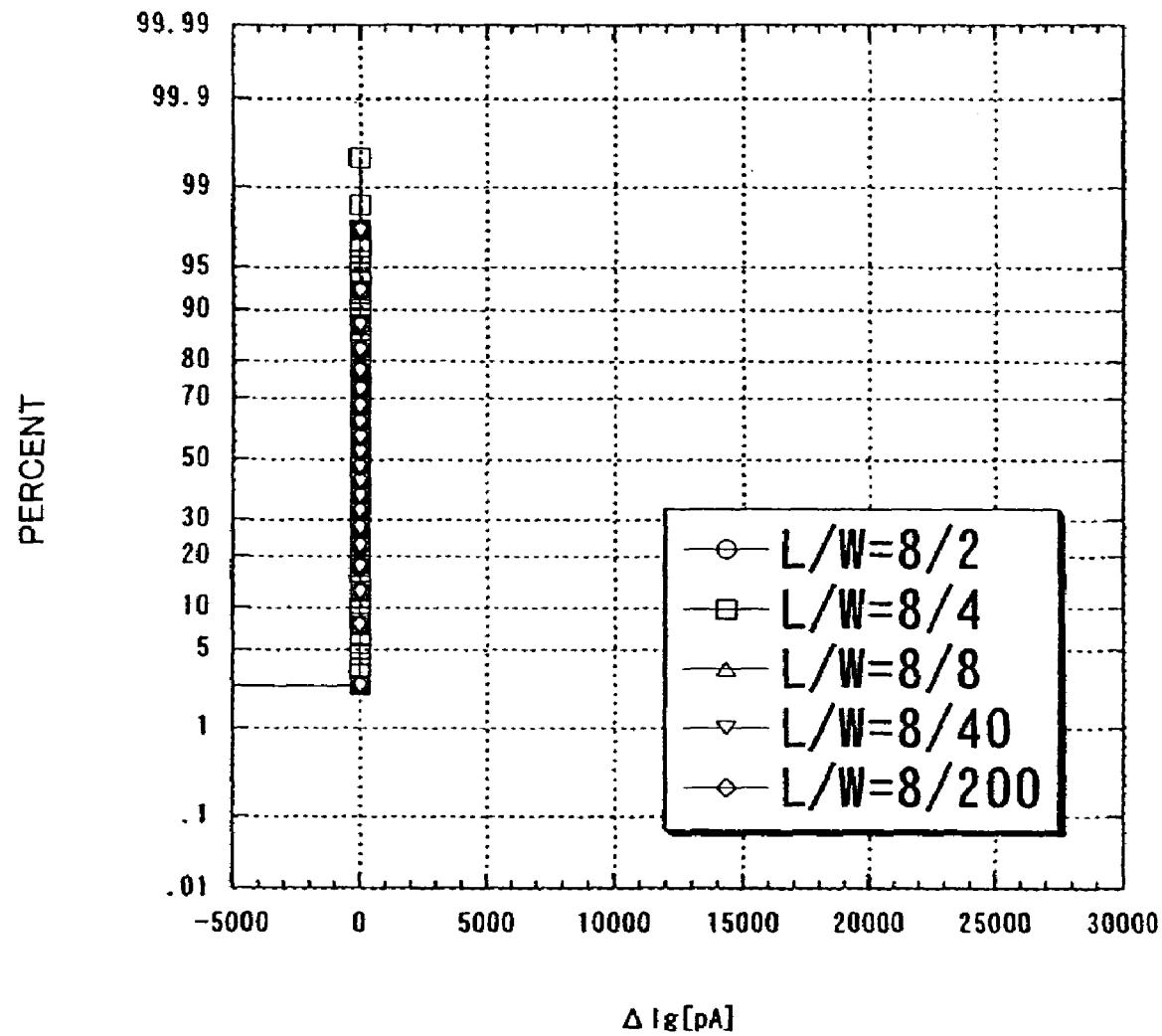
FIG. 6 is a graph showing the transistor characteristic of the TFT according to a certain aspect of the present invention.

FIG. 5 and FIG. 6 each show a normal probability distribution of the change in gate leak current (Ig) in an ON state of an n-channel TFT manufactured without forming a metal cap film and an n-channel TFT manufactured with forming a metal cap film. In other words, in FIG. 5 and FIG. 6, a horizontal axis indicates an increasing amount in gate leak current of the TFT after forming the contact hole before forming the contact hole, and a vertical axis indicates a cumulative frequency with respect to the increasing amount.

In comparison with FIG. 5 and FIG. 6, the TFT in which a contact hole is formed by the conventional method is small and is increased in gate leak current, which has large fluctuation. However, it is apparent that there is scarcely any increase in the gate leak current and fluctuation in the TFT of the present invention.

Figure 7:
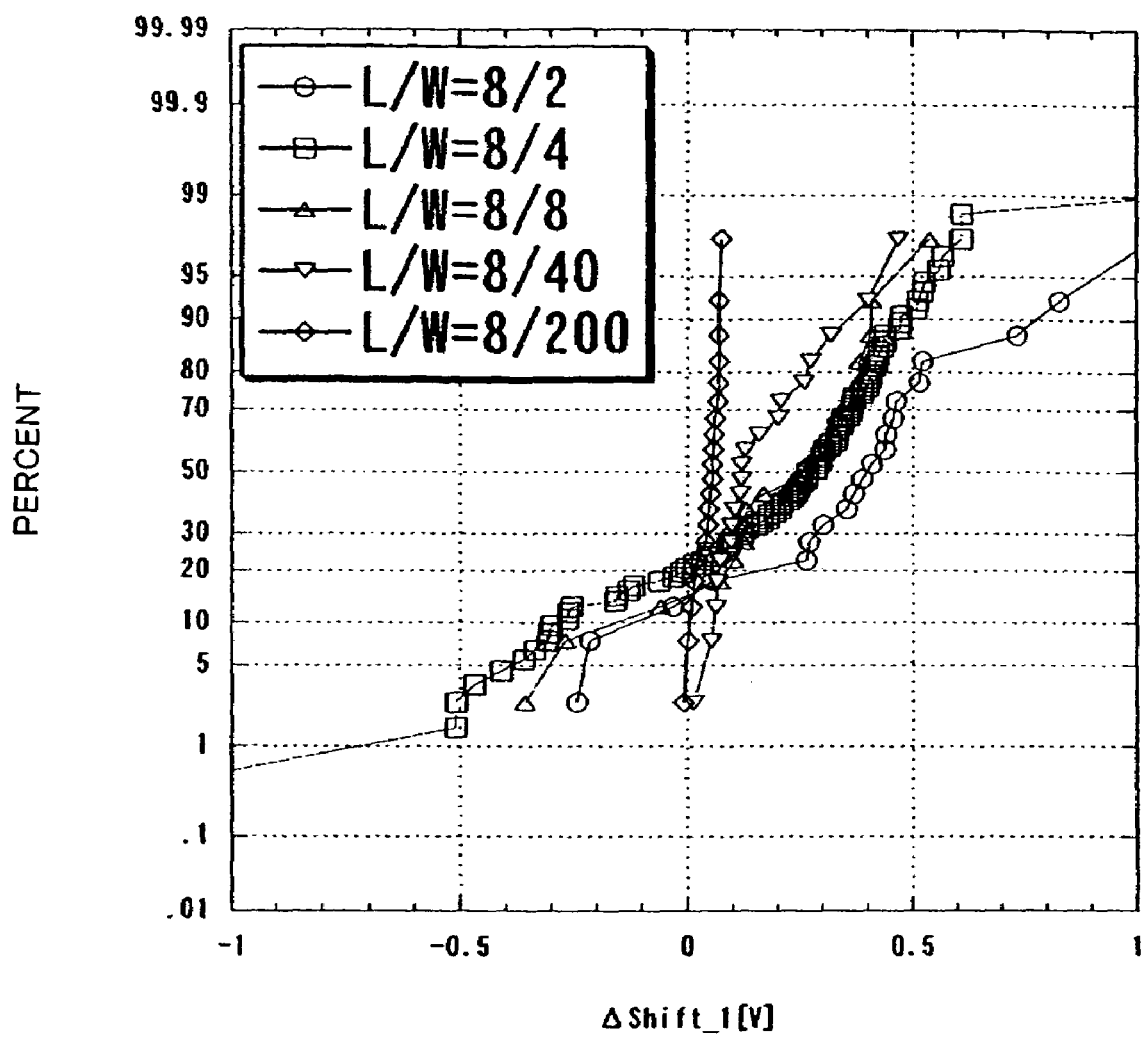
FIG. 7 is a graph showing the transistor characteristic of the TFT with conventional technique.
Figure 8:
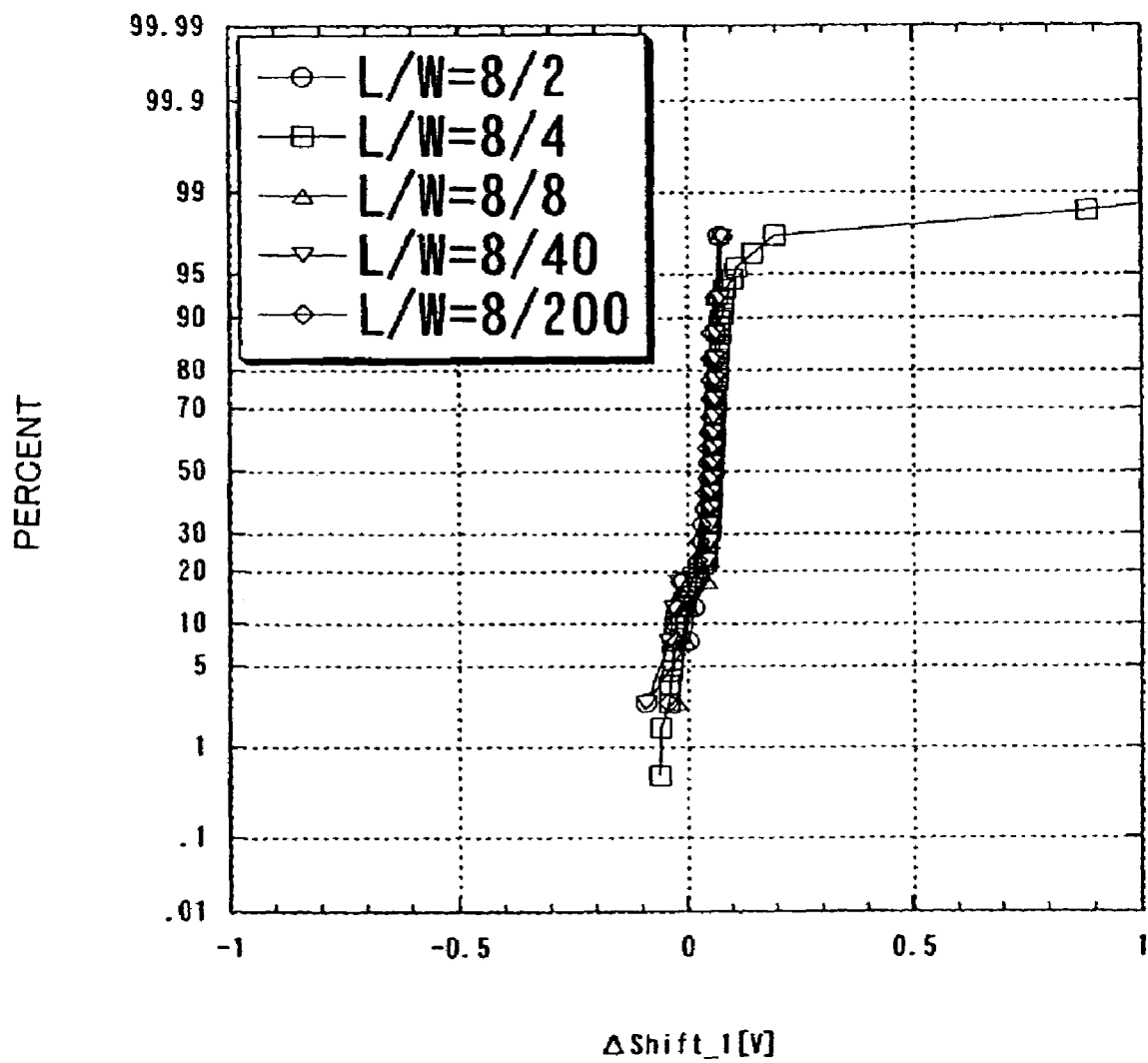
FIG. 8 is a graph showing the transistor characteristic of the TFT according to a certain aspect of the present invention.

FIG. 7 and FIG. 8 each show the variation before forming a contact hole of rising voltage in an ID-VG curve of an n-channel TFT in which a contact hole is formed without a metal cap film and an n-channel TFT in which a contact hole is formed with a metal cap film. In other words, in FIG. 7 and FIG. 8, a horizontal axis indicates the fluctuation of a shift between the n-channel TFT in which the metal film is formed and the n-channel TFT in which the metal film is not formed (the variation before forming a contact hole of rising voltage in an ID-VG curve of an n-channel TFT), and a vertical axis indicates a cumulative frequency. In this manner, FIG. 7 and FIG. 8 shows data that is the characteristic fluctuation in vicinity of forming the contact hole plotted on a normal probability paper. When the data plotted on the normal probability paper can attain the line, it can be said that the characteristic fluctuation shown in the horizontal axis is a normal distribution. On the contrary, when the data plotted on the normal probability paper fails to attain the line, the data is not normally distributed. Further, the rising voltage indicates a voltage when a tangent having the largest gradient of the ID-VG curve has a current value of $1 \times 10^{-12}$ A, and L and W in the figure each indicates a gate length and a gate width. In other words, when there is a marker in vicinity of 0 V, that is, a plotted dot, of the horizontal axis, there is no characteristic shift and a few variation in the TFT characteristic in the vicinity of forming the contact hole in FIG. 7 and FIG. 8.

According to the result of FIG. 7, when the contact hole is formed without a metal cap film, the plotted data fails to attain the line and the curve is gentle as the case of a minute TFT having small value of L/W. In other words, it can be seen that the characteristic fluctuation gets bigger by forming the contact hole and further the characteristic variation gets bigger. It is considered that the characteristic fluctuation of these elements gets bigger due to the damage during the processes and thus fails to be normally distributed. On the other hand, in the method of the present invention shown in FIG. 8, it is seen that few element has large fluctuation amount, and the increase in characteristic fluctuation and characteristic variation can be suppressed for the TFT having small value of L/W, too.

As shown in each FIG. 6 to FIG. 8, when the contact hole using the cap film of the present invention is formed, the fluctuation of the rising voltage in the ID-VG curve in vicinity of forming the contact hole, the increase in the gate leak current, or the increase in the TFT characteristic fluctuation can be suppressed. The change of the rising voltage in the ID-VG curve and the increase in variation result in malfunction of a circuit, and the increase in gate leak current results in the increase in consumption current. In the conventional method for forming a contact hole, the desired TFT characteristic is damaged by forming the contact hole in the post-process even the TFT characteristic such as the rising voltage in the ID-VG curve is adjusted to the desired value. In particular, the effect is apparent as the case of the minute TFT. However, it can be seen that the shift of the TFT characteristic and variation increase can be suppressed in the process of forming the contact hole in vicinity of forming the TFT according to the present invention, which is extremely effective.

Hereinafter, a method for manufacturing a semiconductor apparatus according to this embodiment is described with reference to FIGS. 1A to 1D, FIG. 2A to 2C, and FIG. 3. Further, like components are denoted by like reference numerals as of Embodiment Mode.

A silicon nitride film containing oxygen (SiNO film) and a silicon oxide film containing nitrogen (SiON film) are each deposited as a base film 102 over a glass substrate 101 in a thickness of 50 nm and 100 nm by a plasma CVD method.

An amorphous silicon film is deposited over the base film 102 by a plasma CVD method in 66 nm thick, and then, is heated at 500° C. for 1 hour to perform dehydrogenation. Thereafter, the amorphous silicon film is coated with a solution containing a catalyst element that promotes the crystal growth. The amorphous silicon film is coated with a solution containing 10 ppm of nickel (Ni) in this embodiment. Then, the amorphous silicon film is heated at 550° C. for 4 hours to crystallize it, and the amorphous silicon film is further irradiated with a continuous-wave laser beam to improve the crystallinity.

After the crystalline silicon film is obtained in a foregoing manner, a new amorphous silicon film is deposited over the crystalline silicon film and heated at 550° C. for 4 hours in the presence of nitrogen. According to this heat treatment, the catalyst element in the crystalline silicon film moves to the newly deposited amorphous silicon film. In other words, the catalyst element is gettered into the amorphous silicon film. Therefore, the concentration of the catalyst element in the crystalline silicon film can be reduced.

Then, an island-shaped silicon region, which is to be an active layer 103, is formed by patterning the crystalline silicon film. The impurities for controlling the threshold value are introduced into the island-shaped silicon region. In this embodiment, boron (B) is introduced into the island-shaped silicon region by doping diborane ($B_2H_6$).

A silicon oxide film containing nitrogen (SiON film) is deposited in 60 nm thick using $SiH_4$ and $N_2O$ by a plasma CVD method. This SiON film functions as a gate insulating film 104.

A tantalum nitride film (TaN film) and a tungsten film (W film) are each formed over the gate insulating film 104 in a thickness of 300 nm and 370 nm by a sputtering method and are patterned to form a gate electrode 105.

Impurities are introduced into the island-shaped silicon region by using the gate electrode 105 as a mask. In this embodiment, when an n-channel TFT is formed, phosphorus (P) is doped into the island-shaped silicon region with an applied voltage of 50 keV and a dose amount of $3\times10^{15}$ cm$^{-2}$ by using phosphine ($PH_3$). When a p-channel TFT is formed, boron (B) is introduced into the island-shaped silicon region under the condition in which an applied voltage is 40 keV and a dose amount is $2\times10^{16}$ $cm^{-2}$ by using diborane ($B_2H_6$).

After introducing the impurities, a silicon oxide film containing nitrogen (SiON film) is formed in 50 nm thick by a plasma CVD method and thereafter heated at 550° C. for 4 hours in the presence of nitrogen to activate the impurities.

Then, a silicon nitride film (SiN film) is formed in 50 nm thick by a plasma CVD method and further a silicon oxide film containing nitrogen (SiON film) is formed in 600 nm thick. This SiN film and SiON film serve as a first interlayer insulating film 106.

The whole element is heated at 410° C. for 1 hour, and hydrogenation is performed by discharging hydrogen from the SiN film.

The SiON film of the interlayer insulating film is etched using $CHF_3$ by a dry etching method to form contact holes. In that case, the SiN film functions as an etching stopper. Thereafter, the SiN film is etched by a dry etching method. Further, the gate insulating film is etched using trifluoromethane ($CHF_3$).

After forming the contact holes, a stacked film is formed by each stacking a titanium film (Ti film), a titanium nitride film (TiN film), an aluminum film containing silicon (Al—Si film), and a titanium film (Ti film) in a thickness of 60 nm, 40 nm, 300 nm, and 100 nm by a sputtering method. Then, the stacked film is patterned to form electrodes or wirings 107 and 108.

The electrodes or wirings 107 and 108 and the first interlayer insulating film 106 are coated by a spin coating method with an insulating film formed using siloxane by being covered and baked at 300° C. for 1 hour to form a second interlayer insulating film 109.

A metal cap film 110 is formed over the second interlayer insulating film 109. In this embodiment, a titanium film (Ti film) is formed as the metal cap film 110 in 100 nm thick by a sputtering method. Further, this Ti film is not formed in the TFT each illustrated in FIGS. 29A and 29B, FIG. 5, and FIG. 7, but formed only in the TFT each illustrated in FIGS. 4A and 4B, FIG. 6, and FIG. 8.

Then, contact holes are formed by a dry etching method. In this embodiment, etching is performed by using carbon tetrafluoride ($CF_4$), oxygen ($O_2$), and helium (He) each at a flow rate of 50 sccm, 50 sccm, and 30 sccm as the etching gas.

The characteristic comparison described in this specification is measured by removing the Ti film with ammonia hydrogen peroxide water after forming the contact holes and dropping a probe on the electrode formed of the lower layer wiring. The Ti film is removed by wet etching because the part except the contact holes can be damaged due to the effect of dry etching when dry etching is further employed to remove the Ti film. The metal cap film may be used as part of the electrode or wiring instead of removing, in the actual process.

Thereafter, hydrogenation is performed by performing baking at 350° C. for 1 hour in the presence of hydrogen. Accordingly, the dangling bond in the crystalline silicon film is terminated.

According to this embodiment, it is apparent that the transistor characteristic does not vary in vicinity of forming the contact holes when the cap film is formed while forming the contact holes. Therefore, a reliable TFT can be manufactured.

In addition, this embodiment can be arbitrarily combined with any description of Embodiment Mode, if necessary.

Embodiment 2

This embodiment describes a method for manufacturing an active matrix liquid crystal display device in which a reverse staggered TFT is used as a switching element. Further, FIGS. 9A to 9E each illustrate a cross section of a manufacturing process, and FIG. 10 illustrates a top view.

Firstly, a base insulating film 611 is formed over a substrate 610. An insulating film such as a silicon oxide film, a silicon nitride film, or silicon oxide film containing nitrogen ($SiO_xN_y$) is preferably used as the base insulating film 611. A heat-resistant plastic substrate that can withstand a processing temperature of the manufacturing process can be used besides a non-alkaline glass substrate as the substrate 610. In the case of a reflective liquid crystal display device, a semiconductor substrate such as single crystal silicon, a metal substrate such as stainless, or a ceramic substrate in which an insulating layer is provided on the surface may be applied to the substrate.

Then, a conductive film in a thickness of from 100 nm to 600 nm is formed over the base insulating film 611. An element selected from tantalum (Ta), titanium (Ti), molybdenum (Mo), tungsten (W), chromium (Cr), silicon (Si), scandium (Sc), Nd, Al, and Cu, or an alloy film with the combination of the elements (typically, a Mo—W alloy or a Mo—Ta alloy) can be used as the conductive film.

A resist mask is formed by using a photomask to perform etching by employing a dry etching method or a wet etching method. Through this etching process, the conductive film is etched to obtain conductive layers 612 and 640. The conductive layer 612 is to be a gate electrode of the TFT, and the conductive layer 640 is to be a terminal electrode. Since a thin semiconductor film is formed in the later processes, the end surface is preferably etched to have a tapered shape so that the coverage is not defected. Further, a capacitor electrode or a capacitor wiring for forming a storage capacitor is also formed.

After removing the resist mask, an insulating film 613 for covering the conductive layers is formed. The insulating film 613 is formed in a thickness of from 50 nm to 200 nm using a single-layered or stacked-layered insulating film such as a silicon oxide film, a silicon nitride film, or a silicon oxide film containing nitrogen ($SiO_xN_y$) which is obtained by a plasma CVD method or a sputtering method. For example, a stacked structure in which the lower layer is the silicon nitride film and the upper layer is the silicon oxide film may be employed. Further, the insulating film 613 is to be a gate insulating film of the TFT. Of course, the gate insulating film is not limited to the above materials and another insulating film such as a tantalum oxide film may be used. However, the conductive layers 612 and 640 needs to be prevented from being damaged due to the deposition temperature of the insulating film 613.

Then, a crystalline semiconductor film 614a is formed over the entire surface of the insulating film 613 in a thickness of from 50 nm to 200 nm (preferably, from 100 nm to 150 nm) by using a plasma CVD method. In this embodiment, a semi-amorphous silicon film is deposited by using a $SiH_4$ gas and a $F_2$ gas for a source gas. Each concentration of C, N, and O contained in the obtained semi-amorphous silicon film is to be $3\times10^{21}$ $cm^{-3}$ or less, preferably $3\times10^{20}$ $cm^{-2}$ or less. The hydrogen concentration contained in the obtained semi-amorphous silicon film is to be $1\times10^{21}$ $cm^{-3}$, which is the same amount as that of an amorphous silicon film.

After forming an insulating film over the entire surface of the crystalline semiconductor film 614a, a channel protective film 616 is formed by performing patterning. The patterning may be performed using the usual photolithography technique or forming the resist mask in a self-aligned manner by using a method for exposing a backside to light in which the conductive layers are used as masks. In addition, the channel protective film 616 is preferably formed of a minute film to prevent the semiconductor layer from being polluted with impurities such as an organic substance, a metal substance, or water vapor by ensuring the detergency of the interface.

Figure 9A:
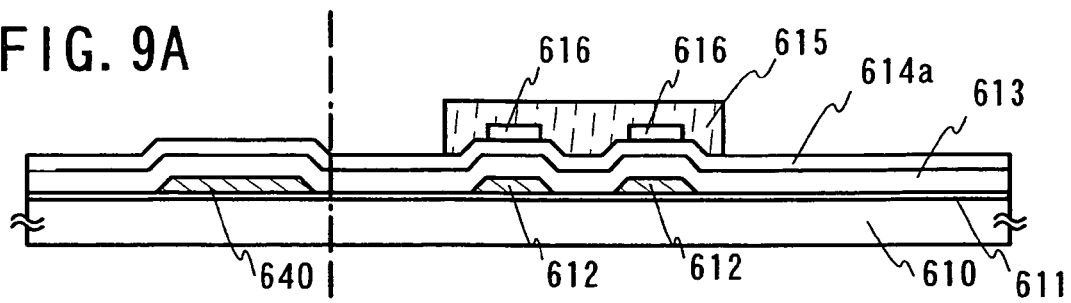
FIGS. 9A to 9E are cross-sectional views each illustrating a process of manufacturing a liquid crystal display device according to certain aspects of the present invention.
Figure 10:
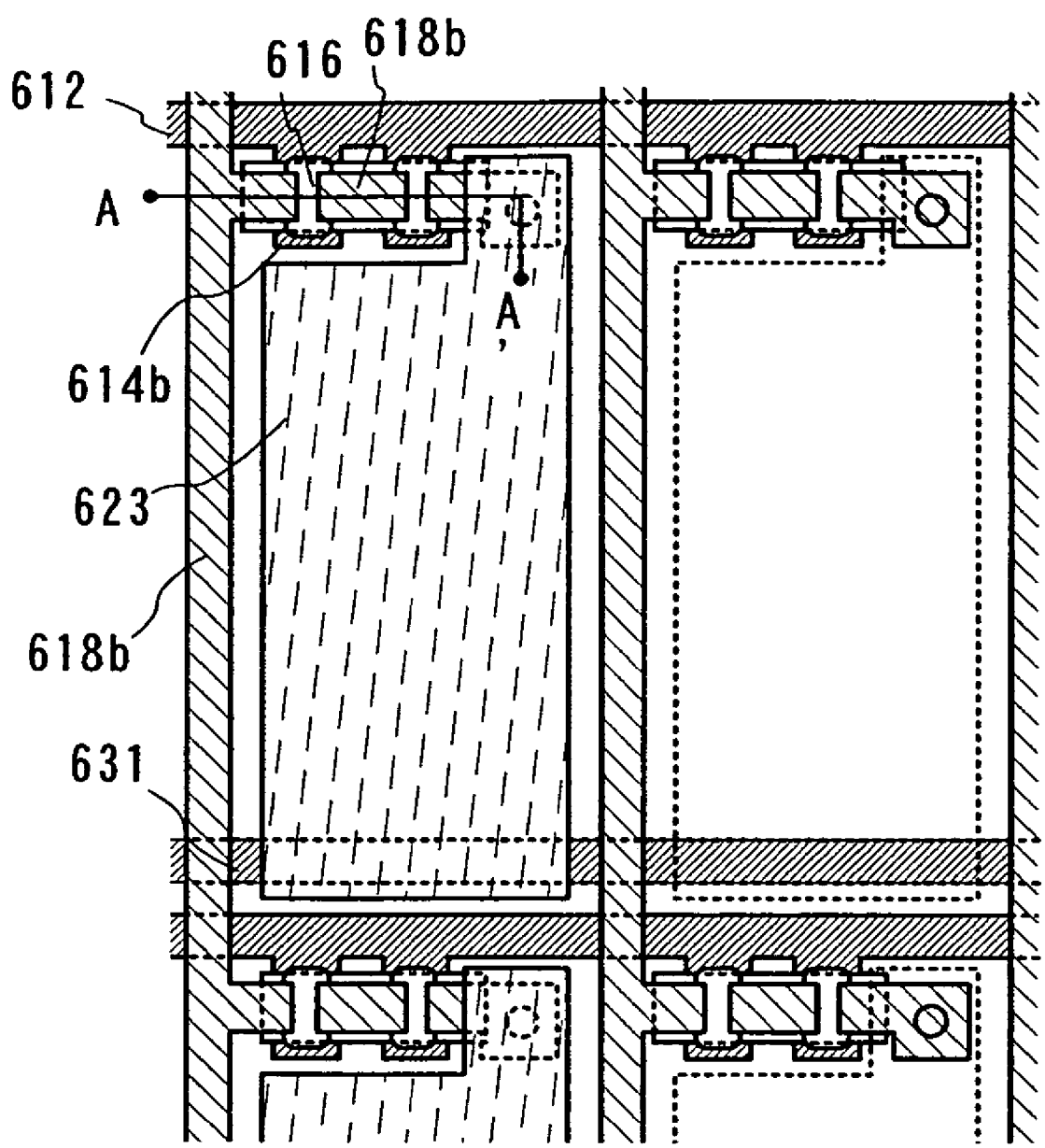
FIG. 10 is a top view of a liquid crystal display device according to a certain aspect of the present invention.

Then, a resist mask 615 is formed using a photomask to pattern the semiconductor layer (FIG. 9A). Thereafter, a semiconductor layer 614b which is to be an active layer of the TFT is formed by etching the semiconductor film 614a.

After removing the resist mask, an amorphous semiconductor film 617 containing the impurity element of one conductivity type (n-type or p-type) is formed in a thickness of from 20 nm to 80 nm. The amorphous semiconductor film 617 containing the impurity element imparting one conductivity type (n-type or p-type) is entirely formed by a known method such as a plasma CVD method or a sputtering method. Further, a semi-amorphous semiconductor film containing the impurity element imparting one conductivity type (n-type or p-type) may be formed instead of the amorphous semiconductor film 617 containing the impurity element imparting one conductivity type (n-type or p-type). In this embodiment, an amorphous semiconductor film containing the impurity element (phosphorus) imparting n-type conductivity is used as the amorphous semiconductor film 617, which is also referred to as an $n^+$ layer (ohmic contact layer). In this embodiment, the amorphous semiconductor film 617 is obtained by a CVD method, using a $SiH_4$ gas, a hydrogen gas, and a $PH_3$ (diluted by 0.2%) gas as a source gas.

Then, a first conductive film formed of a metal material is formed by a sputtering method or a vacuum vapor deposition method. The material of the first conductive film is not limited as long as the metal materials can have an ohmic contact with the amorphous semiconductor film 617. An element selected from Al, Cr, Ta, and Ti, an alloy containing the element as the component, an alloy film with the combination of the elements, and the like can be given as an example. In this embodiment, a Ti film is formed in a thickness of from 50 nm to 150 nm, an aluminum (Al) film, which is formed on the Ti film, is formed in a thickness of from 300 nm to 400 nm, and further a Ti film is formed in a thickness of from 100 nm to 150 nm as the first conductive film by employing a sputtering method.

Figure 9B:
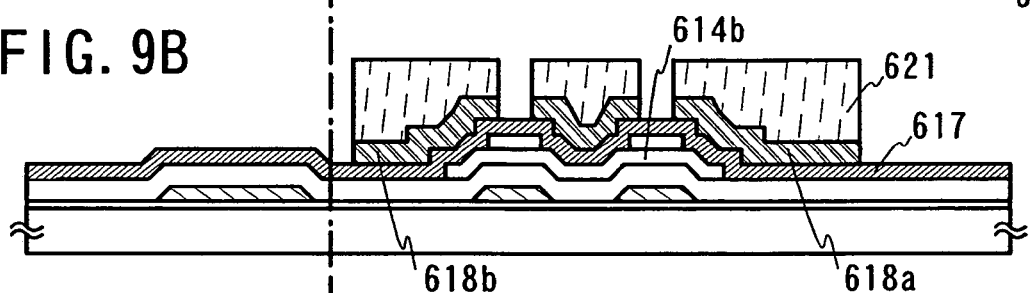

A resist mask 621 is formed by performing a photolithography process and wirings 618a and 618b (which are to be a source wiring and a drain electrode in the subsequent processes) are formed by removing the unnecessary part by etching (FIG. 9B).

Figure 9C:
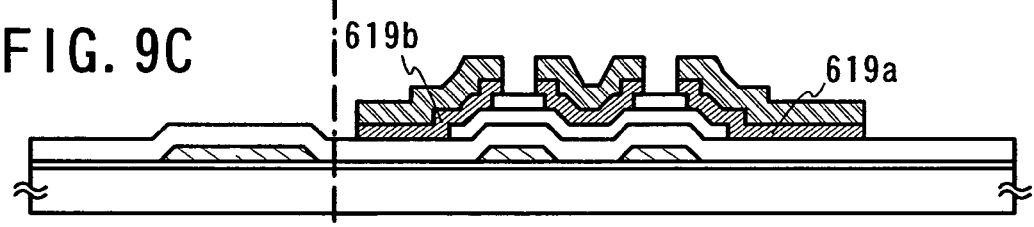

Then, source region or drain region 619a and 619b are formed by etching the amorphous semiconductor film containing the impurity element imparting one conductivity type by still using the resist mask. The $n^+$ layer is referred to as a source region or drain region. Thereafter, the resist mask is removed (FIG. 9C)

An interlayer insulating film 622 is formed. A light-transmitting inorganic material (such as silicon oxide, silicon nitride, or silicon oxide containing nitrogen), a photosensitive or non-photosensitive organic material (polyimide, acrylic, polyamide, polyimide amide, benzocyclobutene, or a resist), a lamination of these materials, or the like is used as the interlayer insulating film 622. Another material film that can be used as the interlayer insulating film 622 is as follows: an insulating film formed of a $SiO_x$ film including an alkyl group that can be obtained by a coating method, for example, silica glass, an alkyl siloxane polymer, an alkyl silsesquioxane polymer, a silsesquioxane polymer hydride, or the like. PSB-K1 and PSB-K31 which are coating insulating film materials manufactured by Toray Industries, Inc. or ZRS-5PH which is a coating insulating film material manufactured by Catalysts & Chemicals Industries Co., Ltd. can be given as an example of the siloxane-based polymer.

Further, the interlayer insulating film 622 is not always required to be provided, if not necessary. In addition, a protective film may be formed, if necessary.

Then, a conductive material film (cap film) 650, for example a metal film, is deposited over the interlayer insulating film 622. In this embodiment, a titanium film (Ti film) is deposited by a sputtering method in 100 nm thick. A refractory metal such as tantalum (Ta) or tungsten (W), or the nitride or the like of the refractory metal such as titanium nitride (TiN) or tantalum nitride (TaN) may be used as well.

After forming a resist mask by using a photomask, parts of the conductive material film 650 and the interlayer insulating film 622 are removed by dry etching to form a contact hole. When the contact hole is formed, carbon tetrafluoride ($CF_4$), oxygen ($O_2$), and helium (He) are each used at a flow rate of 50 sccm, 50 sccm, and 30 sccm as the etching gas. Further, the bottom part of the contact hole reaches the wirings 618a and 618b. Part of the insulating film 613 is also removed in the terminal portion. The process of removing the part of the insulating film 613 may be performed before forming the interlayer insulating film.

Figure 9D:
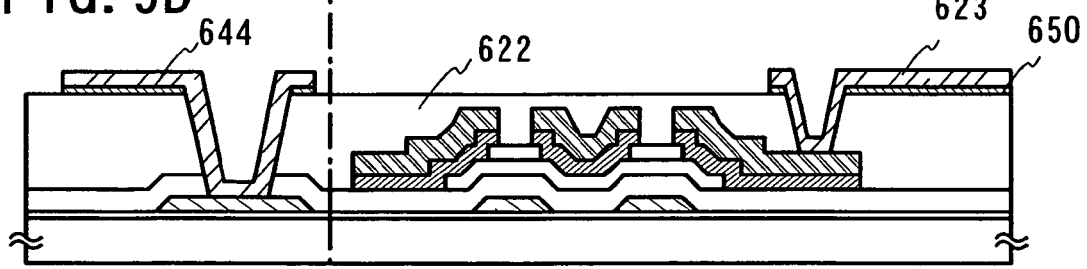

After removing the resist mask, a second conductive film is deposited over the entire surface. Then, the second conductive film is patterned using a photomask to form a pixel electrode 623 and a terminal electrode 644 (FIG. 9D). Since a reflective liquid crystal display panel is manufactured in this embodiment, the pixel electrode 623 and the terminal electrode 644 may be formed by a sputtering method, using a metal material having light reflectivity such as Ag (silver), Au (metal), Cu (copper), W (tungsten), or Al (aluminum).

In the case of manufacturing a transmissive liquid crystal display panel, the conductive material film 650 is removed by etching before forming the pixel electrode 623. Thereafter, the pixel electrode 623 and the terminal electrode 644 are formed using a transparent conductive film such as indium tin oxide (ITO), indium tin oxide containing silicon oxide, zinc oxide (ZnO), or tin oxide ($SnO_2$).

FIG. 10 illustrates a top view in which part of the pixel portion is enlarged. The pixel electrode is not completely formed yet in FIG. 10. In FIG. 10, the pixel electrode is formed in the left-side pixel; however, a pixel electrode is not formed in the right-side pixel. A figure taken along solid line A-A' in FIG. 10 corresponds to a cross-sectional view of the pixel portion in FIG. 9D, and like components are denoted by like reference numerals as of FIG. 9D. The conductive material film 650 is overlapped with the pixel electrode 623. In addition, a capacitor wiring 631 is provided, and a storage capacitor is formed of the pixel electrode 623 and the capacitor wiring 631 overlapped with the pixel electrode by using the gate insulating film as a dielectric.

According to the foregoing processes, a TFT substrate for a liquid crystal display panel in which the bottom gate TFT (also referred to as reverse staggered TFT) and the pixel electrode are formed over the substrate 610 is completed. Although this embodiment described the channel protective TFT as the bottom gate TFT, the bottom gate TFT is not limited thereto and a channel etch TFT can be arbitrarily employed. Alternatively, a top gate TFT can be employed.

This embodiment employs a structure having two channel formation regions between a source region and a drain region in one TFT (double gate structure). In this embodiment, the active layer is a semi-amorphous silicon film, which has a problem that the off current of the TFT increases compared with an amorphous silicon film. Therefore, the double gate structure is employed in this embodiment to solve this problem. Further, a multi gate structure such as a triple gate structure may be employed in this embodiment without being limited to the double gate structure to decrease the fluctuation of the off current. Alternatively, a single gate structure may be employed to enhance the aperture ratio.

Then, an orientation film 624a is formed to cover the pixel electrode 623. The orientation film 624a is preferably formed using a droplet discharging method, a screen printing method, or an offset printing method. Thereafter, rubbing treatment is performed on the surface of the orientation film 624a.

In an opposite substrate 625, a color filter formed of a colored layer 626a, a light-shielding layer (black matrix) 626b, and an overcoat layer 627 is formed, and further an opposite electrode 628 formed of a transparent electrode or a reflective electrode is formed, and an orientation film 624b is formed over the opposite electrode 628. Then, a sealant with a closed pattern is formed by a droplet discharging method to surround a region overlapped with the pixel portion. Here, an example in which a sealant with a closed pattern is formed by droplet discharging method is shown in order to drop liquid crystals. However, a dip coating method (piping up method) by which liquid crystals are injected by using a capillary phenomenon may be employed after providing a seal pattern having an opening portion and attaching the TFT substrate to the opposite substrate.

Then, a liquid crystal 629 is dropped under reduced pressure to prevent bubbles from entering, and the both substrates are attached to each other. The liquid crystal 629 is dropped once or for several times in the closed-loop seal pattern. A twisted nematic (TN) mode is mostly used as an alignment mode of the liquid crystal 629. In this TN mode, the alignment direction of liquid crystal molecules is twisted at 90° according to the polarization of light from its entrance to the exit. In the case of manufacturing a TN liquid crystal display device, the substrates are attached to each other so that the rubbing directions are orthogonalized.

The spacing between the pair of substrates may be maintained by spraying a spherical spacer, forming a columnar spacer formed of resin, or mixing a filler into the sealant. The columnar spacer mentioned above is formed of an organic resin material containing at least one material selected from acrylic, polyimide, polyimide amide, and epoxy as the component; any one material of silicon oxide, silicon nitride, and silicon oxynitride; or an inorganic material including these stacked films.

Then, the substrates are scribed and broken. In the case of obtaining a plurality of panels from one substrate, each panel is separated off. In the case of obtaining one panel from one substrate, the scribing and breaking process can be skipped by attaching the opposite substrate that is cut in advance.

Figure 9E:
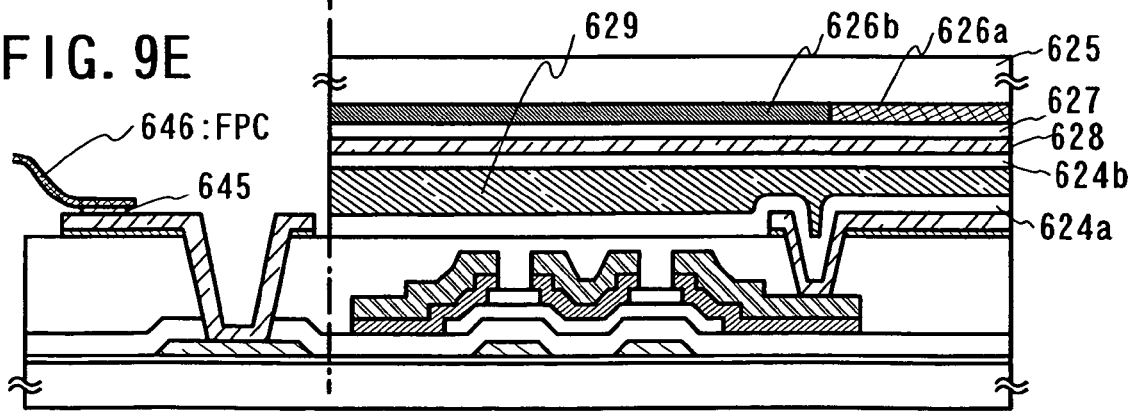

An FPC (Flexible Printed Circuit) 646 is attached to the terminal electrode 644 with an anisotropic conductive layer 645 therebetween by a known method. A liquid crystal module is completed according to the foregoing processes (FIG. 9E). In addition, an optical film is attached, if necessary. In the case of a transmissive liquid crystal display device, a polarizing plate is attached to both the active matrix substrate and the opposite substrate.

As mentioned above, a liquid crystal display panel can be manufactured using the TFT having a reliable transistor characteristic in this embodiment. The liquid crystal display panel manufactured according to this embodiment can be used as the display portion of various electronic apparatus.

Although this embodiment describes the top gate TFT as the TFT, the TFT is not limited to this structure and a bottom gate TFT can be arbitrarily employed. The TFT is not limited to a single gate TFT and a multi gate TFT having a plurality of channel formation regions, for example a double gate TFT having two channel formation regions, may be alternatively employed.

In addition, this embodiment can be arbitrarily combined with any description of Embodiment Mode and Embodiment 1, if necessary.

Embodiment 3

This embodiment describes an example of using a droplet discharging method for dropping liquid crystals. In this embodiment, FIGS. 1A to 11D, FIGS. 12A to 12D, FIGS. 13A and 13B, FIGS. 14A and 14B, and FIG. 15 each illustrate an example of manufacturing a panel for taking four panels from one large-sized substrate 1110.

FIG. 11A illustrates a cross-sectional view in forming a liquid crystal layer by a dispenser (or ink jetting) method. A liquid crystal material 1114 is discharged, sprayed, or dropped from a nozzle 1118 of a droplet discharging device 1116 to cover a pixel portion 1111 surrounded by a sealant 1112. The droplet discharging device 1116 is moved in the direction indicated by an arrow in FIG. 11A. Further, an example of moving the nozzle 1118 is described; however, the nozzle may be secured and the substrate may be moved to form the liquid crystal layer.

FIG. 11B illustrates a perspective view. In FIG. 11B, the liquid crystal material 1114 is selectively discharged, sprayed, or dropped only to the region surrounded by the sealant 1112, and a drop surface 1115 is moved along with a nozzle scanning direction 1113.

FIGS. 11C and 11D are enlarged cross-sectional views for illustrating a region encircled by a dotted line 1119 in FIG. 11A. When the liquid crystal material has high viscosity, the liquid crystal material is discharged continuously and is attached to the surface in a manner where each droplet of the liquid crystal material is joined to one another. On the other hand, when the liquid crystal material has low viscosity, the liquid crystal material is discharged intermittently; in other words, droplets are dropped as illustrated in FIG. 11D.

In FIG. 11C, reference numeral 1120 denotes a reverse staggered TFT; 1121, a pixel electrode; and 1122, a conductive material film (cap film), respectively. The pixel portion 1111 includes a pixel electrode arranged in a matrix configuration, a switching element (herein, the reverse staggered TFT) connected to the pixel electrode, and a storage capacitor.

Although the reverse staggered TFT is formed in this embodiment, another bottom gate TFT or a top gate TFT may be formed.

A manufacturing flow of a panel is hereinafter described with reference to FIGS. 12A to 12D.

Figure 12A:
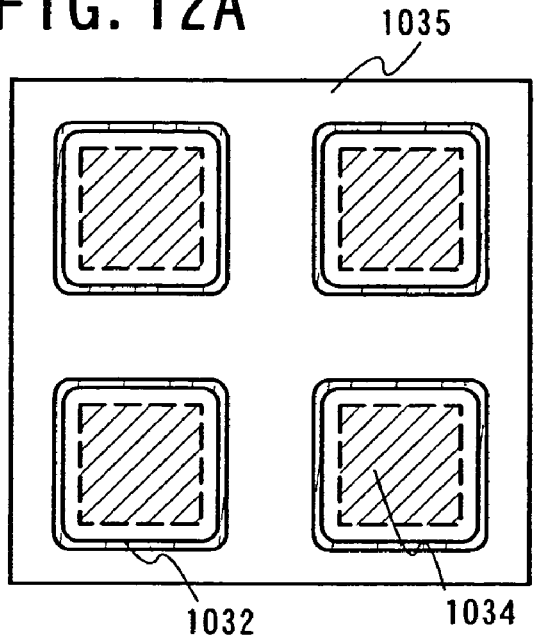
FIGS. 12A to 12D are top views each illustrating a process of manufacturing a liquid crystal display device using a method for dropping liquid crystals according to a certain aspect of the present invention.

Firstly, a first substrate 1035 that is provided with a pixel portion 1034 over the insulating surface is prepared. The first substrate 1035 is preliminarily provided with an orientation film, performed with rubbing treatment, dispersed with a spherical spacer or provided with a columnar spacer, or provided with a color filter. Then, as illustrated in FIG. 12A, a sealant 1032 is formed at the predetermined position (pattern surrounding the pixel portion 1034) over the first substrate 1035 in the presence of an inert gas or under reduced pressure by a dispenser device or an ink jet device. A material including a filler (diameter of from 6 μm to 24 μm) and having viscosity of 40 Pa/s to 400 Pa/s is used as a semitransparent sealant 1032. Further, the sealant material that is not dissolved in a liquid crystal that is to be in contact with the sealant is preferably selected. An acrylic-based photo-curing rein or an acrylic-based heat curing resin may be used as the sealant. The sealant 1032 can also be formed by printing because the sealant 1032 only has to form a simple pattern.

Figure 12B:
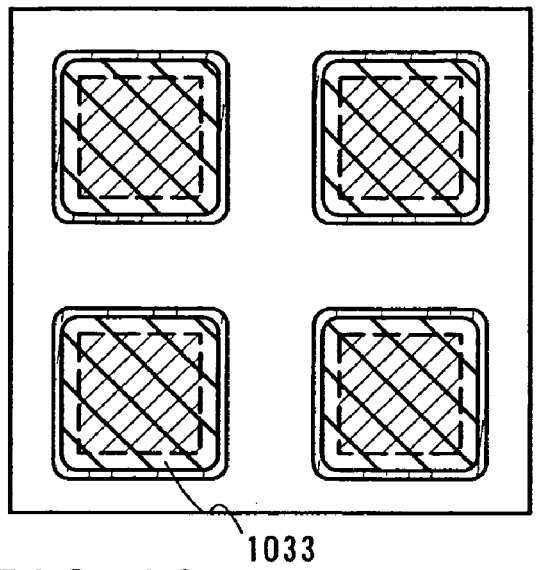

A liquid crystal 1033 is dropped by an ink jetting method in the region surrounded by the sealant 1032 (FIG. 12B). A known liquid crystal material that has viscosity capable of being discharged by an ink jetting method is used as the liquid crystal 1033. Since the viscosity of the liquid crystal material can be set by controlling temperature, the liquid crystal material is suitable for ink jetting. A necessary amount of the liquid crystal 1033 can be held without waste in the region surrounded by the sealant 1032 by an ink jetting method.

Figure 12C:
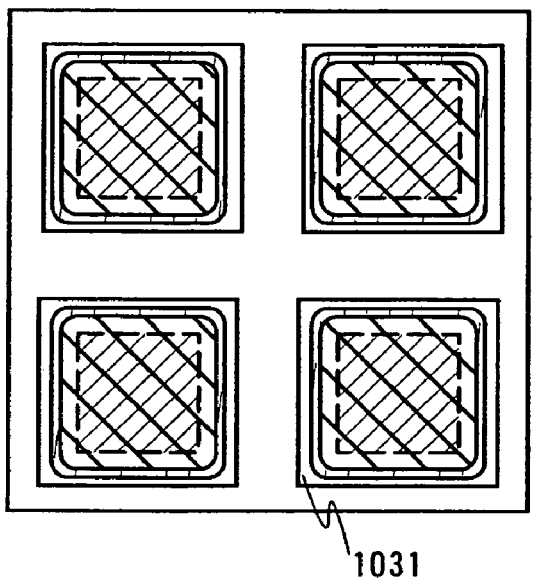

Then, the first substrate 1035 provided with the pixel portion 1034 is attached to a second substrate 1031 provided with an opposite electrode and an orientation film under reduced pressure so that air bubbles are not entered between the two substrates (FIG. 12C). Herein, the sealant 1032 is cured by ultraviolet irradiation or heat treatment simultaneously with the attachment. In addition to the ultraviolet irradiation, heat treatment may also be performed.

Figure 13A:
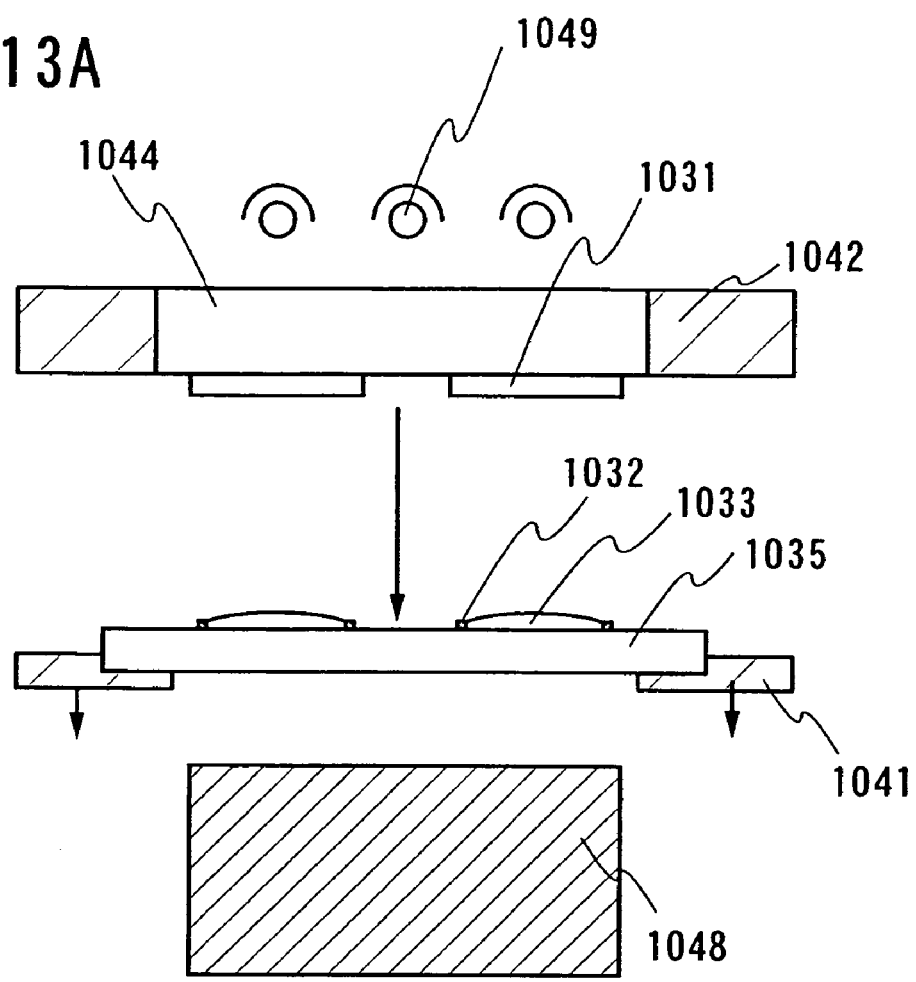
FIGS. 13A and 13B are views each illustrating a process of manufacturing a liquid crystal display device using a method for dropping liquid crystals according to a certain aspect of the present invention.
Figure 13B:
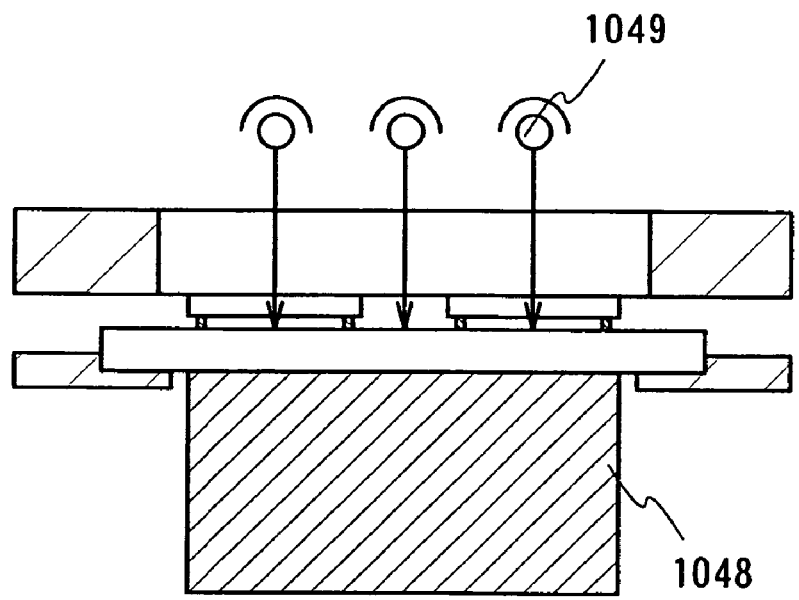

FIGS. 13A and 13B illustrate an example of an attachment device capable of performing UV irradiation or beat treatment during attaching or after attaching.

In FIGS. 13A and 13B, reference numeral 1041 denotes a first substrate support medium; 1042, a second substrate support medium; 1044, a window; 1048, a lower surface table; and 1049, a light source. In FIGS. 13A and 13B, like components are denoted by like reference numerals as of FIG. 12.

The lower surface table 1048 is installed with a heater for curing sealant. The second substrate support medium is provided with the window 1044 to pass ultraviolet light from the light source 1049. Although not shown, alignment of a substrate is performed through the window 1044. The second substrate 1033 serving as an opposite substrate is preliminarily cut into a desired size and secured to the second substrate support medium 1042 by a vacuum chuck. FIG. 13A illustrates the state of before being attached.

At the time of attachment, the first substrate support medium and the second substrate support medium are moved down, and the first substrate 1035 and the second substrate 1031 are attached to each other, then, the attached substrates are irradiated with ultraviolet light to be cured. FIG. 13B illustrates the state of after being attached.

Figure 12D:
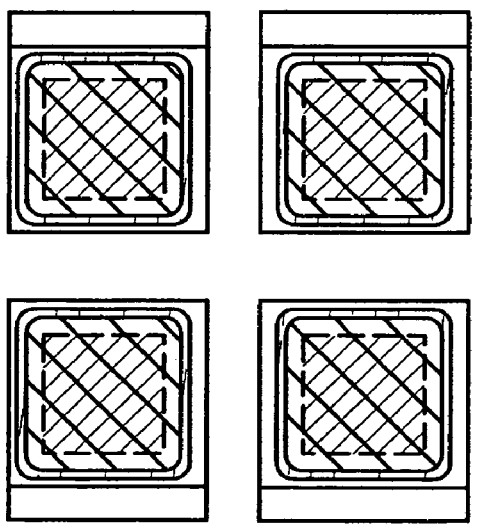

Then, the first substrate 1035 is cut using a cutting device such as a scriber device, a breaker device, a roll cutter device, or the like (FIG. 12D). In this manner, four panels are manufactured from one substrate. Then, an FPC is attached to the panels by known technique.

A glass substrate or a plastic substrate can be used as the first substrate 1035 and the second substrate 1031.

Figure 14A:
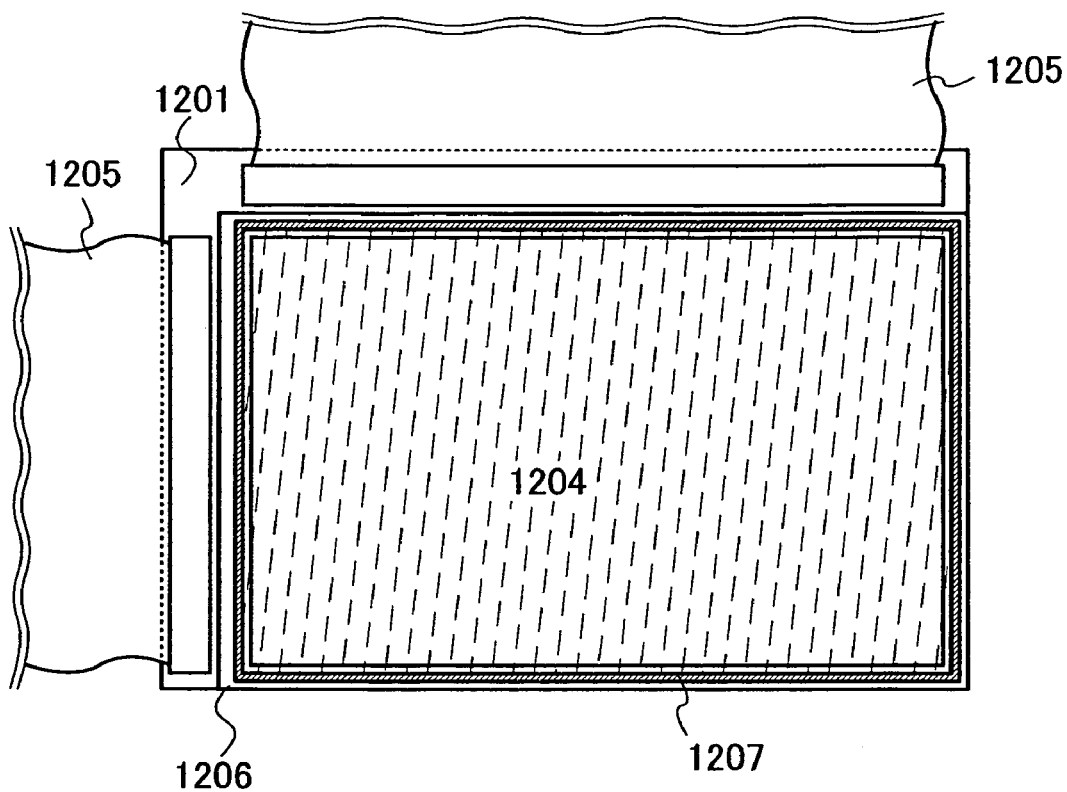
FIGS. 14A and 14B are top views of a liquid crystal display device according to a certain aspect of the present invention.
Figure 14B:
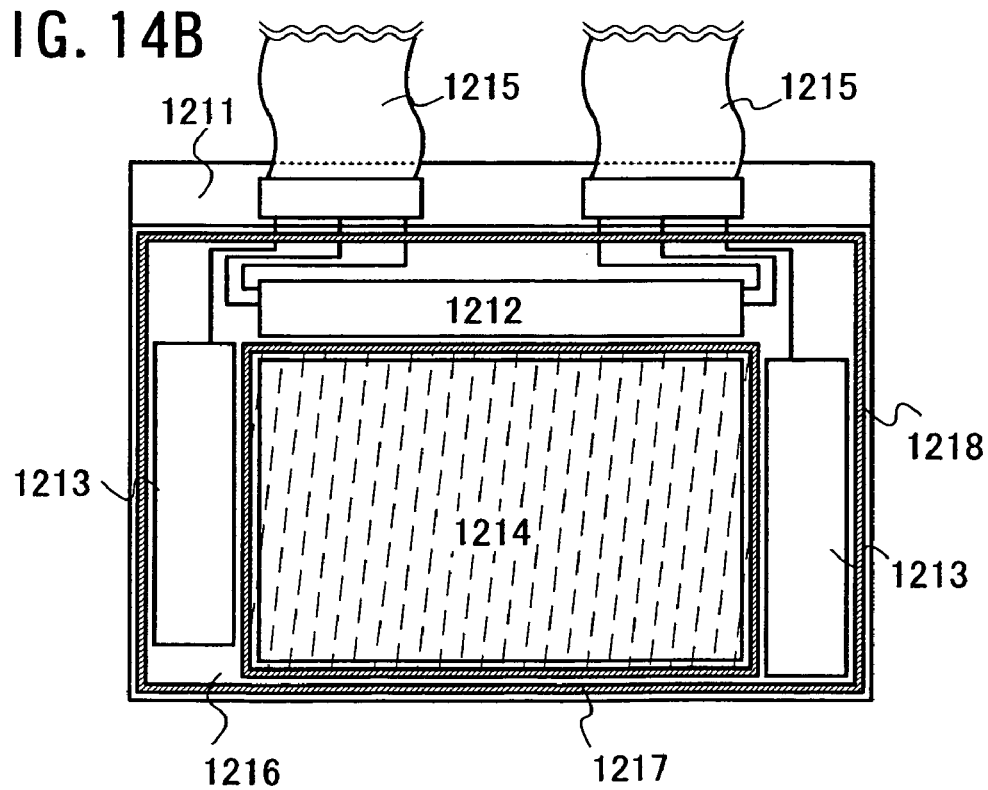

FIG. 14A illustrates a top view of a liquid crystal module obtained according to the foregoing processes. FIG. 14B illustrates an example of a top view of another liquid crystal module.

In FIG. 14A, reference numeral 1201 denotes an active matrix substrate; 1206, an opposite substrate; 1204, a pixel portion; 1207, sealant; and 1205, an FPC. Further, a liquid crystal is discharged by a droplet discharging method and the pair of substrates 1201 and 1206 is attached by the sealant 1207 under reduced pressure.

In the case of using a TFT having an active layer formed of a semi-amorphous semiconductor, for example a semi-amorphous silicon film, part of a driver circuit can also be manufactured and a liquid crystal module as illustrated in FIG. 14B can be manufactured. Further, an IC chip is mounted in the case of a driver circuit that cannot be formed by the TFT having an active layer formed of a semi-amorphous silicon film.

Further, the semi-amorphous semiconductor indicates a film including a semiconductor with an intermediate structure between an amorphous semiconductor and a semiconductor with a crystal structure (including a single crystal and a polycrystal). This semi-amorphous semiconductor is a semiconductor having a third condition that is stable like a free energy and a crystalline semiconductor having a short-range order and lattice distortion, of which grain size is set from 0.5 nm to 20 nm, and can exist by being dispersed in a non-single crystalline semiconductor. Raman spectrum of a semi-amorphous semiconductor is shifted to a lower wave number side less than 520 cm$^{-1}$. Diffraction peak of (111) or (220) to be caused from a crystal lattice of silicon is observed in X-ray diffraction. At least 1 atomic % or more of hydrogen or halogen is contained to terminate a dangling bond. Here, such a semiconductor is referred to as a semi-amorphous semiconductor (SAS) for convenience. Further, a preferable semi-amorphous semiconductor with increased stability can be obtained by further promoting lattice distortion to contain a rare gas element such as helium, argon, krypton, or neon.

In addition, a SAS can be obtained by performing grow discharge decomposition of a silicide gas. A typical silicide gas is $SiH_4$, and besides, $Si_2H_6$, $SiH_2Cl_2$, $SiHCl_3$, $SiCl_4$, $SiF_4$, or the like can be used. In addition, a SAS can be easily formed by using this silicide gas diluted with hydrogen or hydrogen added with one or a plurality of rare gas elements of helium, argon, krypton, and neon. The silicide gas is preferably diluted under the dilution ratio ranging from 2 times to 1000 times. Further, the energy band width of the silicide gas may be adjusted from 1.5 eV to 2.4 eV or from 0.9 eV to 1.1 eV by mixing a carbide gas such as $CH_4$ or $C_2H_6$, a germanium gas such as $GeH_4$ or $GeF_4$, or $F_2$, or the like in the silicide gas.

For example, in the case of using $SiH_4$ gas added with $H_2$ or using $SiH_4$ gas added with $F_2$, a TFT is manufactured using a semi-amorphous semiconductor that is formed. In that case, a subthreshold coefficient (S-value) of the TFT can be set 0.35 V/sec or less, typically from 0.25 V/sec to 0.09 V/sec and the mobility can be set 10 $cm^2$/Vsec. For example, when a 19-stage ring oscillator is formed with the above TFT using the semi-amorphous semiconductor, characteristics of the repetition rates of 1 MHz or more, preferably 100 MHz or more can be obtained at the power supply voltages ranging from 3 V to 5 V. In addition, a delay time per stage of an inverter can be set 26 ns, preferably 0.26 ns or less at the power supply voltages ranging from 3 V to 5 V.

In FIG. 14B, reference numeral 1211 denotes an active matrix substrate; 1216, an opposite substrate; 1212, a source signal line driver circuit; 1213, a gate signal line driver circuit; 1214, a pixel portion; 1217, a first sealant; and 1215, an FPC. Further, a liquid crystal is discharged by a droplet discharging method and the pair of substrates 1211 and 1216 is attached by the first sealant 1217 and a second sealant 1218. There is not a liquid crystal over the driver circuit portions 1212 and 1213, but the liquid crystal is provided only for the pixel portion 1214. The second sealant 1218 is provided to reinforce the whole panel.

The obtained liquid crystal module is provided with a backlight 1304 and an optical waveguide 1305, and covered by a cover 1306. Accordingly, an active matrix liquid crystal display device (transmission type) is completed as partly illustrated by the cross section in FIG. 15. Further, the cover and the liquid module are secured by an adhesive agent or an organic resin. Since the active matrix liquid crystal display device illustrated in FIG. 15 is a transmission type, a polarizing plate 2603 is attached to both the active matrix substrate and the opposite substrate.

Figure 15:
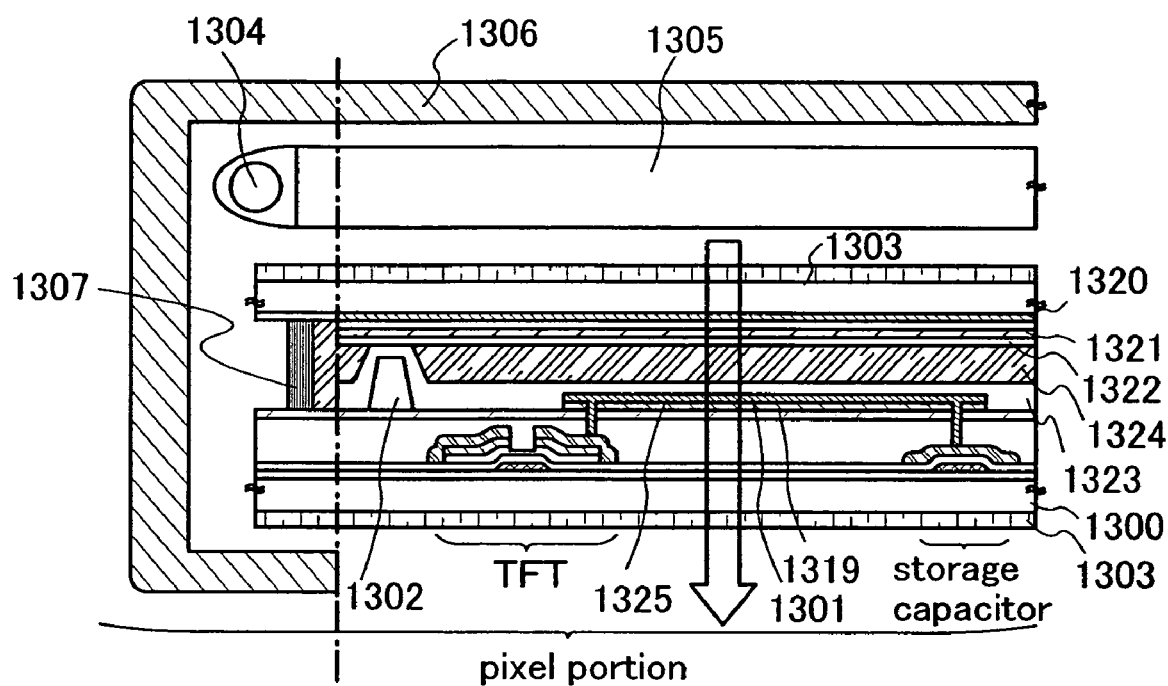
FIG. 15 is a cross-sectional view of a liquid crystal display device according to a certain aspect of the present invention.

In FIG. 15, reference numeral 1300 denotes a substrate; 1301, a pixel electrode; 1302, a columnar spacer; 1307, a sealant; 1320, a color filter in which a colored layer and a light-shielding layer are arranged to correspond to each pixel; 1321, an opposite electrode; 1322 and 1323, orientation films; 1324, a liquid crystal layer; 1319, a protective film; and 1325, a conductive material film (cap film).

In addition, this embodiment can be arbitrarily combined with any description of Embodiment Mode and Embodiment 1 and 2, if necessary.

Embodiment 4

Figure 16:
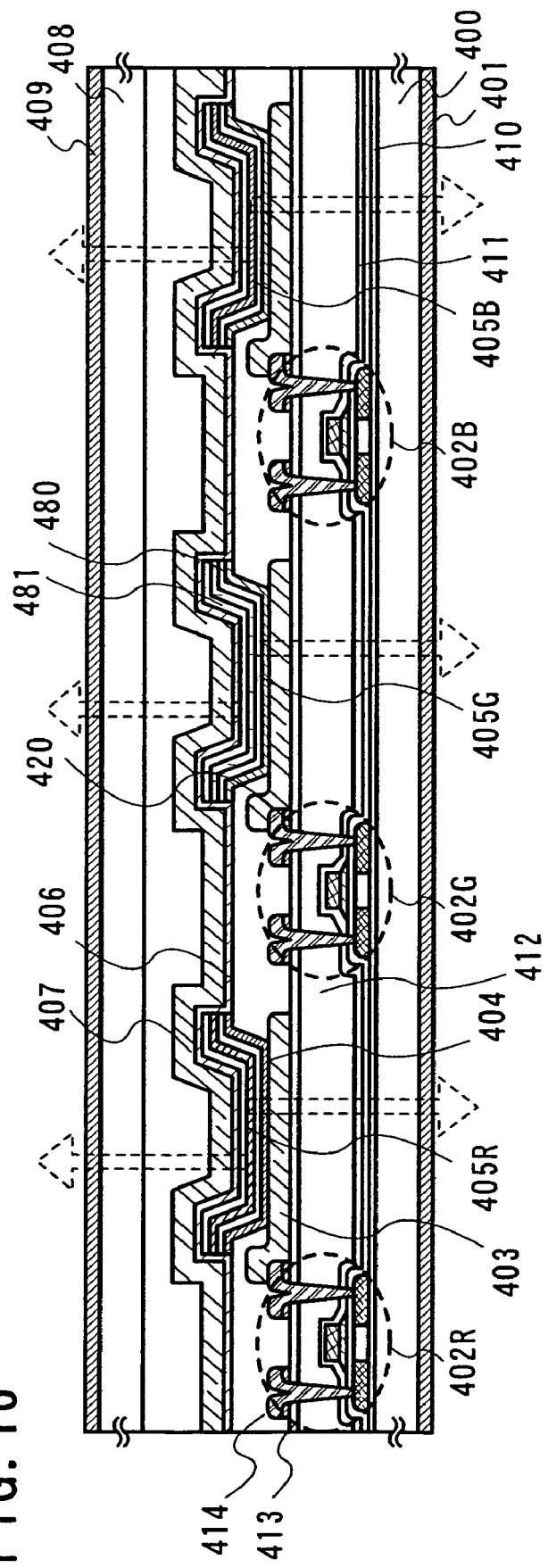
FIG. 16 is a cross-sectional view of an EL display device according to a certain aspect of the present invention.

This embodiment describes an example of a method for manufacturing an EL (Electro-Luminescence) display device with reference to FIG. 16.

This embodiment describes a dual emission display device as an example of the EL display device, and a method for manufacturing the dual emission display device is also described.

Firstly, a base insulating film 410 is formed over a substrate 400. In order to make light emit through a substrate that is used as one display surface, a glass substrate or a quartz substrate, each of which has a light-transmitting property, may be used as the substrate 400. In addition, a light-transmitting plastic substrate having a heat-resisting property that can withstand a processing temperature may be used. Herein, a glass substrate is used as the substrate 400. Further, a refractive index of the glass substrate is approximately 1.55.

A base film is formed by an insulating film such as a silicon oxide film, a silicon nitride film, or a silicon oxide film containing nitrogen as the base insulating film 410. The base insulating film is also has a light-transmitting property here. Although an example in which the base film has a two-layer structure is described herein, it may have a single layer of the foregoing insulating film or a lamination layer of two or more of the foregoing insulating films. The base insulating film is not always required to be formed.

Next, a semiconductor layer is formed over the base insulating film 410. The semiconductor layer is formed by depositing a semiconductor film having an amorphous structure by a known method (a sputtering method, a LPCVD method, a plasma CVD method, or the like), and patterning a crystalline semiconductor film obtained by a known crystallization treatment (a laser crystallization method, a thermal crystallization method, a thermal crystallization method using a catalyst such as nickel, or the like) by using a first photomask into a desired shape. The semiconductor layer is formed in a thickness of from 25 nm to 80 nm (preferably, from 30 nm to 70 nm). There is no particular limitation on a material of the crystalline semiconductor film. The crystalline semiconductor film is preferably formed from silicon, a silicon-germanium (SiGe) alloy, or the like.

In addition, a continuous wave laser may be used for the crystallization treatment of the semiconductor film having an amorphous structure. In order to obtain a crystal in a large grain diameter in crystallizing an amorphous semiconductor film, it is preferable to use a second harmonic to a fourth harmonic of a fundamental wave using a solid laser which can continuously oscillate. Typically, a second harmonic (532 nm) or a third harmonic (355 nm) of a Nd: $YVO_4$ laser (a fundamental wave of 1064 nm) may be applied. In the case of using the continuous wave laser, laser light emitted from a continuous wave $YVO_4$ laser having output of 10 W is converted to a harmonic by a nonlinear optical element. Alternatively, the harmonic may be emitted by putting an $YVO_4$ crystal and the nonlinear optical element into a resonator. Then, the harmonic is preferably formed into laser light in a rectangular or elliptical shape on an irradiation surface by an optical system to be emitted to an object, in which case the energy density of approximately from 0.01 $MW/cm^2$ to 100 $MW/cm^2$ (preferably, from 0.1 $MW/cm^2$ to 10 $MW/cm^2$) is required. The semiconductor film may be irradiated with laser light by being moved relatively to the laser light at the speed of approximately from 10 cm/s to 2000 cm/s.

Then, a gate insulating film for covering the semiconductor layer is formed after the resist mask is removed. The gate insulating film is formed in a thickness of from 1 nm to 200 nm by a plasma CVD method, a sputtering method, or a thermal oxidation method. An insulating film such as a silicon oxide film, a silicon nitride film, or a silicon oxide film containing nitrogen is formed as the gate insulating film. The gate insulating film is also a film having a light-transmitting property here. When the plasma CVD method is used to form a gate insulating film having a thin thickness, it is required to obtain a thin film thickness with good controllability by slowing down a deposition rate. For example, deposition speed of the silicon oxide film can be set at 6 nm/min under the condition, in other words, RF power is set at 100 W. 10 kHz; pressure, 0.3 Torr; an $N_2O$ gas flow, 400 sccm; and a $SiH_4$ gas flow, 1 sccm.

And then, a conductive film in a thickness of from 100 nm to 600 nm is formed over the gate insulating film. Here, a conductive film having a stacked structure of a TaN film and a W film is formed by a sputtering method. The conductive film is formed by stacking the TaN film and the W film herein; however, the conductive film is not limited thereto. As the conductive film, a single layer made from an element of Ta, W, Ti, Mo, Al, and Cu, or an alloy material or a compound material, each of which contains the foregoing element as its main component; or a lamination layer made from the foregoing single layers can be used. Alternatively, a semiconductor film typified by a polycrystalline silicon film doped with an impurity element such as phosphorous may also be used.

A resist mask is formed by using a second photomask to perform an etching process by a dry etching method or a wet etching method. In this etching process, the conductive film is etched to form gate electrodes of TFTs 402R, 402G, and 402B.

Next, a resist mask is newly formed by using a third photomask after removing the resist mask. In this case, a first doping process for doping an impurity element imparting n-type conductivity (typically, phosphorus (P) or arsenic (As)) to a semiconductor to form a low-concentration region is performed in order to form an n-channel TFT. The resist mask covers a region to be a p-channel TFT and the vicinity of the conductive layer. A low-concentration impurity region is formed by performing a through doping process via the insulating film by the first doping process. A light-emitting element is driven by using a plurality of TFTs. However, the doping process mentioned above is not especially required when the light-emitting element is driven only by a p-channel TFT.

After removing the resist mask, a resist mask is newly formed by using a fourth photomask. A second doping process is performed to dope an impurity element imparting p-type conductivity (typically, boron (B)) to a semiconductor to form a high-concentration impurity region. A p-type high-concentration impurity region is formed by performing a through doping process via the insulating film by the second doping process.

Then, a resist mask is newly formed by using a fifth photomask. A third doping process for doping an impurity element imparting n-type conductivity (typically, phosphorus (P) or arsenic (As)) to a semiconductor to form a high-concentration region is performed to form an n-channel TFT. The resist mask covers the region to be the p-channel TFT and a vicinity of the conductive layer. A through doping process is performed via the gate insulating film by the third doping process to form an n-type high-concentration impurity region.

Thereafter, activation and hydrogenation processes of the impurity element added to the semiconductor layer are performed after removing the resist mask and depositing an insulating film containing hydrogen 411. The insulating film containing hydrogen 411 is formed by a silicon nitride film containing oxygen (SiNO film) obtained by a PCVD method. In addition, in the case where the semiconductor film is crystallized by using a metal element which promotes crystallization, typically, nickel, a gettering process for reducing nickel in a channel formation region can also be performed simultaneously with the activation process. Further, the insulating film containing hydrogen 411 is the first layer of an interlayer insulating film, in other words, a light-transmitting insulating film containing silicon oxide.

Then, a planarizing film 412 is formed to be the second layer of the interlayer insulating film. A light-transmitting inorganic material (silicon oxide, silicon nitride, silicon oxide containing nitride, or the like), a photosensitive or non-photosensitive organic material (polyimide, acrylic, polyamide, polyimide amide, benzocyclobutene or a resist), a lamination layer made from the foregoing materials, or the like is used as the planarizing film 412. Further, an insulating film formed by a SiOx film including an alkyl group by a coating method, for example, silica glass, alkyl siloxane polymer, alkyl silsesquioxane polymer, hydrogenated silsesquioxane polymer, hydrogenated alkyl silsesquioxane polymer, or the like can be used as another light-transmitting film used for the polarizing film 412. PSB-K1 or PSB-K31 of an insulating coating film material manufactured by Toray Industries, Inc., or ZRS-5PH of an insulating coating film material manufactured by Catalysts & Chemicals Ltd. can be given as an example of the siloxane based polymer.

Then, a light-transmitting interlayer insulating film 413 is formed to be the third layer of the interlayer insulating film. The interlayer insulating film 413 that is the third layer of the interlayer insulating film is provided so as to protect the planarizing film that is the second interlayer insulating film as an etching stopper film when a transparent electrode 403 is patterned in a later process. However, the third interlayer insulating film 413 is not required in the case where the second interlayer insulating film 412 can serve as an etching stopper film when the transparent electrode 403 is patterned.

A conductive material film (cap film) 420 is formed over the interlayer insulating films 411 to 413. In this embodiment, a titanium film is deposited in 100 nm thick by a sputtering method. Refractory metal such as tantalum (Ta) or tungsten (W), a nitride or the like of the foregoing refractory metal such as titanium nitride (TiN) or tantalum nitride (TaN) can be used as the conductive material film 420.

A contact hole is formed in the interlayer insulating films 411 to 413 by using a sixth mask. The contact hole is formed by a dry etching method. Carbon tetrafluoride ($CF_4$), oxygen ($O_2$), and helium (He) are each used as an etching gas at a flow rate of 50:50:30 sccm, respectively.

Then, the sixth mask is removed. After a conductive film (lamination film of TiN/Al/TiN) is formed, the conductive film is etched (dry etching using a mixed gas of $BCl_3$ and $Cl_2$) by using an eighth mask to form a wiring (such as a source wiring or a drain wiring of a TFT, or a current supply wiring). The TiN is one of a material that has a favorable adhesiveness with a planarizing film having a high heat resistance. In addition, it is preferable that the TiN has a nitrogen content of less than 44% so as to have preferable ohmic contact to a source region or a drain region of the TFT.

The transparent electrode 403, in other words, an anode of an organic light-emitting element is formed in a thickness ranging from 10 nm to 800 nm by using a seventh mask. A transparent conductive material having a high work function (work function of 4.0 eV or higher) such as indium tin oxide including Si element (ITSO), or indium zinc oxide (IZO) that is a mixture of zinc oxide (ZnO) of 2% to 20% and indium oxide can be used as well as indium tin oxide (ITO) as the transparent electrode 403.

An insulator (also referred to as a bank and the like) 414 for covering an edge of the transparent electrode 403 is formed by using the eighth mask. A photosensitive or non-photosensitive organic material (polyimide, acrylic, polyamide, polyimide amide, benzocyclobutene, or a resist) or an SOG film obtained by a coating method (for example, a SiOx film including an alkyl group) is used in a thickness ranging from 0.8 μm to 1 μm as the insulator 414.

Next, layers containing organic compounds 404, 480, 405 (405R, 405G, and 405B), 481, and 406 are formed by a vapor deposition method or a coating method. In order to improve reliability, it is preferable to deaerate by performing vacuum heating before forming the layer containing an organic compound 404. For example, it is preferable to perform heat treatment at temperatures of from 200° C. to 300° C. under low pressure atmosphere or inert atmosphere in order to remove gas included in the substrate before depositing an organic compound material. In the case where the interlayer insulating film and the bank are formed by a $SiO_x$ film having high heat resistance, heat treatment at higher temperature (410° C.) can be additionally performed.

Molybdenum oxide ($MoO_x$), 4,4'-bis[N-(1-naphthyl)-N-phenyl-amino]-biphenyl (α-NPD), and rubrene are selectively co-evaporated over the transparent electrode 403 by using an evaporation mask to form a first layer containing organic compound 404 (a hole injecting layer).

In addition to $MoO_x$, a material having a high hole injecting property such as copper phthalocyanine (CuPC), vanadium oxide ($VO_x$), ruthenium oxide ($RuO_x$), or tungsten oxide ($WO_x$) can be used. Alternatively, the first layer containing organic compound 404 may be formed by coating a high-molecular weight material having a high hole injecting property such as poly (ethylenedioxythiophene) solution (PE-DOT) or poly(styrenesulfonic acid) solution (PSS) solution.

α-NPD is selectively deposited using an evaporation mask to form a second layer containing an organic compound (hole transporting layer) 480 over the first layer containing organic compound 404. In addition to α-NPD, a material having a high hole transporting property typified by an aromatic amine based compound such as 4,4'-bis[N-(3-methylphenyl)-N-phenyl-amino]-biphenyl (TPD), 4,4',4''-tris(N,N-diphenyl-amino)-triphenylamine (TDATA), or 4,4',4''-tris[N-(3-methylphenyl)-N-phenyl-amino]-triphenylamine (MTDATA) can be used.

The third layers containing organic compounds 405 (405R, 405G and 405B) (light-emitting layer) are selectively formed. The layers containing an organic compound 405R, 405G and 405B are selectively formed by aligning each evaporation mask for each light-emitting color (R, G, and B) to realize full-color display.

A material such as $Alq_3$: DCM or $Alq_3$: rubrene: BisDCJTM is used as the light-emitting layer 405R exhibiting red emission. A material such as $Alq_3$: DMQD (N,N'-dimethyl quinacridone) or $Alq_3$: coumarin 6 is used as the light-emitting layer 405G exhibiting green emission. A material such as α-NPD or tBu-DNA is used as the light-emitting layer 405B exhibiting blue emission.

$Alq_3$ (tris(8-quinolinolate) aluminum) is deposited selectively using an evaporation mask to form a fourth layer containing an organic compound (electron transporting layer) 481 over the light-emitting layers 405R, 405G and 405B. In addition to $Alq_3$, a material having a favorable electron transporting property as typified by metal complexes having a quinoline skeleton or benzoquinoline skeleton such as tris (4-methyl-8-quinolinolate) aluminum (abbreviated as $Almq_3$), bis (10-hydroxybenzo[h]-quinolinato) beryllium (abbreviated as $BeBq_2$), bis(2-methyl-8-quinolinolate)-4-phenyl phenolate-aluminum (abbreviated as BAlq), or the like can be used. Other examples include metal complexes having oxazole-based and thiazole-based ligand such as bis[2-(2-hydroxyphenyl)-benzoxazorato]zinc (abbreviated as $Zn(BOX)_2$) and bis[2-(2-hydroxyphenyl)-benzothiazorato] zinc (abbreviated as $Zn(BTZ)_2$). Further, in addition to metal complexes, 2-(4-biphenylyl)-5-(4-tert-butylphenyl)-1,3,4-oxadiazole (abbreviated as PBD), and 1,3-bis [5-(p-tert-butylphenyl)-1,3,4-oxadiazole-2-yl]benzene (abbreviated as OXD-7); 3-(4-tert-butylphenyl)-4-phenyl-5-(4-biphenylyl)-1,2,4-triazole (abbreviated as TAZ); and 3-(4-tert-butylphenyl)-4-(4-ethylphenyl)-5-(4-biphenylyl)-1,2,4-triazole (abbreviated as p-EtTAZ); bathophenanthroline (abbreviated as BPhen); bathocuproin (abbreviated as BCP); and the like can be used as the fourth layer containing an organic compound layer (electron transporting layer) 481 since they have a favorable electron transporting property.

Next, 4,4-bis (5-methylbenzoxazol-2-yl) stilbene (abbreviated as BzOs) and lithium (Li) are co-evaporated to form the fifth layer containing organic compound (electron injecting layer) 406 covering the electron transporting layer 481 and the insulator 414. Damages due to a sputtering method performed in a later process in forming the transparent electrode 407 can be suppressed by using benzoxazole derivatives (BzOs). In addition to BzOs: Li, a compound of an alkali metal or an alkali earth metal that has a high electron injecting property such as $CaF_2$, lithium fluoride (LiF), cesium fluoride (CsF) can be used. Further, a mixture of $Alq_3$ and magnesium (Mg) can also be used.

A transparent electrode 407, in other words, a cathode of the organic light-emitting element, is formed over the fifth layer containing an organic compound 406 in a thickness of 10 nm to 800 nm. Indium tin oxide including Si element (ITSO), or indium zinc oxide (IZO) that is a mixture of zinc oxide (ZnO) of 2% to 20% and indium oxide can be used for forming the transparent electrode 407 as well as indium tin oxide (ITO).

As described above, a light-emitting element is manufactured. Each material for an anode, layers containing organic compound (first to fifth layers containing organic compounds) and a cathode, each of which constructs the light-emitting element, is appropriately selected, and each thickness of the foregoing layers is adjusted. It is desired that the anode and the cathode are formed from the same material to have almost the same thickness, preferably, a thin thickness of approximately 100 nm.

If necessary, a transparent protective layer is formed to prevent water from penetrating into the light-emitting element by covering the light-emitting element. A silicon nitride film, a silicon oxide film, or a silicon nitride film containing oxygen (an SiNO film having a composition ratio: N>O or an SiON film having a composition ratio: N<O), a thin film mainly containing carbon (for example, DLC film or a CN film) or the like, each of which can be obtained by a sputtering method or a CVD method, can be used as the transparent protective layer.

A second substrate 408 is attached to the substrate 400 with a sealing agent containing a gap material for keeping a gap between the substrates. The second substrate 408 may also be formed by a glass substrate or a quartz substrate, each of which has a light-transmitting property. Further, the gap between a pair of the substrates may be provided with a drying agent as an air gap (an inert gas) or filled with a transparent sealing agent (an ultraviolet curing resin, a thermosetting epoxy resin, or the like).

In the light-emitting element, the transparent electrodes 403 and 407 are formed by a light-transmitting material, and light can be emitted from one light-emitting element in two directions, in other words, light can be emitted from both sides as indicated by the outline arrows in FIG. 16.

By forming a panel to have the foregoing structure, the light intensity of light-emission from a top face and a rear face can be almost the same. The panel using a way of emitting light from both sides as described in this embodiment is referred to as a dual emission panel.

Lastly, optical films 401 and 409 (a polarizing plate or a circularly polarizing plate) are provided to improve contrast.

In this embodiment, a TFT is formed to be a top gate TFT, but not exclusively, the TFT may appropriately formed to be a bottom gate (reverse staggered) TFT or staggered TFT. Further, the TFT is not limited to a single gate structure TFT and the TF1 may be formed to be a multi-gate TFT having a plurality of channel formation regions, for example, a double gate TFT.

In this embodiment, a dual emission panel is described. Alternatively, a top emission panel or a bottom emission panel which is a surface-emission panel can also be used.

In order to manufacture a top emission panel, an anode of an organic light-emitting element may be formed by a material having a light-shielding property instead of a transparent electrode. For instance, in case of forming the anode to have a three layered structure composed of a titanium nitride film, a film containing aluminum as its main component, and a titanium nitride film, the anode becomes capable of having high resistance as a wiring, having good ohmic contact, and serving as an anode. Alternatively, an anode of an organic light-emitting element may be formed by a single layer such as a titanium nitride film, a chromium film, a tungsten film, a Zn film, a Pt film; or a lamination layer composed of three or more layers.

A cathode of a top emission panel is preferably transparent or semi-transparent, and can be formed by a material that is used for forming the transparent electrode 407.

When a bottom emission panel is manufactured, an anode of an organic light-emitting element can be formed by a material that is used for forming the transparent electrode 407.

A material having a light-shielding property and small work function (Al, Ag, Li, Ca, or alloys of the foregoing element such as MgAg, MgIn, AlLi, $CaF_2$, or CaN) may be used as a cathode of the bottom emission panel.

In manufacturing the top emission panel or a bottom emission panel, a layer containing an organic compound in an organic light-emitting element can be appropriately varied depending on a material for each of the anode and the cathode.

Light emitted from a light-emitting element includes light emission radiated in returning to a ground state from a singlet excited state (fluorescence) and light emission radiated in returning to a ground state from a triplet excited state (phosphorescence). In this embodiment, either or both of the light can be used.

This embodiment can be arbitrarily combined with any description of Embodiment Mode and Embodiments 1 and 2, if necessary.

Embodiment 5

A top emission type EL display panel is described with reference to FIGS. 30A to 30C, FIGS. 31A and 31B, FIG. 32, and FIG. 33.

Through FIGS. 30A to 30C, FIGS. 31A and 31B, FIG. 32, and FIG. 33, like components are denoted by like numerals as of Embodiment 4. Components that are not especially described are manufactured by the process performed in Embodiment 4.

Figure 30A:
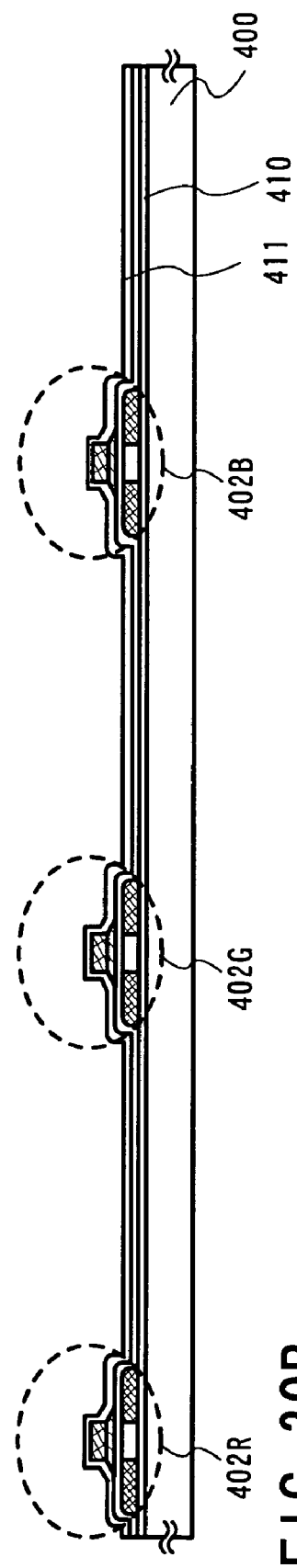
FIGS. 30A to 30C are cross-sectional views each illustrating a process of manufacturing an EL display device according to a certain aspect of the present invention.

According to the process as is the case with Embodiment 4, a process of up to forming an insulating film containing hydrogen (a first layer of an interlayer insulating film, hereinafter, a first interlayer insulating film) 411 is performed (see FIG. 30A). In this embodiment, a silicon nitride film containing oxygen (SiNO film) is deposited in a thickness of 100 nm by a plasma CVD method as the first interlayer insulating film 411. Thereafter, the first interlayer insulating film 411 is heated in the presence of nitrogen at 410° C. for 1 hour. By the heat treatment, activation treatment of impurity elements doped to a semiconductor layer and hydrogenation treatment of the semiconductor layer are performed. In the case where the semiconductor film is crystallized by using a metal element that promotes crystallization typified by nickel (Ni), gettering for reducing nickel (Ni) in a channel formation region can be performed simultaneously.

Figure 30B:
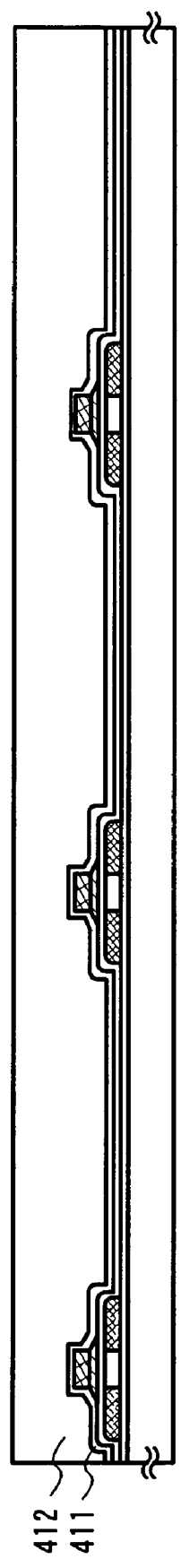

A second interlayer insulating film (hereinafter, second interlayer insulating film) 412 is formed (see FIG. 30B). A light-transmitting inorganic material (silicon oxide, silicon nitride, silicon oxynitride, or the like), a photosensitive or non-photosensitive organic material (polyimide, acrylic, polyamide, polyimide amide, benzocyclobutene, or a resist), a lamination layer formed from the foregoing materials, or the like is used as the second interlayer insulating film 412. Further, an insulating film formed by an $SiO_x$ film including an alkyl group by a coating method, for example, silica glass, alkyl siloxane polymer, alkyl silsesquioxane polymer, hydrogenated silsesquioxane polymer, hydrogenated alkyl silsesquioxane polymer, or the like can be used as another light-transmitting film used for the polarizing film 412. PSB-K1 or PSB-K31 of an insulating coating film material manufactured by Toray Industries, Inc., or ZRS-5PH of an insulating coating film material manufactured by Catalysts & Chemicals Ltd. can be given as an example of the siloxane based polymer. In this embodiment, a silicon oxide film containing nitrogen is deposited by a plasma CVD method in a thickness of 900 nm as the second interlayer insulating film 412.

A contact hole is formed in the first interlayer insulating film 411 and the second interlayer insulating film 412. In this embodiment, the contact hole is formed by a dry etching method by using $CHF_3$ at a flow rate of 35 sccm as an etching gas.

Then, a conductive film is formed over the second interlayer insulating film 412. In this embodiment, a lamination film formed by stacking Ti, TiN, Al—Si (aluminum containing silicon), and TiN in each thickness of 60 nm, 40 nm, 700 nm, and 200 nm as the conductive film.

Figure 30C:
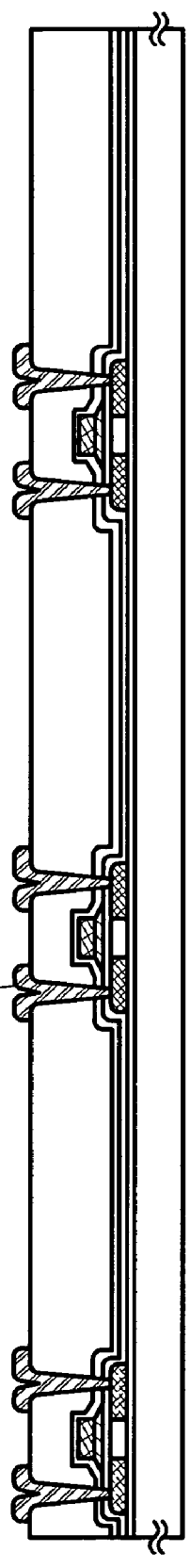

A wiring (a source and a drain wirings of a TFT, a current supply wiring, or the like) 5421 is formed by performing dry etching by using a mixed gas of $BCl_3$ and $Cl_2$ at each flow rate of 60 sccm and 20 sccm and a mixed gas of $BCl_3$ and $CF_4$ at each flow rate of 40 sccm and 40 sccm (see FIG. 30C).

A third interlayer insulating film 5422 is formed over the second interlayer insulating film 412 and the wiring 5421. A material that is used for forming the second interlayer insulating film 412 may be used as a material for the third interlayer insulating film 5422. In this embodiment, an insulating film formed by using siloxane polymer is used as an insulating film, which is a heat resistant insulating film, formed by an $SiO_x$ film including an alkyl group obtained by a coating method.

Figure 31A:
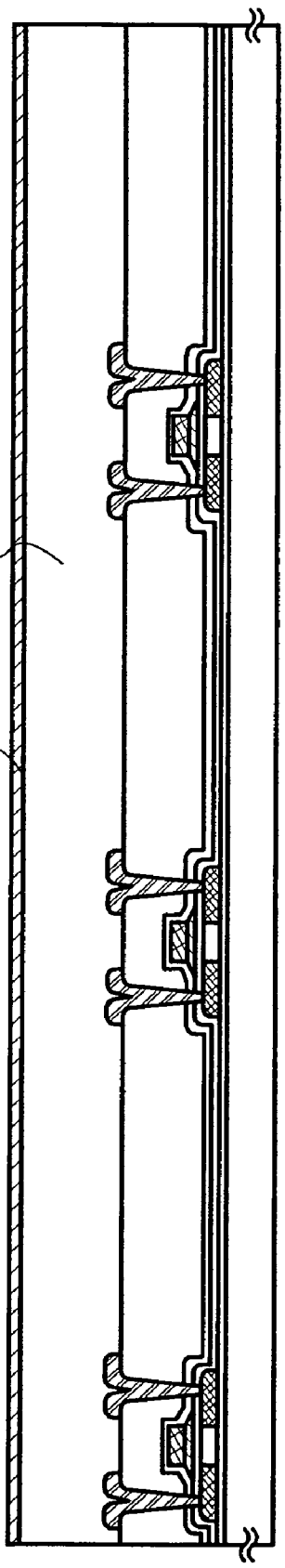
FIGS. 31A and 31B are cross-sectional views each illustrating a process of manufacturing a top emission EL display device according to a certain aspect of the present invention.

A conductive material film (cap film) 5420 is deposited over the third interlayer insulating film 5422 (see FIG. 31A). In this embodiment, a titanium nitride film (TiN film) is deposited in a thickness of 100 nm by a sputtering method. Refractory metal such as tantalum (Ta) or tungsten (W), a nitride of the foregoing refractory metal, or the like can be used as the conductive material film 5420.

Then, a contact hole is formed in the third interlayer insulating film 5422. In this embodiment, etching is performed by using carbon tetrafluoride ($CF_4$) and oxygen ($O_2$) as an etching gas at each flow rate of 45 sccm and 55 sccm.

In forming a contact hole, the conductive material film 5420 can prevent charged particles from reaching a TFT in a lower layer by dispersing the charged particles generated by plasma in the conductive material film 5420.

Figure 31B:
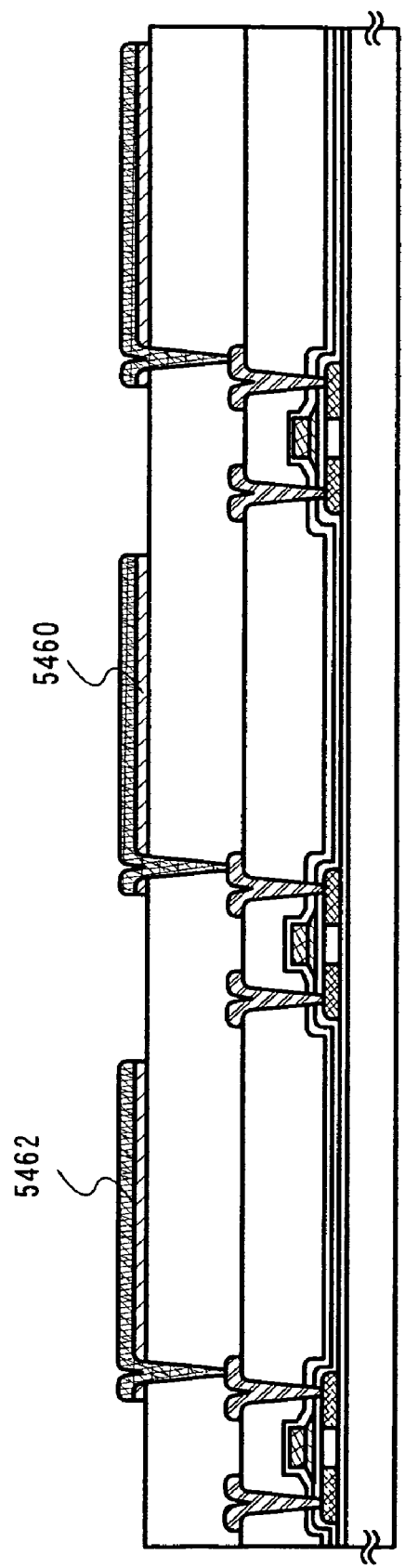

After forming a contact hole in the third interlayer insulating film 5422, a conductive film is deposited over the conductive material film 5420 to be patterned into a lower electrode 5462 (see FIG. 31B). The lower electrode 5462 is required to have flatness so that layers containing organic compounds 5404, 5480, 5405 (5405R, 5405Q, and 5405B), 5481, and 5406 formed in a later process are not short-circuited. In the case where the lower electrode 5462 is formed to have a layered structure composed of a film containing aluminum as its main component including silicon, an aluminum alloy film containing carbon, and at least one kind of element selected from nickel, cobalt, and iron, the lower electrode 5462 can be formed to be capable of having high resistance as a wiring, making good ohmic contact, and serving as a lower electrode.

Alternatively, a lamination film composed of a film containing aluminum including silicon as its main component, and a transparent conductive film (for example, an ITO film containing silicon (Si) or silicon oxide); or a lamination film of an aluminum alloy film containing carbon and at least one kind of element selected from nickel, cobalt, and iron, and a transparent conductive film (for example, an ITO film containing silicon (Si) or silicon oxide) may be used as the lower electrode 5462.

The aluminum alloy film containing carbon and at least one kind of element selected from nickel, cobalt, and iron can prevent counter diffusion of silicon and aluminum even if the film is in contact with silicon. Since such an aluminum alloy film does not yield oxidation-reduction reaction even when the aluminum alloy film is in contact with a transparent conductive film such as an ITO film, the aluminum alloy film and the ITO film can be directly in contact with each other. Further, such an aluminum alloy film is useful as a conductive film since it has low specific resistance and high heat resistance.

In this embodiment, a lamination film formed by stacking a film containing aluminum including silicon, a titanium nitride film, and an ITO film containing silicon or silicon oxide in a thickness of 30 nm, 10 nm, and 10 nm, respectively; or a lamination film formed by stacking an aluminum alloy film containing carbon and at least one kind of element selected from nickel, cobalt, and iron, or an ITO film in a thickness of 35 nm and 10 nm, respectively is used as a material for the lower electrode 5462.

In etching for forming the lower electrode 5462, the conductive material film 5420 is also etched. According to the process, a remaining region 5460 of the conductive material film 5420 corresponds to the edge of the remaining region 5460 and the edge of the lower electrode 5462, and so the remaining region 5460 is used as a part of the lower electrode 5462.

In forming a contact hole of the third interlayer insulating film 5422, the conductive material film 5420 can prevent charged particles from reaching a TFT in a lower layer by dispersing the charged particles generated by plasma in the conductive material film 5420. Simultaneously, the conductive material film 5420 has an effect of suppressing exfoliation of the lower electrode 5462. This arises from the fact that the conductive material film 5420 and the third interlayer insulating film 5422 have excellent adhesiveness.

An insulator (also referred to as a bank, a partition wall, a barrier, an embankment, or the like) 5461 for covering an edge of the lower electrode 5462 is formed. A photosensitive or non-photosensitive organic material (polyimide, acrylic, polyamide, polyimide amide, benzocyclobutene, or a resist) or an SOG film obtained by a coating method (for example, a $SiO_x$ film including an alkyl group) is used in a thickness ranging from 0.8 μm to 1 μm as the insulator 5461.

Next, layers containing organic compounds 5404, 5480, 5405 (5405R, 5405G, and 5405B), 5481, and 5406 are formed by a vapor deposition method or a coating method. In order to improve reliability of a light-emitting element, it is preferable to deaerate by performing vacuum heating before forming the layer containing organic compound 404. For example, it is preferable to perform heat treatment at temperatures of from 200° C. to 300° C. under low pressure atmosphere or inert atmosphere in order to remove gas included in the substrate before depositing an organic compound material. In the case where the interlayer insulating film and the bank are formed by a $SiO_x$ film having high heat resistance, a heat treatment at higher temperature (410° C.) can be added.

Molybdenum oxide ($MoO_x$), 4,4'-bis[N-(1-naphthyl)-N-phenyl-amino]-biphenyl (α-NPD), and rubrene are selectively co-evaporated over the lower electrode 5462 by using an evaporation mask to form a first layer containing organic compound 5404 (a hole injecting layer) in a thickness of 120 nm.

In addition to $MoO_x$, a material having a high hole injecting property such as copper phthalocyanine (CuPC), vanadium oxide ($VO_x$), ruthenium oxide ($RuO_x$), or tungsten oxide ($WO_x$) can be used. Alternatively, the first layer containing organic compound 5404 may be made from a high-molecular weight material having a high hole injecting property such as poly (ethylenedioxythiophene) solution (PEDOT) or poly (styrenesulfonic acid) solution (PSS) solution by a coating method.

α-NPD is deposited selectively using an evaporation mask to form the second layer containing an organic compound (hole transporting layer) 5480 over the first layer containing organic compound 5404. In addition to α-NPD, a material having a high hole transporting property typified by an aromatic amine based compound such as 4,4'-bis[N-(3-methylphenyl)-N-phenylamino]-biphenyl (TPD), 4,4',4"-tris(N, N-diphenyl-amino)-triphenylamine (TDATA), or 4,4',4"-tris [N-(3-methylphenyl)-N-phenyl-amino]-triphenylamine (MTDATA) can be used.

The third layers containing an organic compound 5405 (5405R, 5405G and 5405B) (light-emitting layer) are selectively formed. The layers containing an organic compound 5405R, 5405G and 5405B are selectively formed by aligning each evaporation mask for each light-emitting color (R, G, and B) to realize full-color display.

A material such as $Alq_3$: DCM or $Alq_3$: rubrene: BisD-CJTM is used As the light-emitting layer 5405R exhibiting red emission. A material such as $Alq_3$: DMQD (N,N'-dimethyl quinacridone) or $Alq_3$: coumarin 6 is used as the light-emitting layer 405G exhibiting green emission. A material such as α-NPD or tBu-DNA is used as the light-emitting layer 5405B exhibiting blue emission.

$Alq_3$ (tris(8-quinolinolate) aluminum) is deposited selectively using an evaporation mask to form a fourth layer containing an organic compound (electron transporting layer) 5481 over the light-emitting layers 5405R, 5405G and 5405B. In addition to $Alq_3$, a material having a favorable electron transporting property typified by metal complexes having a quinoline skeleton or benzoquinoline skeleton such as tris (4-methyl-8-quinolinolate) aluminum (abbreviated as $Almq_3$), bis (10-hydroxybenzo[h]-quinolinato) beryllium (abbreviated as $BeBq_2$), bis (2-methyl-8-quinolinolate)-4-phenyl phenolate-aluminum (abbreviated as BAlq), or the like can be used. Other examples include metal complexes having oxazole-based and thiazole-based ligand such as bis [2-(2-hydroxyphenyl)-benzoxazorato]zinc (abbreviated as $Zn(BOX)_2$) and bis[2-(2-hydroxyphenyl)-benzothiazorato] zinc (abbreviated as $Zn(BTZ)_2$). Further, 2-(4-biphenylyl)-5-(4-tert-butylphenyl)-1,3,4-oxadiazole (abbreviated as PBD), and 1,3-bis[5-(p-tert-butylphenyl)-1,3,4-oxadiazole-2-yl]

benzene (abbreviated as OXD-7); 3-(4-tert-butylphenyl)-4-phenyl-5-(4-bipbenylyl)-1,2,4-triazole (abbreviated as TAZ); and 3-(4-tert-butylphenyl)-4-(4-ethylphenyl)-5-(4-biphenylyl)-1,2,4-triazole (abbreviated as p-EtTAZ); bathophenanthroline (abbreviated as BPhen); bathocuproin (abbreviated as BCP); and the like can be used as the fourth layer containing an organic compound layer (electron transporting layer) 5481 in addition to metal complexes, since they have a favorable electron transporting property.

Next, 4,4-bis (5-methylbenzoxazol-2-yl) stilbene (abbreviated as BzOs) and lithium (Li) are co-evaporated to form a fifth layer containing organic compound (electron injecting layer) 5406 covering the electron transporting layer 5481 and the insulator 5461. Damages due to a sputtering method performed in a later process in forming the transparent electrode 5407 can be suppressed by using benzoxazole derivatives (BzOs). In addition to BzOs: Li, a compound of an alkali metal or an alkali earth metal that has a high electron injecting property such as $CaF_2$, lithium fluoride (LiF), cesium fluoride (CsF) can be used. Further, a mixture of $Alq_3$ and magnesium (Mg) can also be used.

An upper electrode 5407 is formed by a transparent conductive material over the fifth layer containing an organic compound 5406 in a thickness of from 10 nm to 800 nm. Indium tin oxide including Si element (ITSO), or indium zinc oxide (IZO) that is a mixture of zinc oxide (ZnO) of 2 to 20% and indium oxide can be used for forming the upper electrode 5407 as well as indium tin oxide (ITO). In this embodiment, an indium tin oxide (ITO) is formed in a thickness of 110 nm as the upper electrode 5407. If a light-transmitting property can be obtained, a thin metal film can be formed instead of the transparent conductive material.

Figure 32:
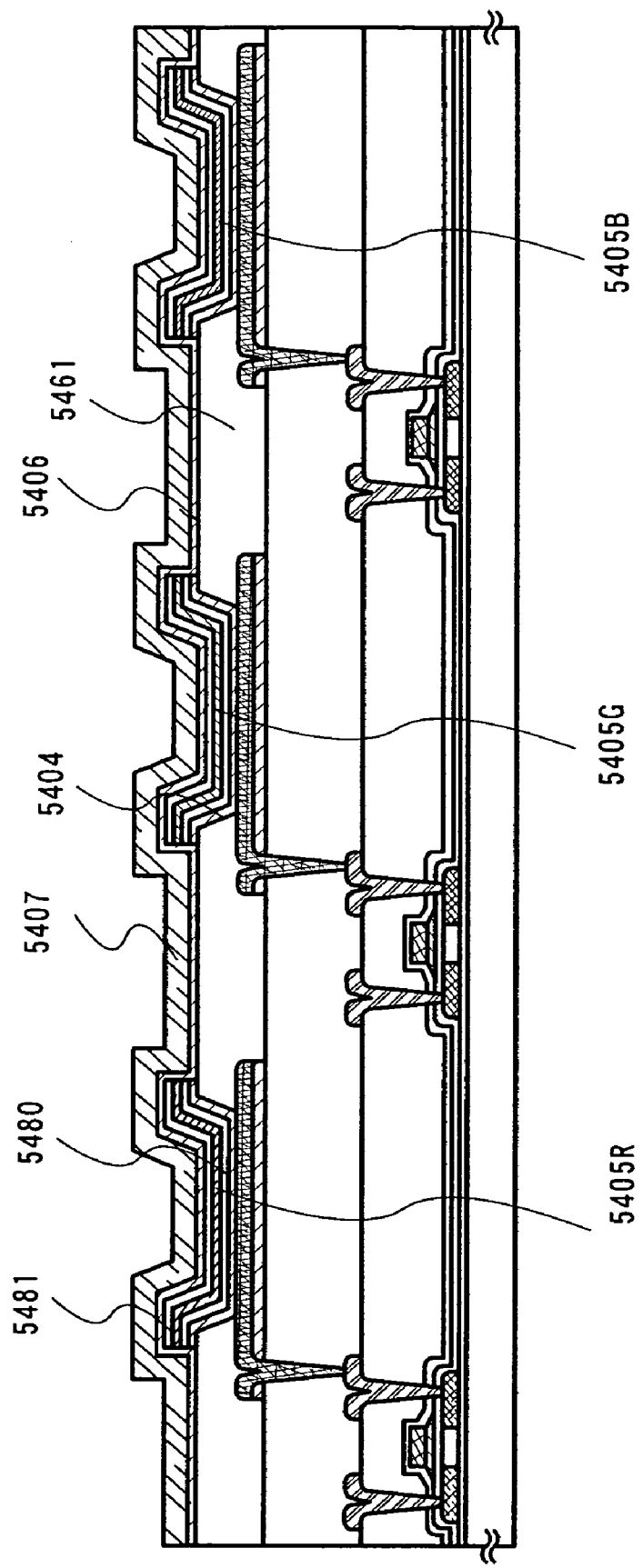
FIG. 32 is a cross-sectional view illustrating a process of manufacturing a top emission EL display device according to a certain aspect of the present invention.

As mentioned above, a light-emitting element is manufactured (see FIG. 32). Each material for an anode, layers containing organic compound (first to fifth layers containing organic compounds) and a cathode, each of which constructs the light-emitting element, is appropriately selected, and each thickness of the foregoing layers is adjusted. It is desired that the anode and the cathode are formed from the same material to have almost the same thickness, preferably, a thin thickness of approximately 100 nm.

For example, the first layer containing an organic compound 5404 is formed by copper phthalocyanine (CuPc) in a thickness of 20 nm, and α-NPD formed in a thickness of 40 nm can be used as the second layer containing an organic compound (hole injecting layer) 5480. After forming the light-emitting layer 5405, $Alq_3$ (tris(8-quinolinolato)aluminum) may be deposited in a thickness of 37.5 nm as the electron transporting layer (the fourth layer) 5481 and MgAg (alloy formed by co-evaporating Mg and Ag at a ratio of 10:1) may be deposited in a thickness of 15 nm as the upper electrode 5407.

If necessary, a transparent protective layer is formed to prevent water from penetrating into the light-emitting element by covering the light-emitting element. A silicon nitride film, a silicon oxide film, or a silicon nitride film containing oxygen (an SiNO film having a composition ratio: N>O or an SiON film having a composition ratio: N<O), a thin film mainly containing carbon (for example, DLC film or a CN film) or the like, each of which can be obtained by a sputtering method or a CVD method, can be used as the transparent protective layer.

A second substrate 5408 is attached to the substrate 400 with a sealing agent containing a gap material for keeping a gap between the substrates. The second substrate 5408 may also be formed by a glass substrate or a quartz substrate, each of which has a light-transmitting property. Further, the gap between a pair of the substrates may be provided with a drying agent as an air gap (an inert gas) or filled with a transparent sealing agent (an ultraviolet curing resin, a thermosetting epoxy resin, or the like).

Figure 33:
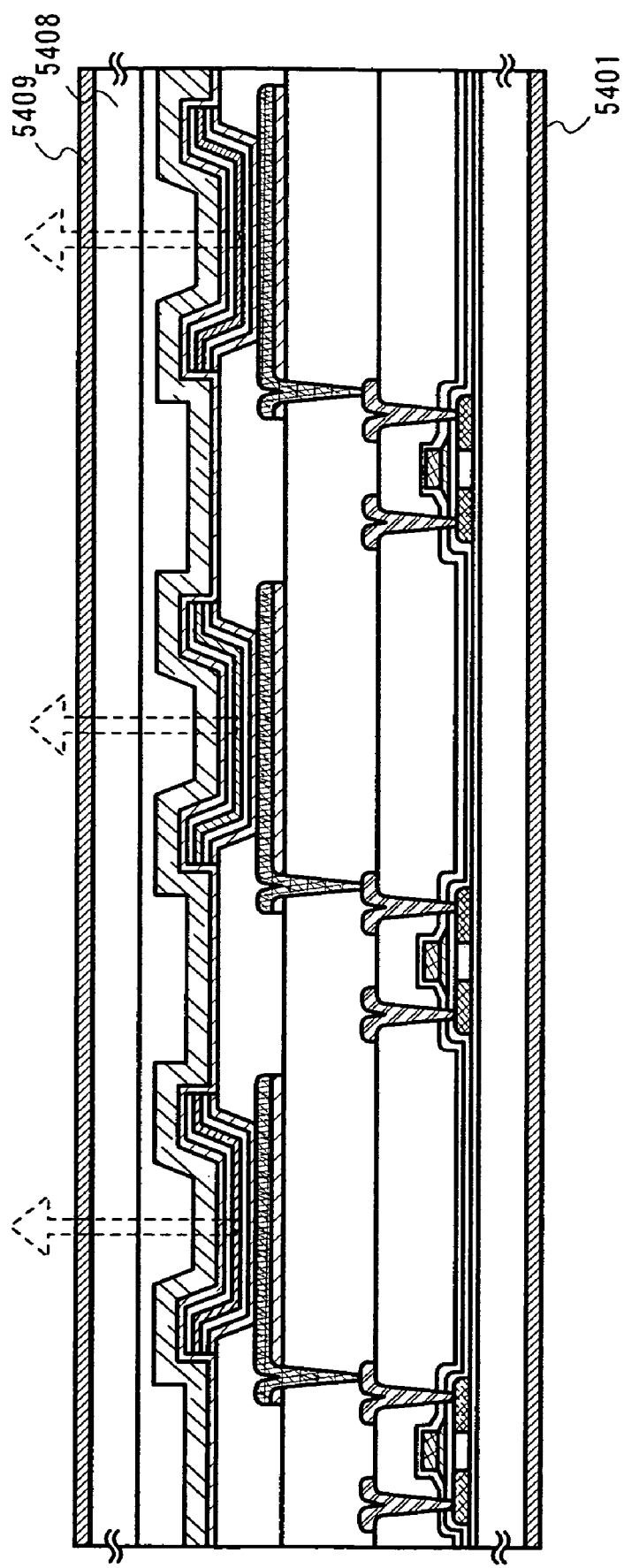
FIG. 33 is a cross-sectional view illustrating a process of manufacturing a top emission EL display device according to a certain aspect of the present invention.

Lastly, optical films 5401 and 5409 (a polarizing plate or a circularly polarizing plate) are provided to improve contrast (see FIG. 33).

In the light-emitting element, the upper electrode 5407 is formed by a transparent material, and light can be emitted in a top direction in one light-emitting element as indicated by the outline arrows in FIG. 33.

Light emitted from a light-emitting element includes light emission radiated in returning to a ground state from a singlet excited state (fluorescence) and light emission radiated in returning to a ground state from a triplet excited state (phosphorescence). In this embodiment, either or both of the light can be used.

This embodiment can be arbitrarily combined with any description of Embodiment Mode, and Embodiments 1, 2, and 4, if necessary.

Embodiment 6

This embodiment describes an example of manufacturing a reflective liquid crystal display device with reference to FIGS. 34A and 34B.

Based on Embodiment 5, processes up to manufacturing a lower electrode 5462 illustrated in FIG. 31B is performed. Through FIGS. 34A and 34B, like components are denoted by like numerals as of Embodiment 5. Components that are especially not described are manufactured by the process performed in Embodiment 5.

In this embodiment, a pixel TFT 6402 (6402R, 6402G, and 6402B) for driving a pixel is an n-channel TFT. A channel formation region, an n-type low-concentration impurity region, and a source or drain region are formed in an island semiconductor film.

When the lower electrode 5462 is formed, an orientation film 6624a is formed to cover a third interlayer insulating film 5422 and the lower electrode 5462. Further, the orientation film 6624a may be formed by a droplet discharging method, a screen printing method, or an offset printing method. Thereafter, rubbing treatment of the surface of the orientation film 6624a is performed.

A color filter formed of a coloring layer 6626 (6626R, 6626G, and 6626B) corresponding to RGB, a light-shielding layer (black matrix) 6630, and an overcoat layer 6627 is provided over an opposite substrate 6625. Further, an opposite electrode 6628 formed by a transparent electrode is formed thereover, and an orientation film 6624b is formed over the opposite electrode 6628. A sealing agent that is a closed pattern is formed by a droplet discharging method so as to surround a region that is overlapped with a pixel portion. Since a liquid crystal is dropped in this instance, an example of drawing a sealing agent of a closed pattern is described. Alternatively, dip method (pumping method) by which a liquid crystal is injected by utilizing a capillary phenomenon after pasting a TFT substrate can be used.

Then, a liquid crystal is dropped to attach both the substrates to each other under reduced pressure in order that bubbles not to be entered. The liquid crystal is dropped within the closed-loop pattern at once or a plurality numbers of times. A TN mode, in other words, the arrangement of liquid crystal molecules is oriented at 90 degrees in the direction of from incident light to outgoing light, is often adopted as an orientation mode of the liquid crystal. In the case of manufacturing a TN mode liquid crystal display device, substrates are attached to each other so that rubbing directions of each of the substrates are at right angles to each other. As mentioned above, a liquid crystal layer 6629 is formed between the orientation films 6624*a* and 6624*b* (see FIG. 34B).

The liquid crystal layer 6629 may be formed by a droplet discharging method described in Embodiment 3.

The substrates may be spaced by dispersing spherical spacers, forming a column-like spacer formed from resin, or mixing filer into sealant. The foregoing column-like spacer is an organic resin material containing at least any one of acrylic, polyimide, polyimide amide, or epoxy; a material of one of silicon oxide, silicon nitride, and silicon oxynitride; or an inorganic material formed by a stacked film formed from the foregoing materials.

Then, the substrates are scribed and broken. In the case of forming multiple panels from one substrate, the substrate is divided into each panel. In the case of forming one panel from one substrate, the scribing and breaking process can be omitted by attaching preliminarily divided opposite substrates onto the substrate.

An FPC is attached onto the panel via an anisotropic conductive layer by a known method. A liquid crystal module is completed according to the foregoing processes. Further, an optical film is attached, if necessary.

As mentioned above, a reflective liquid crystal display device according to this embodiment can be manufactured. The reflective liquid crystal display device manufactured according to this embodiment can be used as a display portion of various electronic apparatus.

In this embodiment, the TFT is a top gate TFT; however, the present invention is not limited thereto. A bottom-gate type reverse-staggered TFT (for example, reverse staggered TFT) can be appropriately used. Further, not only a single gate TFT, but also a multi gate TFT having a plurality of channel formation regions, for example, a double gate TFT can be used.

This embodiment can be arbitrarily combined with any description in Embodiment Mode and Embodiments 1 to 6, if necessary.

Embodiment 7

This embodiment describes an example of manufacturing a CPU (Central Processing Unit) according to the present invention with reference to FIGS. 17A to 17C, FIGS. 18A to 18C, FIGS. 19A to 19C, FIGS. 20A and 20B, and FIG. 21.

Figure 17A:
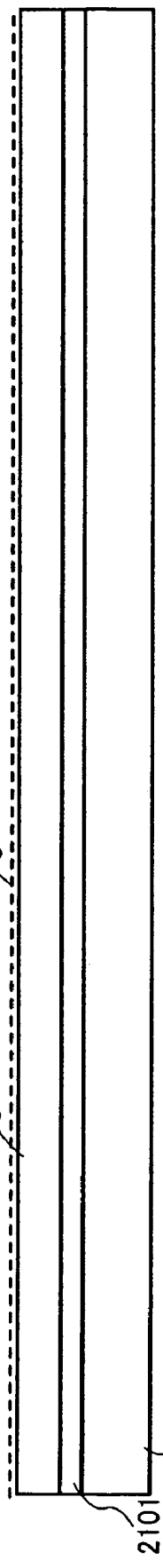
FIGS. 17A to 17C are cross-sectional views each illustrating a process of manufacturing a CPU according to a certain aspect of the present invention.

As shown in FIG. 17A, a base film 2101 is formed over a substrate 2100 having an insulating surface. A glass substrate such as barium borosilicate glass or alumino borosilicate glass, a quartz substrate, a stainless substrate, or the like can be used As the substrate 2100. A substrate formed from plastic typified by PET, PES, and PEN, or a synthesized resin having flexibility such as acrylic generally tends to have lower resistance temperature than that of another substrate. Despite of the foregoing feature, such the plastic or synthesized resin substrate can be used if it can withstand processing temperature in a manufacturing process.

The base film 2101 is provided in order to prevent alkali metal such as Na or alkali earth metal in the substrate 2100 from diffusing in a semiconductor film to adversely affect the characteristics of a semiconductor element. Therefore, the base film is formed by using an insulating film such as silicon oxide, silicon nitride, silicon nitride containing oxygen that can suppress diffusion of the alkali metal or the alkali earth metal. In this embodiment, a silicon nitride film containing oxygen (SiNO) is formed by using a reaction gas of $SiH_4$, $NH_3$, $N_2O$, and $H_2$ in a thickness of 10 nm to 200 nm (50 nm in this embodiment) by a plasma CVD method, and a silicon oxide film containing nitrogen (SiON) is stacked thereon by using a reaction gas of $SiH_4$ and $N_2O$ in a thickness of 50 nm to 200 nm (100 nm in this embodiment) by a plasma CVD method. The base film 2101 may have a single layer. For instance, a silicon nitride film containing oxygen can be formed to have a thickness of 10 nm to 400 nm (preferably, 50 nm to 300 nm) as the base film.

In the case where a substrate somewhat containing alkali metal or alkali earth metal such as a stainless substrate or a plastic substrate is used, a base film is effective in preventing impurities. However, the base film is not always required to be provided in the case where the diffusion of impurities is not problematic, for example, a quartz substrate is used.

An amorphous semiconductor film 2102 is formed over the base film 2101. The amorphous semiconductor film 2102 is formed in a thickness of from 25 nm to 100 nm (preferably, 30 nm to 60 nm). Not only silicon but also silicon germanium can be used as the amorphous semiconductor. In the case of using the silicon germanium, the silicon germanium preferably has density of 0.01 atomic % to 4.5 atomic %. In this embodiment, a semiconductor film containing silicon as its main component (also referred to as amorphous silicon film or amorphous silicon) in a thickness of 66 nm is used.

A metal element is doped to the amorphous semiconductor film 2102. In this embodiment, "dope" refers to forming a metal element over the surface of the amorphous semiconductor film 2102 in order to promote crystallization of the amorphous semiconductor film. It is preferable that a metal element is formed since the amorphous semiconductor film can be crystallized in low temperature.

For instance, Ni solution (including water solution or acetic acid medium) is coated over the amorphous semiconductor film 2102 by a coating method such as a spin coating method or a dipping method to form a film containing Ni 2103 (there is the case where the coated film is too thin to be observed as a film). In order to improve wettability of the surface of the amorphous semiconductor film 2102 and spread the solution allover the surface of the amorphous semiconductor film, an oxide film in a thickness of 1 nm to 5 nm is preferably deposited by UV light irradiation in the presence of oxygen, a thermal oxidization method, and treatment by ozone water containing hydroxyl radical or hydrogen peroxide. Alternatively, Ni ions are injected into the amorphous semiconductor film by an ion injecting method, the amorphous semiconductor film is heated in water vapor atmosphere containing Ni, or a target used as a Ni material is sputtered. In this embodiment, solution containing Ni acetate of 10 ppm is coated by a spin coating method.

Thereafter, the amorphous semiconductor film 2102 is heated at temperatures from 500° to 550° for 2 hours to 20 hours to crystallize the amorphous semiconductor film to be formed into a crystalline semiconductor film. In this instance, heating temperature is preferably gradually varied. By the initial low temperature heating process, hydrogen and the like in the amorphous semiconductor film is released, which leads to perform so-called dehydrogenation that reduces roughness of the film. Alternatively, a magnetic field is applied to the amorphous semiconductor film to be crystallized by also using the magnetic energy, or a high power microwave can be used. In this embodiment, heat treatment is performed by using a vertical furnace at 500° C. for 1 hour, and at 550° C. for 4 hours.

Figure 17B:
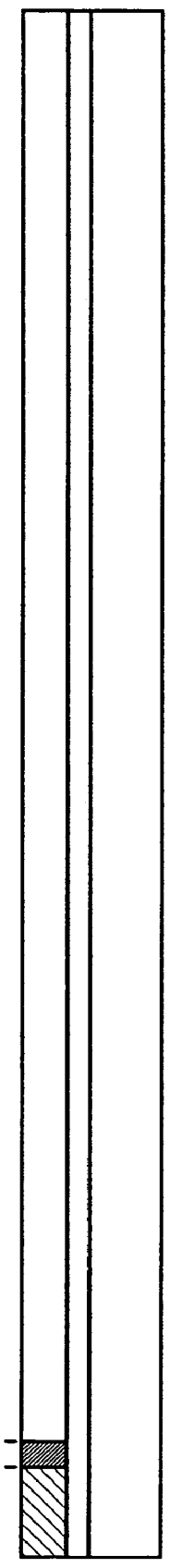

As illustrated in FIG. 17B, the oxide film formed over the surface of the crystalline semiconductor film is etched off by hydrofluoric acid, and the amorphous semiconductor film 2102 that has been crystallized is irradiated with laser light (laser beam) 2105. One kind or more kinds of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti: sapphire laser, a copper vapor laser, and a gold vapor laser can be used as the laser. A continuous wave laser (CW laser) or pulsed laser (pulse laser) can be used. The beam preferably has a linear shape and has a long axis of 200 μm to 350 μm in length. In addition, the laser may have an incident angle θ (0<θ<90°) relative to the semiconductor film.

In this embodiment, a CW laser at 6.4 W is entered into the semiconductor film at an angle of 25° with a long axis of 300 μm to scan at a scanning rate at 40 cm/sec. Then, a region having the width (length in the direction perpendicular to the direction of laser radiation) of 210 μm in the semiconductor film has favorable crystalline growth, and so laser irradiation is preferably performed by overlapping the long axis of 90 μm of the laser beams with each other.

In such laser irradiation, a marker can be formed to overlap laser beams and control the start position or end position of irradiation. The marker may be formed to the substrate simultaneously with the amorphous semiconductor film.

Thereafter, a gettering process is performed to reduce or remove metal elements. A method of trapping metal elements by using the amorphous semiconductor film as a gettering sink is described. Firstly, an oxide film is formed by UV light irradiation in the presence of oxygen, a thermal oxidization method, and treatment by ozone water containing hydroxy radical or hydrogen peroxide. Then, an amorphous semiconductor film is formed in a thickness of 150 nm by a plasma CVD method with a source gas of $SH_4$ and Ar, a pressure of 0.3 Pa, a RF power of 3 KW, and a substrate temperature of 150° C.

Thereafter, metal elements are reduced or removed by heat treatment in the presence of nitrogen at 550° C. for 4 hours. The amorphous semiconductor film and the oxide film used as the gettering sinks are removed by hydrofluoric acid or the like. Accordingly, a crystalline semiconductor film with reduced or removed metal elements can be obtained.

Figure 17C:
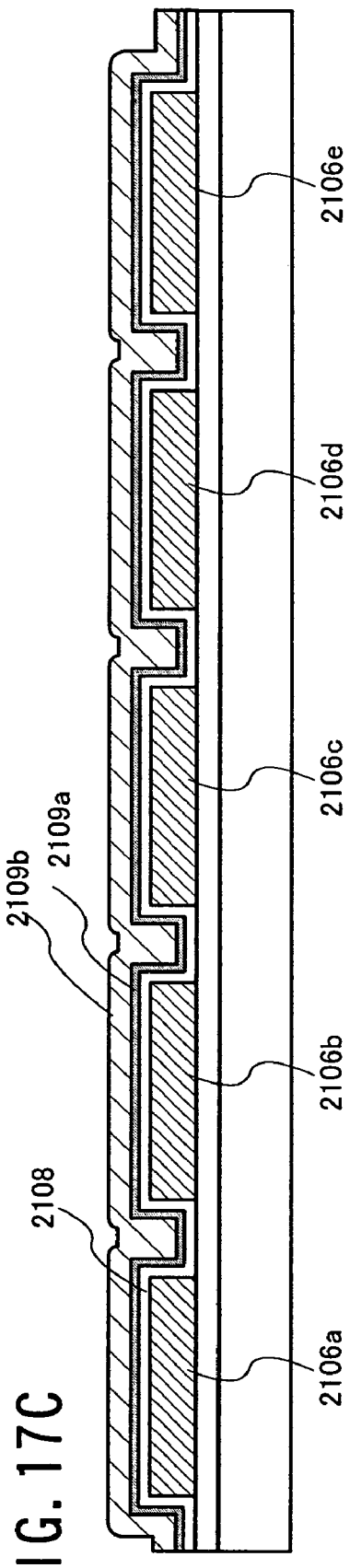

As illustrated in FIG. 17C, the crystalline semiconductor film is patterned into a desired shape to form island semiconductor films 2106a to 2106e. In patterning, photoresist is coated over the crystalline semiconductor film to be exposed into a desired shape and baked. Accordingly, a mask is formed over the crystalline semiconductor film. By using the mask, the crystalline semiconductor film is patterned by a dry etching method. $CF_4$ and $O_2$ can be used as gas used for the dry etching.

Impurities are doped to the crystalline semiconductor film according to need. For instance, boron (B) is doped by a doping method. Accordingly, a threshold value that is an electric characteristic of a thin film transistor can be made come further close to zero. In other words, the crystalline semiconductor film can be formed to be a further intrinsic state.

Thereafter, an insulating film, a so-called gate insulating film 2108, is formed so as to cover the crystalline semiconductor films 2106a to 2106e. Before forming the gate insulating film 2108, the surface of the island semiconductor film is washed by hydrofluoric acid or the like. The gate insulating film 2108 is formed by an insulating film containing silicon that is formed by a plasma CVD method or a sputtering method in a thickness of 10 nm to 150 nm, preferably, 20 nm to 40 nm. In this embodiment, a silicon oxide film containing nitrogen in a thickness of 20 nm is formed by a plasma CVD method using a source gas of $SiH_4$ and $N_2O$ at temperature in a deposition chamber of 400° C. At this time, a deposition rate is lowered since the thickness of the gate insulating film becomes thin. As a result, a film having poor membrane quality deposited early in a deposition process can be reduced. Needless to say, the gate insulating film is not limited to a silicon oxide film containing nitrogen. Another insulating film containing silicon can be used in a single layer or a lamination layer.

Thereafter, conductive films 2109a and 2109b serving as a gate electrode 2109 are formed over the crystalline semiconductor film through the gate insulating film 2108. Needless to say, the gate electrode 2109 is either a single layer or a lamination layer. The conductive films 2109a and 2109b may be formed by an element selected from Ta, W, Ti, Mo, and Al; or an alloy material or a compound material containing the foregoing element as its main component. In this embodiment, a tantalum nitride film is formed in a thickness of from 10 nm to 50 nm, for example, 30 nm so as to cover the gate insulating film 2108 as the first conductive film 2109a, and a tungsten film is formed in a thickness of from 200 nm to 400 nm, for example, 370 nm as the second conductive film 2109b.

Figure 18A:
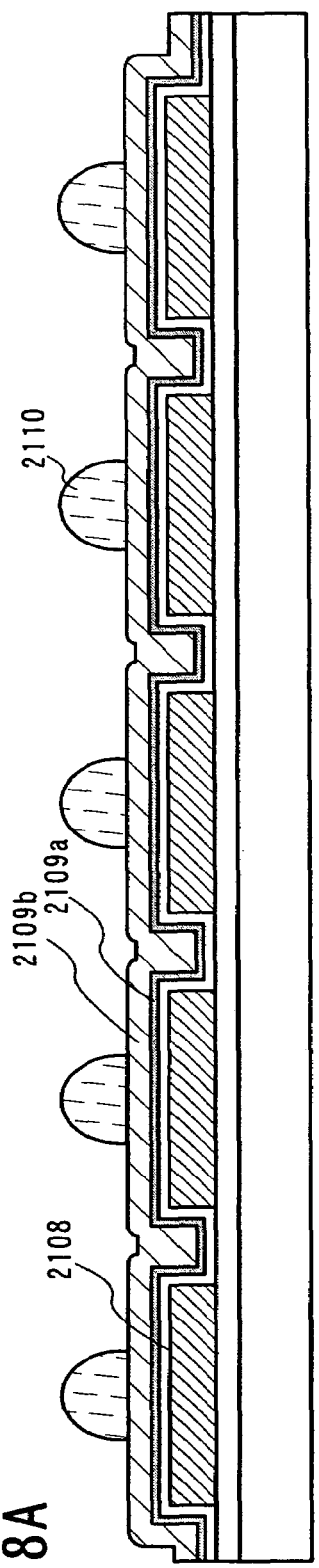
FIGS. 18A to 18C are cross-sectional views each illustrating a process of manufacturing a CPU according to a certain aspect of the present invention.

As illustrated in FIG. 18A, the first conductive film 2109a and the second conductive film 2109b are etched by using a mask. Firstly, photoresist is coated over the conductive film by a spin coating method.

Then, heat treatment of the coated photoresist, so-called prebaking, is performed. The heating temperature at the prebaking is set 50° C. to 120° C. that is lower than that in post-baking performed afterwards. In this embodiment, the prebaking is performed at heating temperature of 90° C. for heating times of 90 sec.

Thereafter, the exposed photoresist is developed by dropping developing solution to the photoresist or spraying developing solution from a spray nozzle and heat treatment is performed. In this embodiment, NMD-3 is used as the developing solution and the time for developing is 60 sec.

In this embodiment, heat treatment of the developed photoresist, so-called post-baking, is performed at 125° C. for 180 sccm. As a result, moisture and the like can be removed, and simultaneously, stability against heat can be improved. Accordingly, a resist mask 2110 having a tapered shaped edge is formed over the conductive film. The edge of the resist mask may have a tapered shape, and the shape of the resist mask may be a sector form or a trapezoid shape.

By controlling a resist shape by attaching a pattern below the threshold of exposure resolution, a resist mask having an edge in a tapered shape can be formed. The resist mask has an edge in a tapered shape, and so a reaction product that adheres to the side of the resist mask can be prevented from producing.

Figure 18B:
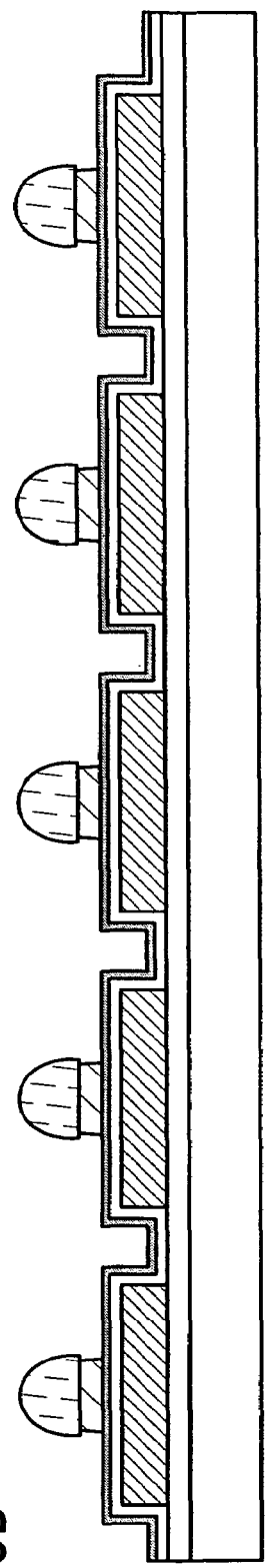

As illustrated in FIG. 18B, the second conductive film 2109b is etched by using the resist mask 2110. In this embodiment, the second conductive film 2109b is etched by a dry etching method using $CF_4$, Cl, and $O_2$ as gas. As in the case of the resist mask 2110, the conductive film 2109a is formed to have an edge in a tapered shape. The first conductive film 2109a serves as an etching stopper to prevent the gate insulating film or the semiconductor film from being etched.

The etched second conductive film 2109b has a gate length 113 in a range of 0.2 μm to 1.0 Km, in which case the resist mask 2110 may be recessed to several μn. In this embodiment, the second conductive film is formed to have a gate length of 0.8 μm by recessing the resist mask 2110 to 0.4 μm.

Figure 18C:
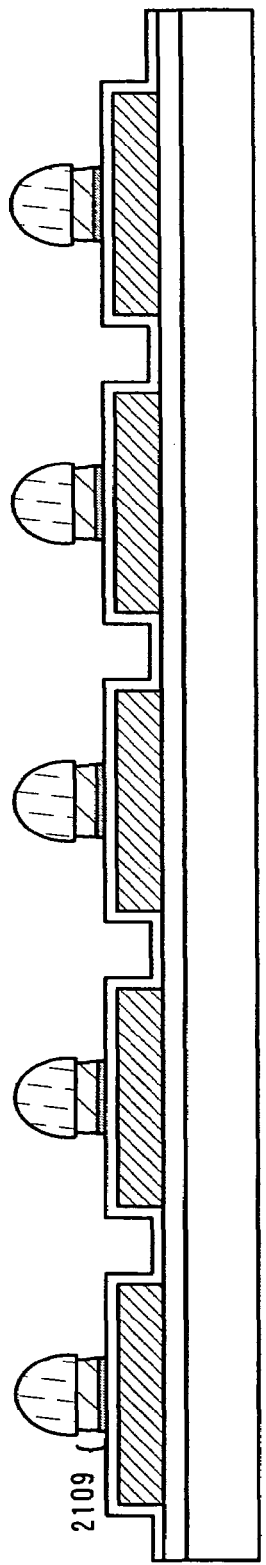

As illustrated in FIG. 18C, the first conductive film 2109a is etched in the state that the resist mask 2110 is provided, in which case the first conductive film 2109a is etched under a condition that has high selective ratio of the gate insulating film 2108 to the first conductive film 2109a. In this embodiment, the first conductive film 2109a is etched by using Cl$_2$ as gas. Accordingly, the first conductive film 2109a can be etched while maintaining the gate insulating film 2108 of a thin film state. According to the process, the resist mask 2110 and the second conductive film 2109b may be etched in some extent to be thinner. As mentioned above, a gate electrode 2109 having an extreme short gate length of 1.0 μm or less is formed.

Figure 19A:
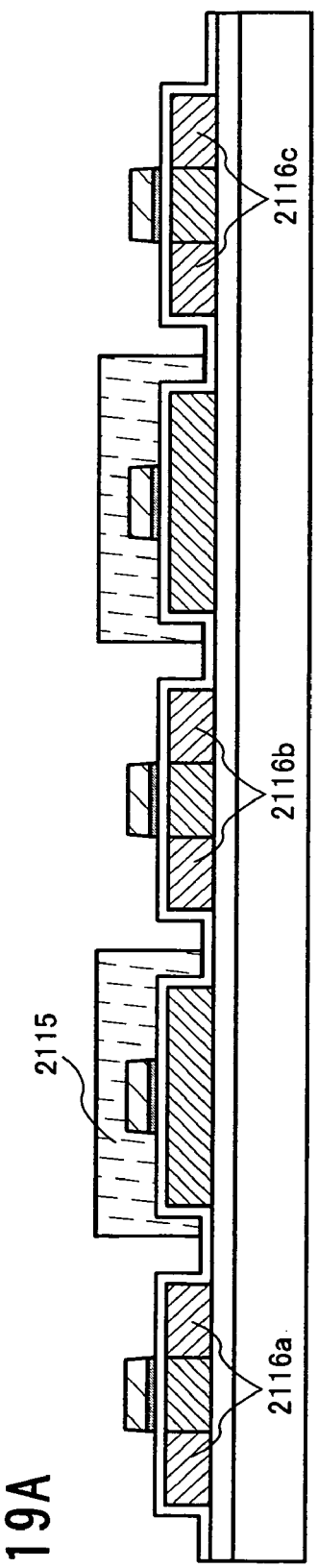
FIGS. 19A to 19C are cross-sectional views each illustrating a process of manufacturing a CPU according to a certain aspect of the present invention.

Thereafter, the resist mask 2110 is removed by O$_2$ ashing or by using stripping solution of resist to form a resist mask 2115 for doping impurities. As illustrated in FIG. 19A, the resist mask 2115 is formed in a region to be a p-channel TFT. A method for manufacturing the resist mask can be referred to the above description and is not further described.

Phosphorous (P) that is an impurity element is doped in a self alignment manner to a region to be an n-channel TFT using the gate electrode 2109 as a mask. In this embodiment, phosphine (PH$_3$) is doped at 60 keV to 80 keV. Accordingly, impurity regions 2116a to 2116c are formed in a region to be an n-channel TFT, in which case phosphorous (P) is doped so as to be uniform in a depth direction to the semiconductor film. However, the impurity region may be formed to be overlapped with the gate electrode 2109 since the impurities are round behind the gate electrode 2109a in doping. The length in a channel length direction of the impurity region is set from 0.1 μm to 0.3 μm.

Figure 19B:
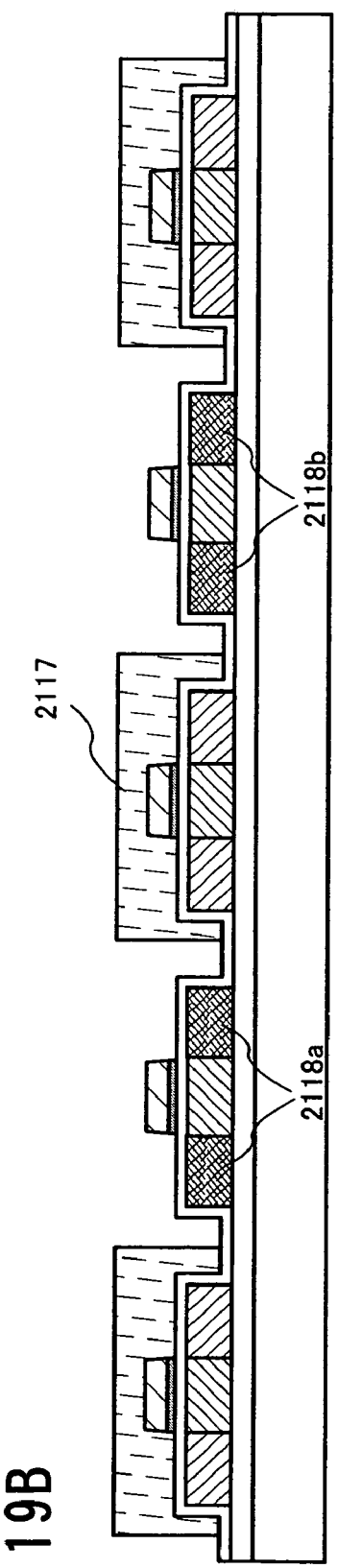
Figure 19C:
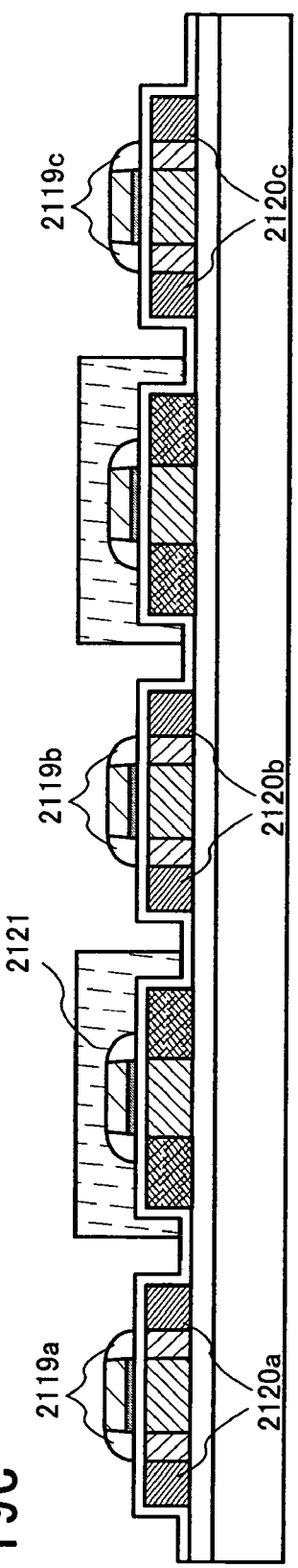

As illustrated in FIG. 19B, a resist mask 2117 is formed in a region to be an n-channel TFT. Thereafter, boron (B) that is an impurity element is doped in a self alignment manner to a region to be a p-channel TFT using the gate electrode 2109 as a mask. In this embodiment, B$_2$H$_6$ is doped at 30 keV to 45 keV. Accordingly, impurity regions 2118a to 2118b are formed in a region to be a p-channel TFT. Then, the resist mask 2117 is removed by O$_2$ ashing or by using resist stripping solution As illustrated in FIG. 19C, an insulating film, so-called, side walls 2119a to 2119c, are formed to cover the side of the gate electrode. The side walls can be formed by an insulating film containing silicon by a plasma CVD method or a low pressure CVD (LPCVD) method. In this embodiment, a silicon nitride oxide film, so called, silicon oxide film containing nitrogen (SiON) is formed by a low pressure CVD (LPCVD) method using a source gas of SiH$_4$ and N$_2$O at a pressure of 266 Pa at a temperature of 400° C. In the case where the side walls are formed by a plasma CVD method, a silicon oxide film containing nitrogen (SiON) can be formed by using a source gas of SiH$_4$ and N$_2$O at a pressure of 133 Pa. Thereafter, the side walls having a tapered shape can be formed by etching the silicon oxide film containing nitrogen (SiON).

The followings are etching conditions used in the case of forming the side walls by a low pressure CVD (LPCVD) method. As a first etching condition, CHF$_3$ and He are used as a source gas, and plasma is produced for several sec, for example, 3 sec, in which case an electrode that is opposed to a substrate provided to a deposition device is set 475 W and an electrode provided with the substrate is provided to 300 W. Voltage applied to the electrode provided with the substrate can accelerate the ion of an etching gas. As a second etching condition, CHF$_3$ and He are used as a source gas, and voltage is applied for several ten sec, for example, 60 sec. The etching time can be determined so that etching is finished when the thickness of the film being etched reaches a desired value (in this embodiment, 100 nm), in which case an electrode that is opposed to a substrate provided to a deposition device is set 475 W and an electrode provided with the substrate is provided to 300 W. As a third etching condition, CHF$_3$ and He are used as a source gas, and voltage is applied for several ten sec, for example, 31 sec after the moment when it seems that the film being etched is almost etched off, in which case an electrode that is opposed to a substrate provided to a deposition device is set 50 W and an electrode provided with the substrate is provided to 450 W.

The followings are etching conditions for forming the side walls by using a plasma CVD method. As a first etching condition, CHF$_3$ and He are used as a source gas, and plasma is produced for several sec, for example, 3 sec, in which case an electrode that is opposed to a substrate provided to a deposition device is set 475 W and an electrode provided with the substrate is provided to 300 W. As a second etching condition, CHF$_3$ and He are used as a source gas, and voltage is applied for several ten sec, for example, 50 sec. The etching time can be determined so that etching is finished when the thickness of the film being etched becomes 100 nm, in which case an electrode that is opposed to a substrate provided to a deposition device is set 900 W and an electrode provided with the substrate is provided to 150 W. As a third etching condition, CHF$_3$ and He are used as a source gas, and voltage is applied for several ten sec, for example, 30 sec after the moment when it seems that the film being etched is almost etched off, in which case an electrode that is opposed to a substrate provided to a deposition device is set 50 W and an electrode provided with the substrate is provided to 300 W.

The edge of the side wall manufactured as mentioned above is not required to have a tapered shape, but preferably have a rectangular shape. When the edge of the side wall is formed in a rectangular shape, the concentration of an impurity that is subsequently doped can be prevented from having concentration gradient below the side wall.

By using the side walls 2119a to 2119c, high-concentration impurity regions 2120a to 2120c are formed in the impurity region of the n-channel TFT. In other words, the high-concentration impurity regions 2120a to 2120c are formed in a self alignment manner by using the side walls 2119a to 2119c as masks, in which case a resist mask 2121 is formed over the p-channel TFT. In this embodiment, phosphine (PH$_3$) is doped at 15 keV to 25 keV to form a high-concentration impurity region, that is, a source region and a drain region. Thereafter, the resist mask 2121 is removed by O$_2$ ashing or by resist stripping solution.

Heat treatment is performed to activate the impurity region. In this embodiment, the impurity region is heated at 550° C. in the presence of nitrogen.

As illustrated in FIG. 20A, a first insulating film 2122 is formed to cover the gate insulating film 2108 and the gate electrode 2109. The first insulating film is preferably an insulating film having nitrogen. In this embodiment, a silicon nitride film is formed in a thickness of 100 nm by a plasma CVD method.

Thereafter, heat treatment is performed for hydrogenation. In this embodiment, heat treatment at 410° C. for 1 hour is performed. As a result, a dangling bond in the silicon oxide film or silicon film can be terminated by hydrogen released from the silicon nitride film.

A second insulating film 2123 is formed to cover the first insulating film 2122. The second insulating film 2123 can be formed by an inorganic material (silicon oxide, silicon nitride, silicon oxide containing nitrogen, and the like) or an organic material (polyimide, acrylic, polyamide, polyimide amide, benzocyclobutene, or a resist). As the organic material, a positive type photosensitive organic resin or negative type photosensitive organic resin can be used. In the case of using a positive type photosensitive organic resin as the organic material, an opening portion is formed to have an upper edge portion with a curvature can be formed by etching the photosensitive organic resin by exposure treatment in a process of photolithography.

An insulating film using siloxane and a lamination structure thereof can be used as the second insulating film 2123.

Siloxane is composed of a skeleton formed by the bond of silicon (Si) and oxygen (O), in which an organic group containing at least hydrogen (such as an alkyl group or aromatic hydrocarbon) is included as a substituent. Alternatively, a fluoro group may be used as the substituent. Further alternatively, a fluoro group and an organic group containing at least hydrogen may be used as the substituent.

In this embodiment, a silicon nitride oxide film is formed as the second insulating film 2123 in a thickness of 600 nm by a plasma CVD using $SiH_4$ and $N_2O$ as a source gas, in which case the substrate temperature is heated to 300° C. to 400° C., in this embodiment, 400° C.

A conductive material film (cap film) 2200 is formed to cover the second insulating film 2123. In this embodiment, a titanium film is formed in a thickness of 100 nm by a sputtering method. Refractory metal such as tantalum (Ta) or tungsten (W); a nitride of the foregoing refractory metal such as titanium nitride (TiN) or tantalum nitride (TaN); or the like can be used as the conductive material film 2200.

A contact hole is formed in the interlayer insulating film by using a sixth mask. The contact hole is formed by a dry etching method. Carbon tetrafluoride ($CF_4$), oxygen ($O_2$), helium (He) are used as an etching gas at each flow rate of 50 sccm, 50 sccm, and 30 sccm.

As illustrated in FIG. 20B, wirings 2125a to 2125e are provided to the gate insulating film 2108, the first insulating film 2122, and the second insulating film 2123 through contact holes. Simultaneously, a wiring connecting to a gate electrode is formed, in which case the contact holes are preferably formed to be perpendicular to the first insulating film 2122, and the second insulating film 2123 since the contact holes are formed to have approximately 1.0 μm in diameter. Therefore, the edge of the resist is purposely formed not to have a tapered shape. When selective ratio between the resist and the insulating film provided to the contact holes is high, the edge of the resist can be formed to have a tapered shape. Since a silicon nitride oxide film is used as the second insulating film 2123 in this embodiment, the contact holes are formed by a dry etching method using a resist mask that is formed to have a vertical edge, in other words, purposely not to have a tapered portion, in which case the actual resist edge may have a tapered shape. Etching is performed by using $CHF_3$ and He as an etching gas for several sec, for example, 3 sec as a first etching time, for 100 to 130 sec, for example, 117 sec as a second etching time, and for 200 to 270 sec, for example, 256 sec as a third etching time, in which case flow amount of an etching gas can be determined depending on the etching condition of the contact holes.

In the case where the second insulating film 2123 is formed by an insulating film formed from an organic material or siloxane, a mask having higher hardness than that of the resist mask, for example, a hard mask made from an inorganic material such as a silicon oxide film is preferably used since the contact holes have vertical sides.

The resist mask is removed by $O_2$ ashing or by using stripping solution of the resist.

The wirings 2125a to 2125e are formed in the contact holes. The wirings may be formed by films formed from aluminum (Al), titanium (Ti), molybdenum (Mo), tungsten (W), or silicon (Si); or alloy films made from the foregoing elements. In this embodiment, wirings, in other words, a source electrode and a drain electrode are formed by stacking a titanium (Ti) film, a titanium nitride (TiN) film, a titanium-aluminum alloy (Al—Si) film, and a titanium (Ti) film in each thicknesses of 60 nm, 40 nm, 300 nm, and 100 nm, to be patterned and etched in desired shapes.

The wirings 2125a to 2125e may be formed by an aluminum alloy film containing one kind of element of nickel, cobalt, and iron; and carbon. Such the aluminum alloy film can prevent counter diffusion of silicon and aluminum even if the aluminum alloy film is in contact with the silicon. In addition, such the aluminum alloy film does not give rise to oxidation-reduction reaction when being in contact with a transparent conducive film such as an ITO (Indium Tin Oxide) film, accordingly, the aluminum alloy film and the ITO film can be directly contact with each other. Further, such the aluminum alloy film has low specific resistance and high heat resistance, and so the aluminum alloy film is useful as a wiring material.

As mentioned above, an n-channel type thin film transistor that has an LDD structure that is formed to have a low-concentration impurity region, and that has a gate length of 1.0 μm or less. Further, a p-channel type thin film transistor that has a so-called single drain structure that is formed not to have a low-concentration impurity region, and that has a gate length of 1.0 μm or less. The TFT having a gate length of 1.0 μm or less can be referred to as a submicron TFT. The p-channel type thin film transistor can be formed to have a single drain structure since the p-channel type thin film transistor is hardly deteriorated due to hot carrier or has hardly short channel effects.

In the present invention, the p-channel type thin film transistor may be formed to have an LDD structure. In the n-channel type thin film transistor and the p-channel type thin film transistor, a so-called GOLD structure in which a low-concentration impurity region is overlapped with a gate electrode may be formed instead of the LDD structure.

A semiconductor apparatus, a CPU in this embodiment having a thin film transistor formed as mentioned above can be manufactured. High speed operation at driving voltage of 5 V and operation frequency of 30 MHz can be realized.

Further, the structure of the CPU according to this embodiment is described by using a block diagram.

Figure 21:
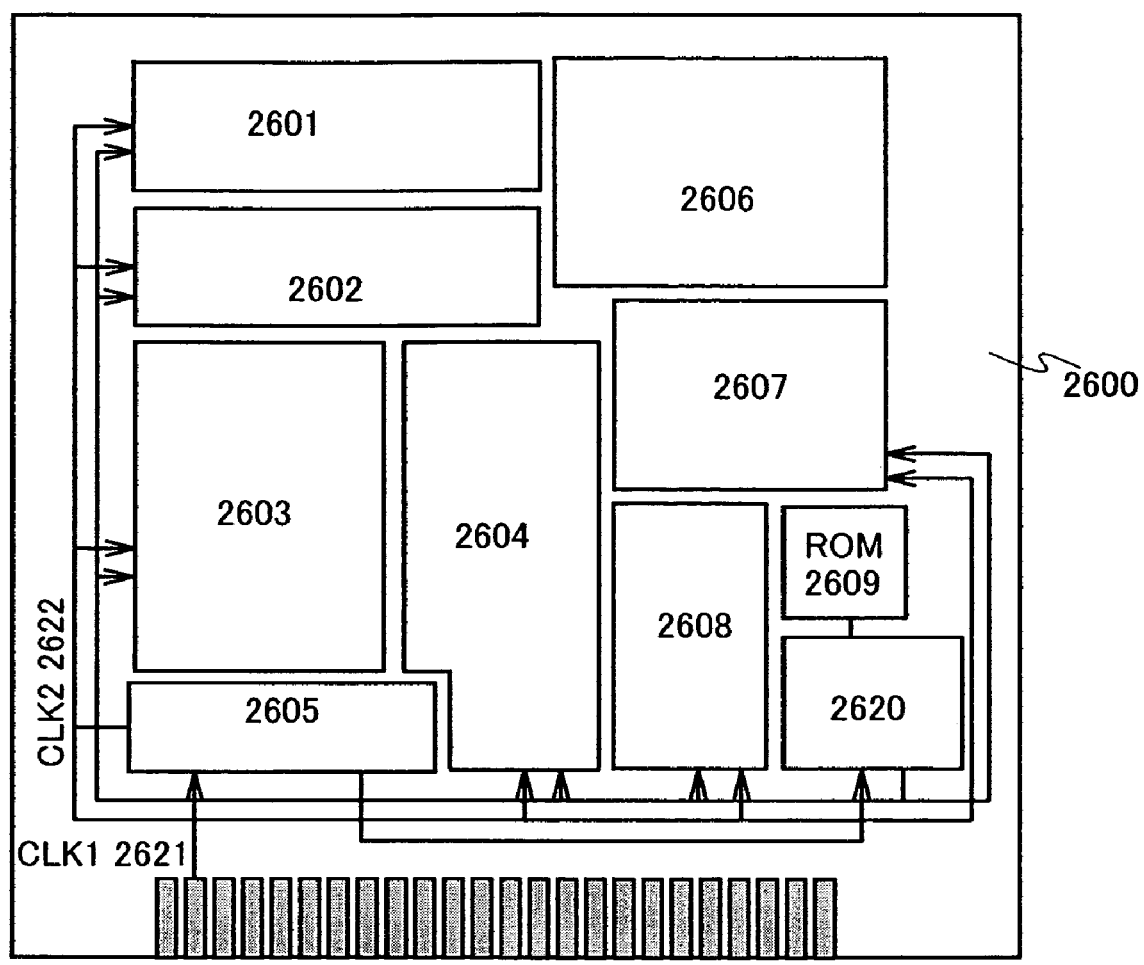
FIG. 21 is a top view of a CPU according to a certain aspect of the present invention.

A CPU illustrated in FIG. 21 mainly includes an arithmetic circuit (ALU: Arithmetic Logic Unit) 2601, a control unit for an arithmetic circuit (ALU controller) 2602, an instruction decoder 2603, and an interrupt controller 2604, a timing controller 2605, a register 2606, a register controller 2607, a bus interface (bus I/F) 2608, a rewritable ROM 2609, and a ROM interface (ROM I/F) 2620 over a substrate 2600. Further, the rewritable ROM 2609 and the ROM interface (ROM I/F) 2620 may be provided over another chip.

The CPU illustrated in FIG. 21 is illustrative only of a simplified configuration of the CPU. Accordingly, actual CPUs may have various structures depending on the usage.

An instruction input into the CPU via the bus interface 2608 is input to the instruction decoder 2603 to be decoded, and input into the control unit for an arithmetic circuit 2602, the interrupt controller 2604, the register controller 2607, and the timing controller 605.

The various kinds of control are performed by the control unit for an arithmetic circuit 2602, the interrupt controller 2604, the register controller 2607, and the timing controller 2605 based on decoded instructions. Specifically, the control unit for an arithmetic circuit 2602 generates a signal for controlling the operation of the arithmetic circuit 2601. The interrupt controller 2604 evaluates the interrupt request from a peripheral circuit and an external input-output device based on the priority or the mask condition during program execution of the CPU to handle the request. The register controller 2607 generates an address of the register 2606, and performs reading and writing in accordance with the state of the CPU.

The timing controller 2605 generates signals for controlling the timing of the operation of the arithmetic circuit 2601, the control unit for an arithmetic circuit 2602, the instruction decoder 2603, the interrupt controller 2604, and the register controller 2607. For example, the timing controller 2605 has an internal clock generation unit where an internal clock signal CLK2 (2622) is generated from base clock CLK1 (2621), and the clock signal CLK2 is supplied to the above various circuits.

As described in Embodiment 1, the present invention can prevent variation of a semiconductor element having a fine structure. With respect to a semiconductor apparatus requiring a fine structure such as a CPU described in this embodiment, reliability of whole of the semiconductor elements is improved, which leads to improve reliability of the semiconductor apparatus itself. Therefore, the present invention has an advantageous effect.

This embodiment can be arbitrarily combined with any description in Embodiment Mode, and Embodiments 1 to 6.

Embodiment 8

This embodiment describes in detail an example of applying the present invention to a method for manufacturing an ID chip. Further, in this embodiment, an example of an electrically isolated TFT is described as a semiconductor element; however, a semiconductor element used for an integrated circuit is not limited thereto, and any kind of circuit elements can be used. For example, a recording element, a diode, a photoelectric conversion element, a resistance element, a coil, a capacitor element, or an inductor can be typically given, in addition to a TFT.

Further, an ID chip indicates an integrated circuit utilized to identify an object, and information for identification is recorded in the ID chip. An ID chip can transmit or/and receive information with a control system or a reading device by a radio wave or an electromagnetic wave. A production area, an expiration date, distribution channel, or the like of an object to which an ID chip is attached can be found by information which an ID chip has. In addition, in the case of applying to a medical and chemical field, safe can be managed by attaching an ID chip to a medicine or a patient.

Figure 22A:
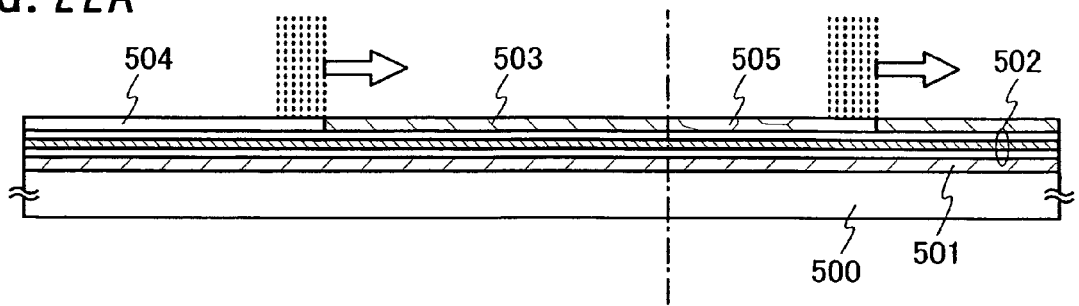
FIGS. 22A to 22E are cross-sectional views each illustrating a process of manufacturing an ID chip according to a certain aspect of the present invention.

As illustrated in FIG. 22A, a stripping layer 501 is formed over a heat-resistant substrate (first substrate) 500 by a sputtering method. A glass substrate such as barium borosilicate glass or alumino borosilicate glass, a quartz substrate, a ceramic substrate, or the like can be used as the first substrate 500. In addition, a metal substrate including a stainless steel substrate or a semiconductor substrate with an insulating film formed over its surface may be used. Although a flexible substrate such as a plastic substrate which is formed from a synthetic resin such as plastic is generally inferior to the above substrates in the heat resistance, the flexible substrate can be used when the substrate can resist the heat temperature in the manufacturing process.

The stripping layer 501 can be formed of a layer containing silicon such as amorphous silicon, poly-crystalline silicon, single-crystal silicon, or microcrystal silicon (including semi-amorphous silicon) as a main component. The stripping layer 501 can be formed by a sputtering method, a low pressure CVD method, a plasma CVD method, or the like. In this embodiment, the stripping layer 501 is formed of the amorphous silicon in approximately 50 nm thick by a low pressure CVD method. The material of the stripping layer 501 is not limited to silicon, and a material that can be selectively etched off may be used. It is preferable that the stripping layer 501 has the thickness from 50 nm to 60 nm. When the stripping layer 501 is formed of the semi-amorphous silicon, it may be formed in a thickness from 30 nm to 50 nm.

Next, a base film 502 is formed over the stripping layer 501. The base film 502 is provided in order to prevent alkali-earth metal or alkali metal such as Na in the first substrate 500 from diffusing into the semiconductor film. The alkali-earth metal and the alkali metal have an adverse effect on the characteristic of a semiconductor element such as a TFT when they are in the semiconductor. Another purpose for providing the base film 502 is to protect the semiconductor element in the following process of stripping the semiconductor element. The base film 502 may be a single insulating film or may include a plurality of insulating films. Accordingly, the base film 502 is formed of an insulating material such as silicon oxide, silicon nitride, or silicon nitride containing oxygen which can suppress the diffusion of the alkali-earth metal or the alkali metal into the semiconductor film.

In this embodiment, the base film 502 is formed by sequentially stacking a SiON film having a thickness of 100 nm, a SINO film having a thickness of 50 nm, and a SiON film having a thickness of 100 nm. However, the material, the thickness, and the number of the stacked films are not limited to the above description. For example, a siloxane-based resin having a thickness from 0.5 µm to 3 µm may be formed by a spin coating method, a slit coating method, a droplet discharging method, or the like instead of the SiON film, which is the bottom layer. A silicon nitride film ($SiN_x$, $Si_3N_4$, or the like) may be used instead of the SiNO film, which is the middle layer. A $SiO_2$ film may be used instead of the SiON film, which is the top layer. The thickness of each film is desirably in the range of 0.05 tm to 3 µm, and the thickness may be selected arbitrarily from this range.

Alternatively, the bottom layer of the base film 502, which is closest to the stripping layer 501, may be formed of the SiON film or the $SiO_2$ film, the middle layer may be formed of a siloxane-based resin, and the top layer may be formed of the $SiO_2$ film.

The silicon oxide film can be formed by a method of thermal CVD, plasma CVD, normal-pressure CVD, bias ECRCVD, or the like while using a mixed gas of $SiH_4$ and $O_2$ or a mixed gas of TEOS (tetraethoxysilane), $O_2$, and the like. The silicon nitride film can be formed by a plasma CVD method while using a mixed gas of $SiH_4$ and $NH_3$ typically. The silicon oxide film containing nitrogen ($SiO_xN_y$: x>y) and the silicon nitride film containing oxygen ($SiN_xO_y$: x>y) can be formed by a plasma CVD method while using a mixed gas of $SiH_4$ and $N_2O$ typically.

Next, a semiconductor film 503 is formed over the base film 502. It is desirable to form the semiconductor film 503 without being exposed to the air after forming the base film 502. The semiconductor film may have the thickness from 20 nm to 200 nm (desirably from 40 nm to 170 nm, preferably from 50 nm to 150 nm). The semiconductor film 503 may be an amorphous semiconductor, a semi-amorphous semiconductor, or a poly-crystalline semiconductor. The semiconductor can be silicon or may be silicon germanium. In the case of using silicon germanium, the concentration of germanium is preferably approximately 0.01 atomic % to 4.5 atomic %.

The amorphous semiconductor can be obtained by glow-discharging to decompose a silicide gas. $SiH_4$, $Si_2H_6$, or the like is given as a typical silicide gas. This silicide gas may be diluted with hydrogen or with hydrogen and helium.

Then, as illustrated in FIG. 22A, the semiconductor film 503 is crystallized using a laser. Alternatively, the laser crystallization method using the laser may be combined with a crystallization method using a catalyst element.

Before the laser crystallization, it is desirable to perform thermal annealing to the semiconductor film for 1 hour at 500° C. in order to increase the resistance of the semiconductor film against the laser. Then, the semiconductor film is irradiated with the laser beam having second to fourth harmonics of the fundamental wave by using a continuous wave solid-state laser. Thus, a crystal having large grain sizes can be obtained. For example, typically, it is preferable to use the second harmonic (532 nm) or the third harmonic (355 nm) of a Nd: $YVO_4$ laser (fundamental wave of 1064 nm). Specifically, the laser beam emitted from the continuous wave $YVO_4$ laser is converted into the harmonic having an output power of 10 W by a nonlinear optical element. It is preferable to shape the laser beam into a rectangle or an ellipse on an irradiated surface through an optical system and irradiate the semiconductor film. The laser beam is required to have the energy density from approximately 0.01 $MW/cm^2$ to 100 $MW/cm^2$ (preferably from 0.1 $MW/cm^2$ to 10 $MW/cm^2$). The scanning speed is set in the range of approximately 10 cm/s to 2000 cm/s, and then, the semiconductor film is irradiated with the laser beam.

The laser may be a known continuous wave gas laser or solid-state laser. There is an Ar laser, a Kr laser, or the like as the gas laser. A YAG laser, a $YVO_4$ laser, a YLF laser, a $YAlO_3$ laser, a $Y_2O_3$ laser, a glass laser, a ruby laser, an alexandrite laser, a Ti: Sapphire laser, or the like can be given as an example of the solid-state laser.

In addition, a pulsed laser beam may be employed to perform laser crystallization. In this case, the repetition frequency is set to 10 MHz or more. This repetition frequency is extremely higher than that of the pulsed laser beam used usually, which is from several ten Hz to several hundred Hz. It is said that it takes several ten nanoseconds to several hundred nanoseconds to solidify the semiconductor film completely after the semiconductor film is irradiated with the pulsed laser beam. Thus, it is possible to irradiate the semiconductor film with the pulsed laser beam in the period between melting the semiconductor film by the previous pulsed laser beam and solidifying the semiconductor film by using the above repletion frequency. Therefore, since the interface between the solid phase and the liquid phase can be moved continuously in the semiconductor film, the semiconductor film having a crystal grain grown continuously toward the scanning direction is formed. Specifically, it is possible to form an aggregation of crystal grains each of which has a width from 10 µm to 30 µm in the scanning direction and a width from approximately 1 µm to 5 µm in a direction perpendicular to the scanning direction. It is also possible to form a semiconductor film having almost no crystal grain boundaries at least in the channel length direction of the TFT by forming a crystal grain of a single crystal extending long in the scanning direction.

Further, the semiconductor film may be irradiated with the laser beam in the presence of an inert gas such as a rare gas or nitrogen. Accordingly, roughness of the surface of the semiconductor can be suppressed by an irradiation of the laser beam, and variation of a threshold value generated by variation of interface state density can be suppressed.

A semiconductor film with higher crystallinity is formed by the above laser irradiation to a semiconductor film. The semiconductor film includes a first region 504 formed by a center region of the beam spot and a second region 505 formed by a region adjacent to an edge of the beam spot, each of which has different crystallinity. The first region 504 includes a crystal grain having a width from 10 µm to 30 µm in the scanning direction and a width from approximately 1 µm to 5 µm in a direction perpendicular to the scanning direction. On the other hand, the second region 505 has microcrystal grains having grain sizes approximately from 0.2 µm to several µm whose positions and sizes are at random.

Figure 22B:
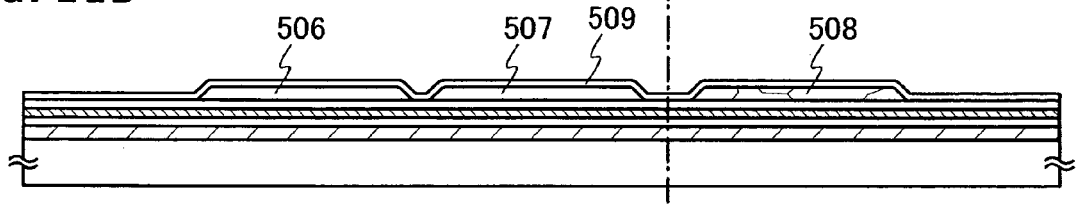

Next, as illustrated in FIG. 22B, the first region 504 and the second region 505 in the crystallized semiconductor film are patterned so that the first region 504 becomes island-shaped semiconductor films 506 and 507 and that the second region 505 becomes an island-shaped semiconductor film 508. Then, a gate insulating film 509 is formed so as to cover the island-shaped semiconductor films 506 to 508. The gate insulating film 509 may be a single layer or a multilayer formed by including silicon nitride, silicon oxide, silicon oxide containing nitrogen, or silicon nitride containing oxygen by a plasma CVD method, a sputtering method, or the like. In the case of the multilayer, for example, the gate insulating film 509 is preferably formed by sequentially stacking a silicon oxide film, a silicon nitride film, and a silicon oxide film over the substrate side.

After forming the gate insulating film 509, heat treatment may be performed in the presence of hydrogen by 3% to 100% at a temperature from 300° C. to 450° C. for 1 hour to 12 hours in order to hydrogenate the island-shaped semiconductor films 506 to 508. As another means for the hydrogenation, plasma hydrogenation (using hydrogen that is excited by plasma) may be performed. In the hydrogenation process, a dangling bond can be terminated by using the thermally excited hydrogen. After attaching the semiconductor element to a flexible second substrate in the following process, a defect may be formed in the semiconductor film by bending the second substrate. However, even in this case, the defect can be terminated by the hydrogen in the semiconductor film when the concentration of hydrogen in the semiconductor film is $1\times10^{19}$ $atoms/cm^3$ to $1\times10^{22}$ $atoms/cm^3$, preferably $1\times10^{19}$ $atoms/cm^3$ to $5\times10^{20}$ $atoms/cm^3$ by the hydrogenation. Further, in order to terminate the defect, halogen may be added in the semiconductor film.

Figure 22C:
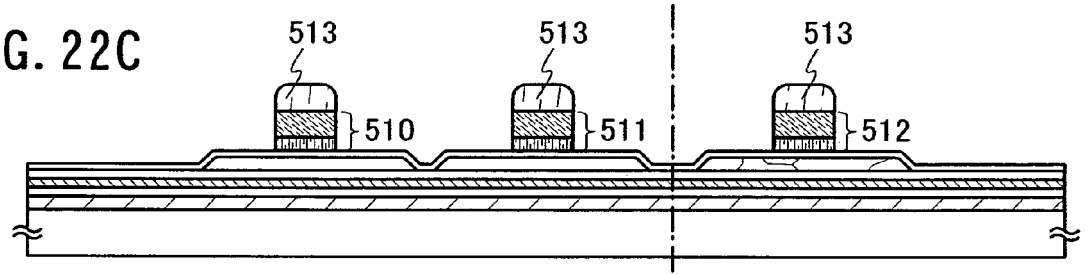

Next, as illustrated in FIG. 22C, gate electrodes 510 to 512 are formed. In this embodiment, the gate electrodes 510 to 512 are multilayer of Si and W which are formed by a sputtering method and then etched by using a resist 513 as a mask. The material, the structure, and the manufacturing method of the gate electrodes 510 to 512 are not limited to the above, and may be selected appropriately. For example, the gate electrodes 510 to 512 may be a multilayer including NiSi (nickel silicide) and Si (silicon) in which impurities imparting n-type are doped or a multilayer including TaN (tantalum nitride) and W (tungsten). Further, the gate electrodes 510 to 512 may be a single layer formed of various kinds of conductive materials.

Instead of the resist mask, a mask formed of $SiO_x$, or the like may be used. In this case, an additional process is performed to form the mask (referred to as a hard mask) formed of $SiO_x$, SiON, or the like by patterning. However, loss in thickness of the mask is fewer during etching than the case of the resist mask, the gate electrodes 510 to 512 having the desired width can be formed. Alternatively, the gate electrodes 510 to 512 may be formed selectively by a droplet discharging method without using the resist 513.

The conductive material can be selected from various materials in accordance with the function of the conductive film. When the gate electrode is formed simultaneously with the antenna, the materials may be selected in consideration of their functions.

Although a mixed gas of $CF_4$, $Cl_2$ and $O_2$ or a gas of $Cl_2$ is used as an etching gas for forming the gate electrodes by etching, the etching gas is not limited thereto.

Figure 22D:
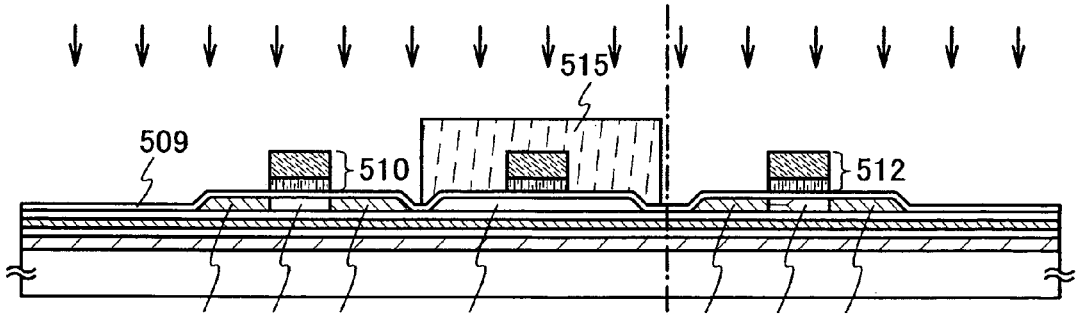

Next, as illustrated in FIG. 22D, the island-shaped semiconductor film 507 to be a p-channel TFT is covered by a resist 515, and an impurity element imparting n-type conductivity (typically, P (phosphorus) or As (arsenic)) is doped to the island-shaped semiconductor films 506 and 508 to form a low-concentration region by using the gate electrodes 510 and 512 as masks (a first doping process). The first doping process is performed under the condition where the dose amounts range from $1\times10^{13}/cm^2$ to $6\times10^{13}/cm^2$ and the accelerating voltages range from 50 keV to 70 keV. However, the condition of the first doping process is not limited thereto. In the first doping process, the doping is performed through the gate insulating film 509, and pairs of low-concentration impurity regions 516 and 517 are formed in the island-shaped semiconductor films 506 and 508. Further, the first doping process may be performed without covering the island-shaped semiconductor film 507 to be the p-channel TFT by the resist.

Figure 22E:
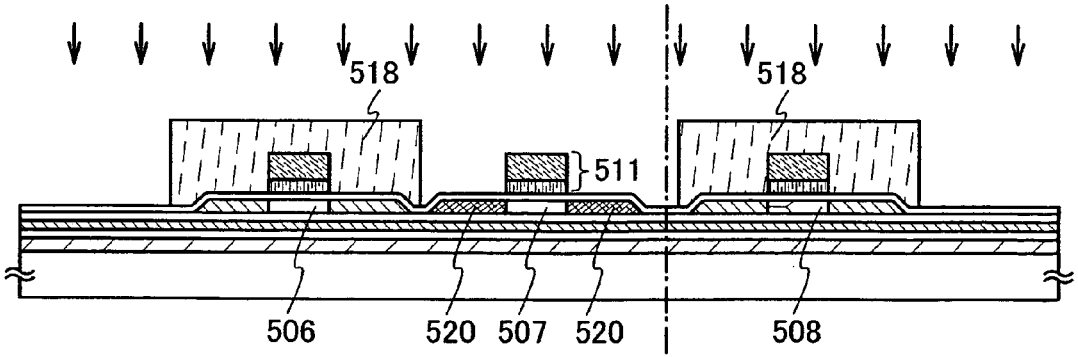

Next, as illustrated in FIG. 22E, after removing the resist 515 by ashing or the like, a resist 518 is newly formed so as to cover the island-shaped semiconductor films 506 and 508 to be n-channel TFTs. Then, an impurity element imparting p-type conductivity (typically, B (boron)) is doped to the island-shaped semiconductor film 507 to form a high-concentration region by using the gate electrode 511 as a mask (a second doping process). The second doping process is performed under the condition where the dose amounts range from $1\times10^{16}/cm^2$ to $3\times10^{16}/cm^2$ and the accelerating voltages range from 20 keV to 40 keV. In the second doping process, the doping is performed through the gate insulating film 509, and a pair of p-type high-concentration impurity regions 520 is formed in the island-shaped semiconductor film 507.

Figure 23A:
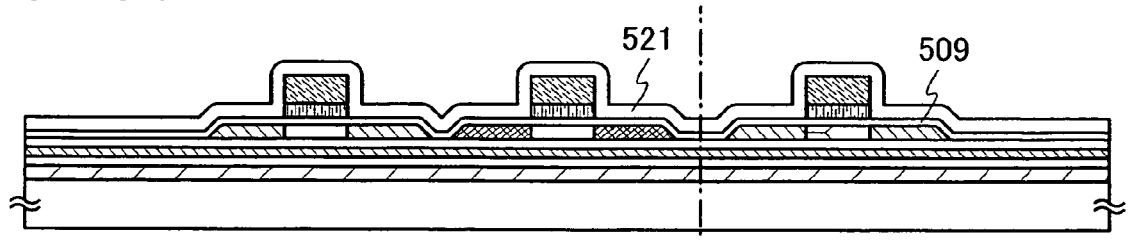
FIGS. 23A to 23C are cross-sectional views each illustrating a process of manufacturing an ID chip according to a certain aspect of the present invention.
Figure 23B:
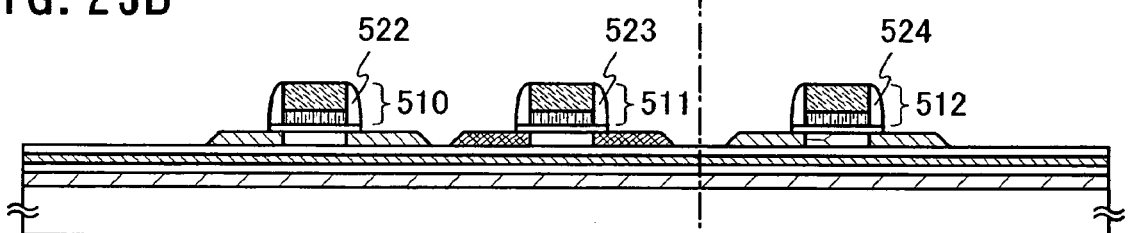

Next, as illustrated in FIG. 23A, after removing the resist 518 by ashing or the like, an insulating film 521 is formed so as to cover the gate insulating film 509 and the gate electrodes 510 to 512. In this embodiment, the insulating film 521 is formed of a $SiO_2$ film in 100 nm thick by a plasma CVD method. After that, the insulating film 521 and the gate insulating film 509 are partially etched by an etch-back method to form sidewalls 522 to 524 to be in contact with the sides of the gate electrodes 510 to 512 in a self-aligned manner as illustrated in FIG. 23B. A mixed gas of $CHF_3$ and He is used as the etching gas. Further, the process of forming the sidewall is not limited thereto.

When the insulating film 521 is formed, the insulating film 521 may be also formed at the rear surface of the substrate. In this case, the insulating film formed at the rear surface of the substrate may be selectively etched off by using a resist. Alternatively, when forming the sidewall in the etch back method, the resist which is used may be partially removed simultaneously with the insulating film 521 and the gate insulating film 509.

Figure 23C:
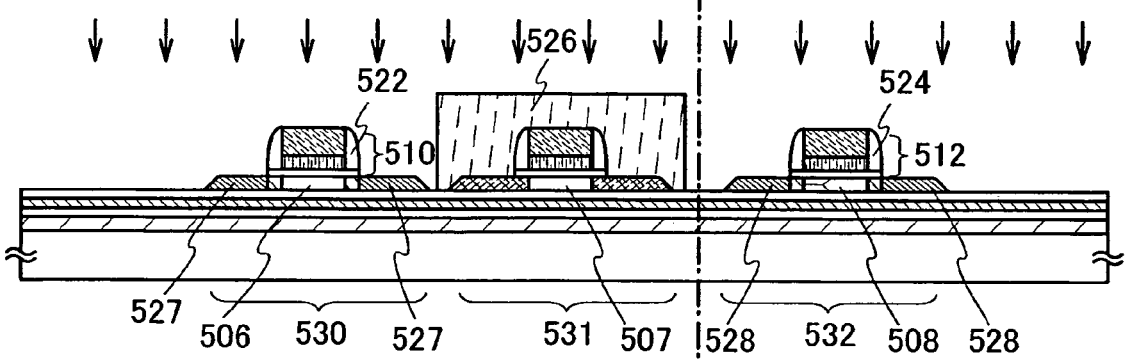

Next, as illustrated in FIG. 23C, a resist 526 is newly formed so as to cover the island-shaped semiconductor film 507 to be the p-channel TFT. Then, impurities imparting n-type conductivity (typically, phosphorus (P) or arsenic (As)) are doped to form a high-concentration region by using the gate electrodes 510 and 512 and the sidewalls 522 and 524 as masks (a third doping process). The third doping process is performed under the condition where the dose amounts range from $1\times10^{13}/cm^2$ to $5\times10^{15}/cm^2$ and the accelerating voltages range from 60 keV to 100 keV. In the third doping process, the doping is performed through the gate insulating film 509, and pairs of n-type high-concentration impurity regions 527 and 528 are formed in the island-shaped semiconductor films 506 and 508.

Further, the sidewalls 522 and 524 is to serve as the masks when, subsequently, high-concentration impurities imparting n-type conductivity is doped and a low-concentration impurity region or non-doped off-set region is formed below the sidewalls 522 and 524. Therefore, in order to control the width of the low-concentration impurity region or the off-set region, the size of the sidewalls may be adjusted by appropriately changing the condition of the film formation condition and the etch-back method for forming the sidewall.

After removing the resist 526 by ashing or the like, thermal activation of the impurity region may be performed. For example, after depositing a SiON film in 50 nm thick, heat treatment may be performed for 4 hours in the presence of nitrogen at 550° C. After a $SiN_x$ film including hydrogen is formed in 100 nm thick, heat treatment is performed thereto for 1 hour in the presence of nitrogen at 410° C. Accordingly, a defect in the poly-crystalline semiconductor film can be restored. This treatment is, for example, to terminate the dangling bond in the poly-crystalline semiconductor film and is referred to as a hydrogenation process or the like.

According to a series of the foregoing processes, an n-channel TFT 530, a p-channel TFT 531 and an n-channel TFT 532 are formed. When the size of the sidewall is adjusted by changing the condition of the etch-back method appropriately in these manufacturing processes, a TFT having the channel length from 0.2 μm to 2 μm can be formed. Although the TFTs 530 to 532 have a top-gate structure in this embodiment, they may have a bottom-gate structure (reverse stagger structure).

After that, a passivation film may be formed to protect the TFTs 530 to 532. It is desirable that the passivation film is formed of silicon nitride, silicon nitride including oxygen, aluminum nitride, aluminum oxide, silicon oxide, or the like which can prevent the penetration of alkali metal or alkali-earth metal into the TFTs 530 to 532. Specifically, for example, a SiON film having a thickness of approximately 600 nm can be used as the passivation film. In this case, the hydrogenation process may be performed after forming the SiON film. In this manner, the passivation film includes three layers of SiON¥$SiN_x$¥SiON which are formed sequentially from the substrate side over the TFTs 530 to 532. However, the structure and the materials of these films are not limited to the above description. With the above structure, since the TFTs 530 to 532 are covered by the base film 502 and the passivation film, it is possible to prevent the alkali-earth metal or the alkali metal such as Na, which has an adverse effect on the characteristic of the semiconductor element when it is in the semiconductor, from diffusing into the semiconductor film used for the semiconductor element.

Figure 24A:
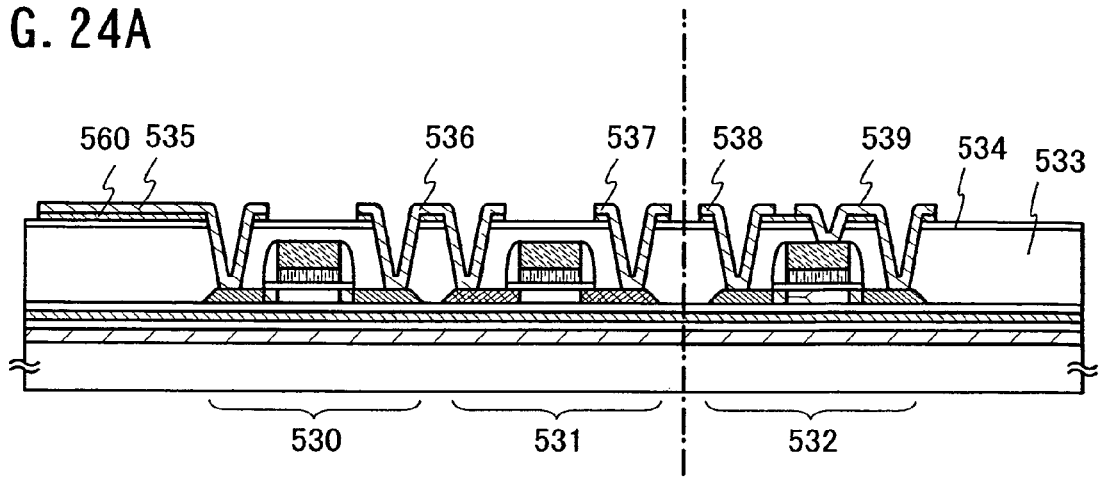
FIGS. 24A to 24C are cross-sectional views each illustrating a process of manufacturing an ID chip according to a certain aspect of the present invention.

Next, as illustrated in FIG. 24A, a first interlayer insulating film 533 is formed to cover the TFTs 530 to 532. The first interlayer insulating film 533 can be formed of an organic resin having heat resistance such as polyimide, acrylic, or polyamide. Besides, a low dielectric constant material (low-k material), a resin including a Si—O—Si bond (hereinafter, referred to as a siloxane-based resin), or the like can be used. The siloxane-based resin may include an organic group at least containing hydrogen (for example, an alkyl group or aromatic hydrocarbon), a fluoro group, or an organic group at least containing hydrogen and a fluoro group as a substituent. The first interlayer insulating film 533 can be formed by a spin coating method, a dipping method, a spray coating method, a droplet discharging method (an ink-jet method, a screen printing method, an offset printing method, or the like), a doctor knife method, a roller coating method, a curtain coating method, a knife coating method, or the like can be applied depending on the material. In addition, an organic material may be used, and in this case, silicon oxide, silicon nitride, silicon oxynitride, PSG (phosphorous glass), BPSG (phosphorous boron glass), an alumina film, or the like can be used. Further, the first interlayer insulating film 533 may be formed by stacking the above insulating films.

In this embodiment, a second interlayer insulating film 534 is formed over the first interlayer insulating film 533. The second interlayer insulating film 534 can be formed of a film including carbon such as DLC (diamond-like carbon) or CN (carbon nitride), silicon oxide, silicon nitride, or silicon nitride containing oxygen by a plasma CVD method, an atmospheric-pressure plasma CVD method, or the like. In addition, the second interlayer insulating film 534 may be formed of a photosensitive or non-photosensitive organic material such as polyimide, acrylic, polyamide, benzocyclobutene, or a resist, a siloxane-based resin, or the like may be used.

A filler may be mixed into the first interlayer insulating film 533 or the second interlayer insulating film 534 in order to prevent the first interlayer insulating film 533 and the second interlayer insulating film 534 from stripping and damaging due to the stress caused by the difference of the coefficient of thermal expansion between the conductive material for constituting the wiring to be formed afterward and the first interlayer insulating film 533 or the second interlayer insulating film 534.

A first conductive material film 560 is formed over the second interlayer insulating film 534. A refractory metal such as titanium (Ti), tantalum (Ta), or tungsten (W), or nitride thereof may be used as the first conductive material film 560. In the case of forming a contact hole by dry etching afterward, charge-up damage can be suppressed by forming the conductive material film 560.

Next, as illustrated in FIG. 24A, contact holes are formed through the first interlayer insulating film 533, the second interlayer insulating film 534, the gate insulating film 509, and the conductive material film 560. Then, wirings 535 to 539 are formed to be connected to the TFTs 530 to 532 through the contact holes. Although a mixed gas of carbon tetrafluoride ($CF_4$), oxygen ($O_2$), and helium (He) is used for the etching gas for forming the contact holes, a mixed gas of $CHF_3$ and He may be used, and the etching gas is not limited thereto. In this embodiment, the wirings 535 to 539 are patterned after being formed by a sputtering method to include five layers formed by sequentially stacking Ti, TiN, Al—Si, Ti, and TiN from the substrate side.

By mixing Si into Al, it is possible to prevent a hillock in baking the resist during pattern of the wirings. Cu may be mixed by approximately 0.5% instead of Si. When an Al—Si layer is sandwiched by Ti or TiN, the resistance against the hillock is improved further. It is desirable to use the above hard mask formed of SiON or the like in patterning. The material and the manufacturing method of the wirings are not limited to the above, and the above material used for the gate electrode may be used.

The wirings 535 and 536 are connected to the high-concentration impurity region 527 of the n-channel TFT 530, the wirings 536 and 537 are connected to the high-concentration impurity region 520 of the p-channel TFT 531, and the wirings 538 and 539 are connected to the high-concentration impurity region 528 of the n-channel TFT 532, respectively. The wiring 539 is also connected to the gate electrode 512 of the n-channel TFT 532. The n-channel TFT 532 can be used as the memory element of the random ROM.

Figure 24B:
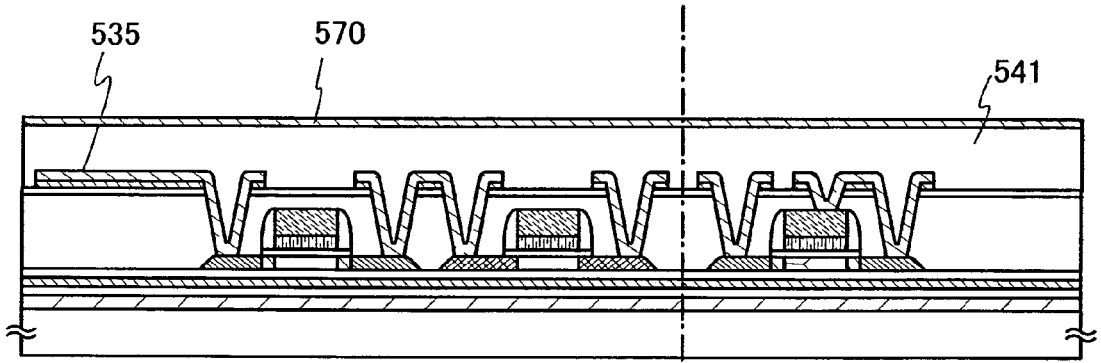

Next, as illustrated in FIG. 24B, a third interlayer insulating film 541 is formed over the second interlayer insulating film 534 so as to cover the wirings 535 to 539. The third interlayer insulating film 541 is formed in such a way that it has a contact hole so that the wiring 535 is partially exposed. The third interlayer insulating film 541 can be formed using a material used for the first interlayer insulating film 533.

A second conductive material film 570. is deposited over the third interlayer insulating film 541. The second conductive material film 570 may be formed by a material used for the first conductive material film 560. A contact hole is formed in the third interlayer insulating film 541 by dry etching so as to reach the wiring 535.

Next, a third conductive material film is formed over the second conductive material film 570, and an antenna 542 is formed by patterning. The antenna 542 can be formed of a conductive material having one or a plurality of metals or metal compounds of Ag, Au, Cu, Pd, Cr, Mo, Ti, Ta, W. Al, Fe, Co, Zn, Sn, or Ni. At this time, the second conductive material film 570 may also be patterned to be part of the antenna 542. In addition, the antenna 542 may be formed only of the third conductive material film by removing the second conductive material film 570 by wet etching.

Figure 24C:
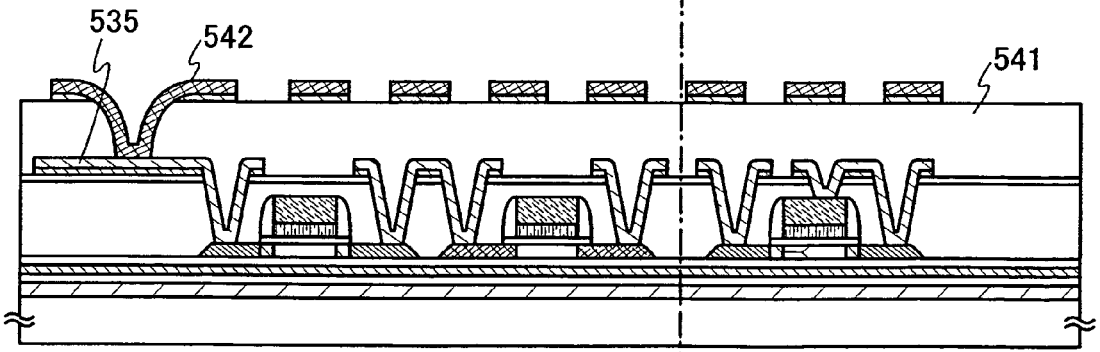

The antenna 542 is connected to the wiring 535. Although the antenna 542 is directly connected to the wiring 535 in FIG. 24C, the ID chip of the present invention is not limited to this constitution. For example, the antenna 542 may be electrically connected to the wiring 535 by using a wiring separately formed.

The antenna 542 can be formed by a printing method, a photolithography method, a vapor deposition method, a droplet discharging method, or the like. In this embodiment, the antenna 542 is formed of a single conductive film. However, the antenna 542 can be formed by stacking a plurality of conductive films. For example, the antenna 542 may be formed of a wiring such as Ni coated with Cu by electroless plating.

A droplet discharging method is a method for forming a predetermined pattern by discharging a droplet including a predetermined composition from a small nozzle. An ink-jet method is given as an example of a droplet discharging method. On the other hand, a printing method includes the screen printing method, the offset printing method, and the like. When the printing method or the droplet discharging method is employed, the antenna 542 can be formed without using a mask for an exposure. In addition, the droplet discharging method and the printing method do not waste a material which is removed by etching in the photolithography method. Further, since an expensive mask for the exposure is not required to use, the cost spent on manufacturing the ID chip can be reduced.

In the case of using a droplet discharging method or various printing methods, for example, a conductive particle or the like obtained by coating Cu with Ag can be used. When the antenna 542 is formed by a droplet discharging method, it is desirable to perform treatment for improving the adhesiveness of the antenna 542 to a surface of the third interlayer insulating film 541.

Several methods to improve the adhesiveness are given as follows: one is that a metal or a metal compound that can improve the adhesiveness to a conductive film or an insulating film due to the catalyst action is attached to the surface of the third interlayer insulting film 541; another is that an organic-based insulating film, metal, or metal compound having high adhesiveness to a conductive film or an insulating film is attached to the surface of the third interlayer insulating film 541; and further another is that a plasma treatment is performed to the surface of the third interlayer insulating film 541 under the atmospheric pressure or reduced pressure so that the surface thereof is modified. Sc, Ti, V, Cr, Mn, Fe, Co, Ni, Cu, or Zn which is a 3d transition element, or the like in addition to titanium or titanium oxide is given as an example of the metal having high adhesiveness to the conductive film or the insulating film. Oxide, nitride, oxynitride, or the like of the above-mentioned metal is given as an example of the metal compound. For example, polyimide, a siloxane-based resin, or the like is given as an example of the organic-based insulating film.

When the metal or the metal compound attached to the third interlayer insulating film 541 is conductive, the sheet resistance is controlled so that the antenna 542 can operate normally. Specifically, the average thickness of the conductive metal or metal compound may be in the range of from 1 nm to 10 nm. In addition, the metal or the metal compound may be insulated partially or totally by oxidization. Furthermore, the metal or the metal compound attached to the region in which the adhesiveness is not required may be removed selectively by etching. The metal or the metal compound may be attached selectively only to a particular region by a droplet discharging method, a printing method, or a sol-gel method instead of etching the metal or the metal compound after attaching the metal or the metal compound all over the substrate. The metal or the metal compound does not need to be in a state of completely continuous film over the surface of the third interlayer insulating film 541 but may be dispersed to some extent.

Figure 25A:
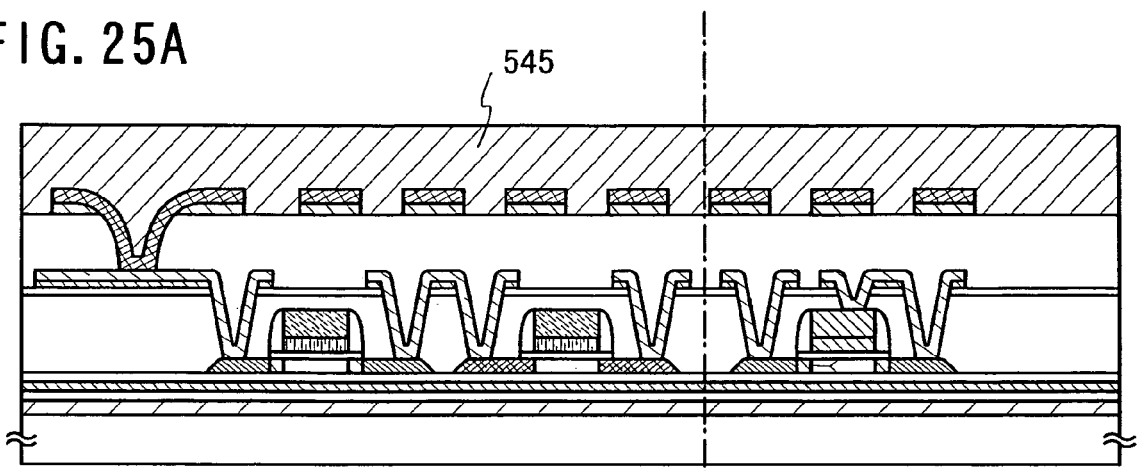
FIGS. 25A to 25C are cross-sectional views each illustrating a process of manufacturing an ID chip according to a certain aspect of the present invention.

Then, as illustrated in FIG. 25A, after forming the antenna 542, a protective layer 545 is formed over the third interlayer insulating film 541 so as to cover the antenna 542. The protective layer 545 is formed of the material that can protect the antenna 542 when the stripping layer 501 is etched off afterward. For example, the protective layer 545 can be formed by entirely coating an epoxy-based resin, an acrylate-based resin, or a silicon-based resin soluble in water or alcohol.

In this embodiment, the protective layer 545 is formed in such a way that a water-soluble resin (VL-WSHL10 manufactured by Toagosei Co., Ltd) is coated in 30 μm thick by a spin coating method to be exposed for 2 minutes in order to cure the resin tentatively, and then the backside of the substrate is irradiated with UV light for 2.5 minutes, then, the topside of the substrate is irradiated with UV light for 10 minutes, totally, 12.5 minutes, in order to cure the resin completely. In the case where a plurality of organic resins is stacked, the adhesiveness may become too high or the organic resins may melt partially depending on the solvent during being coated or baked. Therefore, when the third interlayer insulating film 541 and the protective layer 545 are formed of the organic resins that can be dissolved in the same solvent, it is preferable to form an inorganic insulating film (a $SiN_x$ film, a $SiN_xO_y$ film, an $AlN_x$ film, or an $AlN_xO_y$ film) over the third interlayer insulating film 541 so that the protective layer 545 can be removed smoothly in the following process.

Figure 25B:
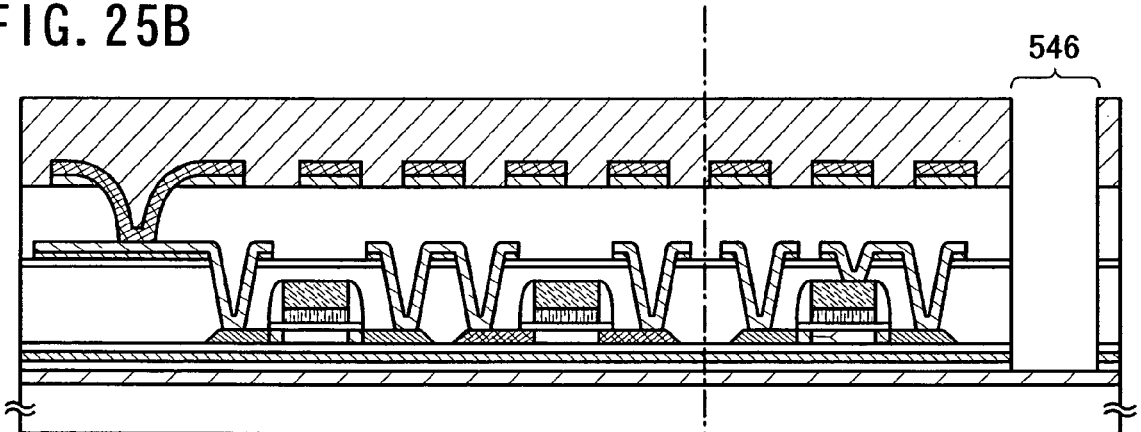

Next, as illustrated in FIG. 25B, a groove 546 is formed in order to divide the ID chips. The groove 546 may have the depth of such a degree that the stripping layer 501 is exposed. The groove 546 can be formed by a dicing method, a scribing method, or the like. Further, the groove 546 is not necessarily formed when it is not required to divide the ID chips formed over the first substrate 500.

Figure 25C:
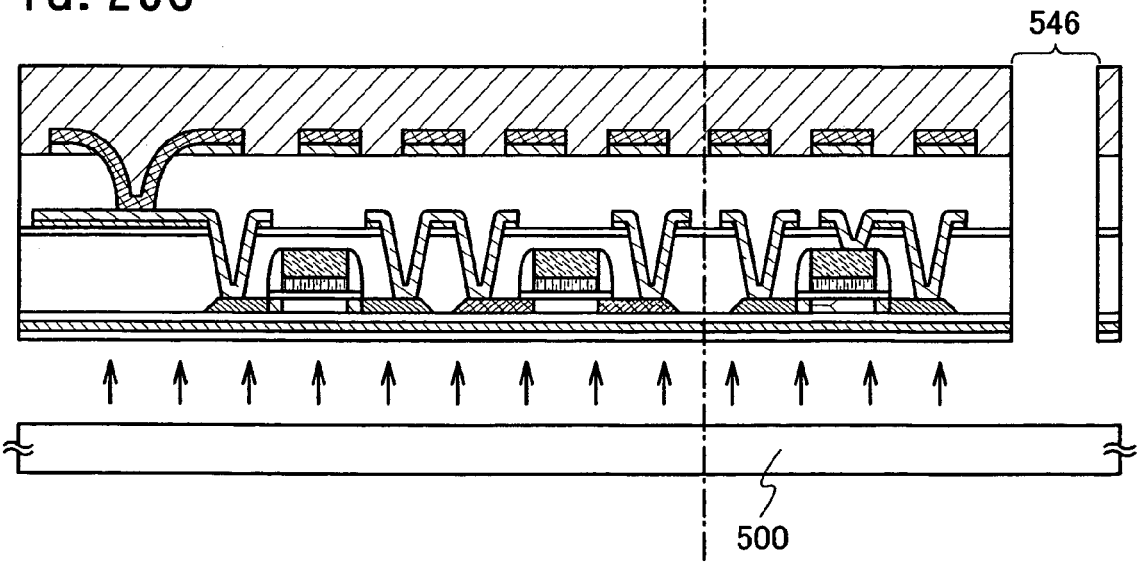

As illustrated in FIG. 25C, the stripping layer 501 is etched off. In this embodiment, halogen fluoride is used as an etching gas and the gas is introduced from the groove 546. In this embodiment, $ClF_3$ (chlorine trifluoride) is used under the condition where the temperature is 350° C., the flow rate is 300 sccm, the pressure is 6 Torr, and the etching time is 3 hours. Alternatively, the $ClF_3$ gas mixed with nitrogen may be used. The stripping layer 501 can be selectively etched by using the halogen fluoride such as $ClF_3$ so that the first substrate 500 can be stripped from the TFTs 530 to 532. The halogen fluoride may be gas or liquid.

Figure 26A:
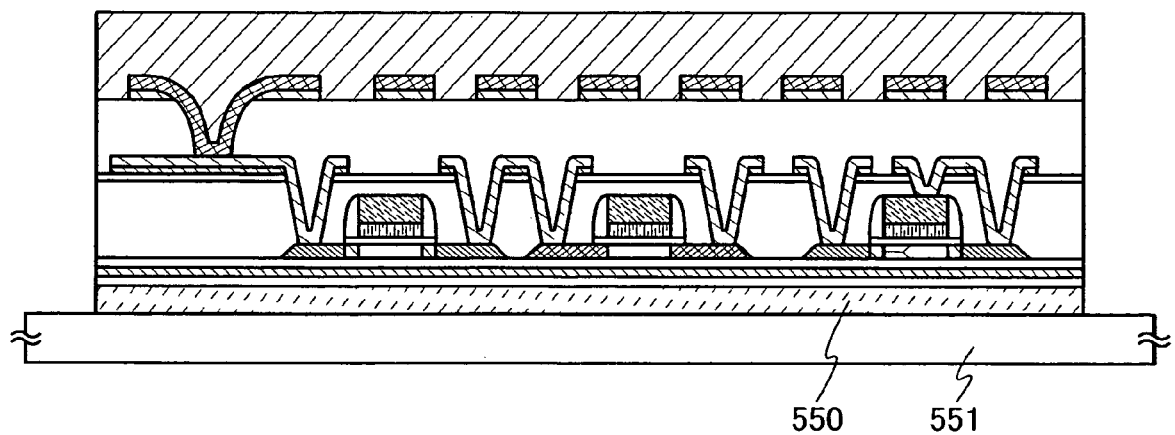
FIGS. 26A and 26B are cross-sectional views each illustrating a process of manufacturing an ID chip according to a certain aspect of the present invention.

As illustrated in FIG. 26A, the stripped TFTs 530 to 532 and the antenna 542 are attached to a second substrate 551 by using an adhesive agent 550. The adhesive agent 550 is formed of the material that can attach the second substrate 551 and the base film 502 to each other. The adhesive agent 550 may be, for example, a photo-curing type such as a reactive-curing type, a thermosetting type, and a UV-curable type, or an anaerobic type.

The second substrate 551 can be formed of an organic material such as flexible paper or plastic. Alternatively, a flexible inorganic material may be used as the second substrate 551. The plastic substrate may be formed of ARTON including poly-norbornene that has a polar group (manufactured by JSR). In addition, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, or the like can be given as an example of the material of the plastic substrate. It is desirable that the second substrate 551 has heat conductivity as high as approximately 2 W/mK to 30 W/mK in order to diffuse the heat generated in the integrated circuit.

Figure 26B:
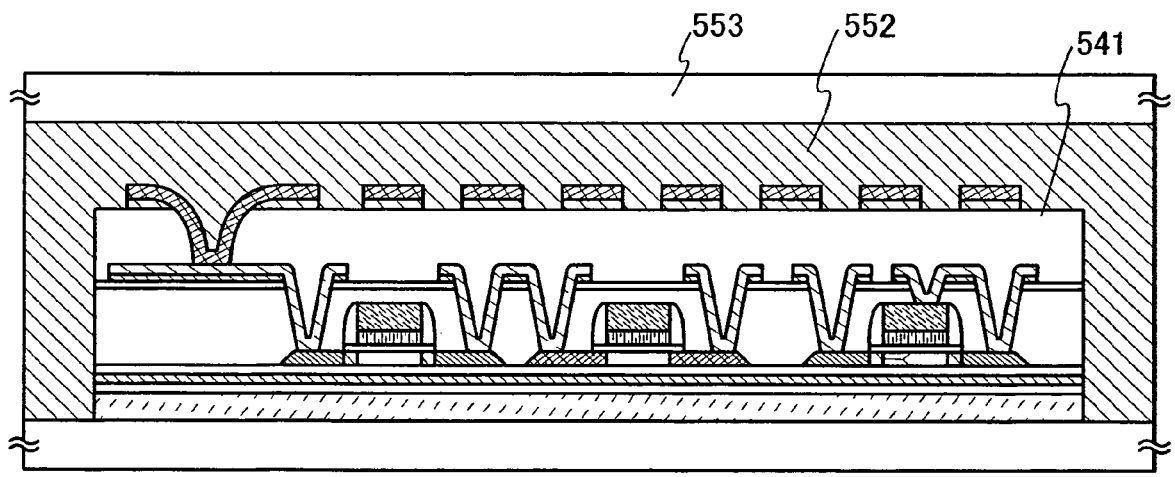

As illustrated in FIG. 26B, after removing the protective layer 545, an adhesive agent 552 is coated over the third interlayer insulating film 541 so as to cover the antenna 542, and then the cover member 553 is attached. The organic material such as flexible paper or plastic can be used as the cover member 553 in the same manner as the second substrate 551. The thickness of the adhesive agent 552 may range from 10 μm to 200 μm.

The adhesive agent 552 is formed of the material that can attach the cover member 553, the third interlayer insulating film 541, and the antenna 542. The adhesive agent 552 can be, for example, photo-curing type such as a reactive-curing type, a thermosetting type, and an UV-curing type, or an anaerobic type.

According to the foregoing processes, the ID chip is completed. Through the above manufacturing method, an extremely thin integrated circuit having the total thickness in the range from 0.3 to 3 μm, typically approximately 2 μm, can be formed between the second substrate 551 and the cover member 553. The thickness of the integrated circuit includes not only the thickness of the semiconductor element but also the thickness of the insulating films and the interlayer insulating films formed between the adhesive agent 550 and the adhesive agent 552. The integrated circuit included in the ID chip can be formed to occupy an area of approximately 5 mm square (square measure of 25 mm$^2$) or less, more preferably approximately from 0.3 mm square (0.09 mm$^2$) to 4 mm square (16 mm$^2$).

Although an example of using the cover member 553 is illustrated in FIG. 26B, the present invention is not limited to this constitution. For example, the processes may be finished up to that illustrate in FIG. 26A.

Although this embodiment describes the method for stripping the substrate and the integrated circuit by providing the stripping layer between the first substrate 500 having high heat resistance and the integrated circuit to be stripped from the first substrate through the etching, a method for manufacturing the ID chip of the present invention is not limited to this constitution. For example, a metal oxide film may be provided between the integrated circuit and the substrate having high heat resistance, and the metal oxide film may be weakened by crystallization so that the integrated circuit is stripped. Alternatively, the stripping layer formed of an amorphous semiconductor film including hydrogen may be provided between the integrated circuit and the substrate having high heat resistance, and the substrate and the integrated circuit may be stripped by removing the stripping layer by the laser irradiation. Further, alternatively, the integrated circuit may be stripped from the substrate by mechanically removing the substrate having high heat resistance with the integrated circuit formed thereover or by etching the substrate off while using solution or gas.

When the adhesive agent 550 in contact with the base film 502 is formed of an organic resin in order to secure the flexibility of the ID chip, the diffusion of the alkali-earth metal or the alkali metal such as Na from the organic resin into the semiconductor film can be prevented by using a silicon nitride film or a silicon nitride film containing oxygen as the base film 502.

When an object to which an ID chip is attached has a curved surface and the second substrate 551 of the ID chip curves so as to have a curved surface along a generating line such as a conical surface or a cylindrical surface, it is desirable to conform the direction of the generating line to the moving direction of the carriers of the TFTs 530 to 532. With the above structure, even when the second substrate 551 is curved, it is possible to suppress an adverse effect on characteristics of the TFTs 530 to 532 due to it. When the proportion of the area of the island-shaped semiconductor film in the integrated circuit is 1% to 30%, it is possible to further suppress the change of the characteristics of the TFTs 530 to 532 due to the curve of the second substrate 551.

Although this embodiment describes an example for forming the antenna over the same substrate as the integrated circuit, the present invention is not limited to this constitution. The antenna and the integrated circuit which are formed over different substrates may be attached to each other afterward so that they are connected electrically.

The frequency of the electric wave usually applied in the ID chip is 13.56 MHz or 2.45 GHz, and it is important to form the ID chip so that these frequencies can be detected in order to enhance the versatility.

The ID chip of this embodiment has advantages that the electric wave is hard to be blocked compared to the ID chip formed over the semiconductor substrate and that attenuation of the signal due to the block of the electric wave can be suppressed. Since the semiconductor substrate is not required in the present invention, the cost for manufacturing the ID chip can be reduced drastically. For example, a silicon substrate having a diameter of 12 inches is compared with a glass substrate having a size of 730×920 $mm^2$. The former silicon substrate has an area of approximately 73,000 $mm^2$ while the latter glass substrate has an area of approximately 672,000 $mm^2$. Therefore, the glass substrate is approximately 9.2 times larger than the silicon substrate. From the glass substrate having the size of approximately 672000 $mm^2$, approximately 672000 number of ID chips each of which is 1 mm square can be obtained when the area wasted by dividing the substrate is ignored. The number of ID chips is approximately 9.2 times larger than that formed using the silicon substrate. In addition, since fewer processes are required when the glass substrate sized 730×920 $mm^2$ is used than when the semiconductor substrate with a 12-inches diameter is used, the amount of the facility investment for the mass production of the ID chip can be reduced up to ⅓. Further, after stripping the integrated circuit from the glass substrate, the glass substrate can be used again. Even after considering all the costs for compensating a damaged glass substrate and washing the surface of the glass substrate, the cost can be decreased to a large degree compared with the case of using the silicon substrate. Even when the glass substrate is disposed without recycling, the cost of the glass substrate having a size of 730×920 $mm^2$ is about a half that of the silicon substrate having a diameter of 12 inches. Therefore, it can be understood that the cost for the ID chip can be reduced drastically.

As a result, when the glass substrate having a size of 730×920 $mm^2$ is used, the price of the ID chip can be made approximately 1/30 that of the ID chip formed over the silicon substrate having a diameter of 12 inches. Since the ID chip is expected to be used as a disposable chip, the ID chip of the present invention, which can reduce the cost drastically, is very advantageous in this application.

Although this embodiment describes an example in which the stripped integrated circuit is attached to the flexible substrate, the present invention is not limited to this constitution. For example, in the case of using a substrate having heat resistant temperature which can withstand heat treatment in a process of manufacturing an integrated circuit like a glass substrate, the integrated circuit is not required to be stripped.

Moreover, this embodiment can be arbitrarily combined with any description of Embodiment Mode and Embodiments 1 to 7, if necessary.

Embodiment 9

Examples of the electric apparatus to which the present invention can be applied include a camera such as a video camera or a digital camera, a goggle type display (head mounted display), a navigation system, an audio reproducing device (e.g., a car audio component system), a computer, a game machine, a portable information terminal (e.g., a mobile computer, a cellular phone, a portable game machine, an electronic book, and the like), and an image reproducing device provided with a recording medium. (specifically, a device which is capable of reproducing a recording medium such as a Digital Versatile Disc (DVD) and provided with a display of displaying the reproduced image). FIGS. 27A to 28E each illustrate specific example thereof.

Figure 27A:
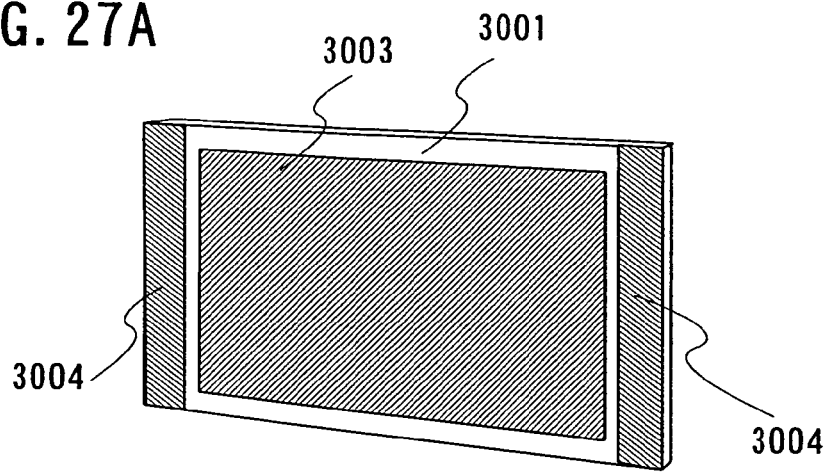
FIGS. 27A to 27D are views each illustrating an example of an electric apparatus to which the present invention is applied.

FIG. 27A illustrates a light-emitting display device such as a TV receiver, which includes a casing 3001, a display portion 3003, a speaker portion 3004, and the like. The present invention can be applied to the display portion 3003, a control circuit portion, and the like. A polarizing plate or a circularly polarizing plate may be provided in the pixel portion in order to enhance the contrast. For example, a ¼λ plate, a ½λ plate, and a polarizing plate may be sequentially provided in the sealing substrate. Further, an anti-reflective film may be provided over the polarizing plate. According to the present invention, reliability is improved and quality of display is also improved. In addition, a manufacturing place, a distribution channel, and the like can be clarified when an ID chip manufactured in Embodiment 8 is mounted.

Figure 27B:
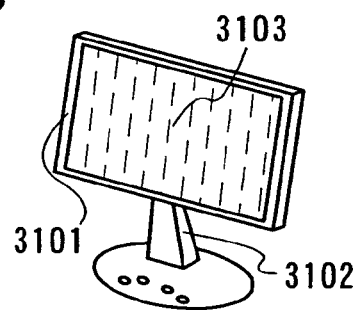

FIG. 27B illustrates a liquid crystal display or an OLED display, which includes a casing 3101, a support 3102, a display portion 3103, and the like. The present invention can be applied to the display portion 3103, a control circuit portion, and the like. According to the present invention, reliability is improved and quality of display is also improved. In addition, a manufacturing place, a distribution channel, and the like can be clarified when an ID chip manufactured in Embodiment 8 is mounted.

Figure 27C:
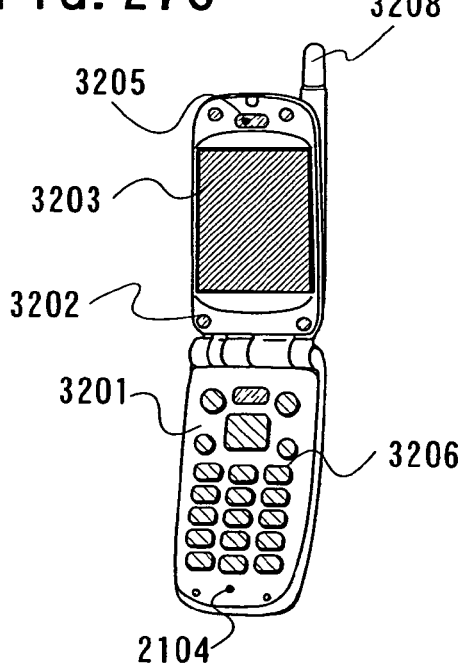

FIG. 27C illustrates a cellular phone, which includes a main body 3201, a casing 3202, a display portion 3203, an audio input portion 3204, an audio output portion 3205, an operation key 3206, an antenna 3208, and the like. The present invention can be applied to the display portion 3203, a control circuit portion, and the like. According to the present invention, reliability is improved and quality of display is also improved. In addition, a manufacturing place, a distribution channel, and the like can be clarified when an ID chip manufactured in Embodiment 8 is mounted.

Figure 27D:
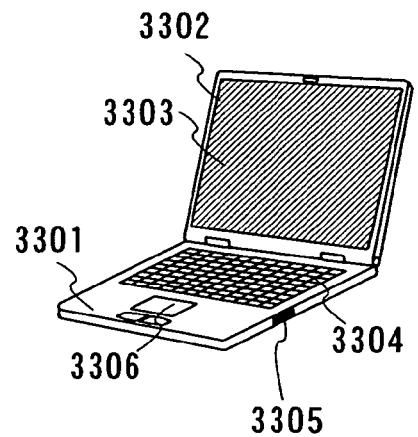

FIG. 27D illustrates a computer, which includes a main body 3301, a casing 3302, a display portion 3303, a keyboard 3304, an external connection port 3305, a pointing mouse 3306, and the like. The present invention can be applied to the display portion 3303, a control circuit portion, and the like. According to the present invention, reliability is improved and quality of display is also improved. In addition, a manufacturing place, a distribution channel, and the like can be clarified when an ID chip manufactured in Embodiment 8 is mounted.

FIG. 28A illustrates a portable computer, which includes a main body 4001, a display portion 4002, a switch 4003, operation keys 4004, an infrared port 4005, and the like. The present invention can be applied to the display portion 4002, a control circuit portion, and the like. According to the present invention, reliability is improved and quality of display is also improved. In addition, a manufacturing place, a distribution channel, and the like can be clarified when an ID chip manufactured in Embodiment 8 is mounted.

FIG. 28B illustrates a portable game machine, which includes a casing 4101, a display portion 4102, speaker portions 4103, operation keys 4104, a recording medium insert portion 4105, and the like. The present invention can be applied to the display portion 4102, a control circuit portion, and the like. According to the present invention, reliability is improved and quality of display is also improved. In addition, a manufacturing place, a distribution channel, and the like can be clarified when an ID chip manufactured in Embodiment 8 is mounted.

FIG. 28C illustrates a portable image reproducing device equipped with a recording medium (specifically, a DVD reproducing device), which includes a main body 4201, a casing 4202, a display portion A 4203, a display portion B 4204, a recording medium (such as a DVD) reading portion 4205, operation keys 4206, speaker portions 4207, and the like. The display portion A 4203 mainly displays image information, and the display portion B 4204 mainly displays textual information. The present invention can be applied to the display portion A 4203, the display portion B 4204, a control circuit portion, and the like. Further, the image reproducing device equipped with a recording medium includes a home video game machine and the like. According to the present invention, reliability is improved and quality of display is also improved. In addition, a manufacturing place, a distribution channel, and the like can be clarified when an ID chip manufactured in Embodiment 8 is mounted.

FIG. 28D illustrates a wireless TV having a portable display. A casing 4302 has a built-in battery and a built-in signal receiver, and a display portion 4303 or a speaker portion 4307 is driven by the battery. The buttery can be charged repeatedly by a battery charger 4300. The battery charger 4300 can transmit and receive an image signal, and transmit an image signal to the signal receiver of the display. The casing 4302 is controlled by operation keys 4306. The device illustrated in FIG. 28D can be also referred to as a video-audio bidirectional communication device, since a signal can be transmitted to the battery charger 4300 from the casing 4302 by operating the operation keys 4306. Further, the device can be also referred to as an all-purpose remote-control device, since it is possible that a signal can be transmitted to the battery charger 4300 from the casing 4302 and a signal that the battery charger 4300 can transmit is received by another electric apparatus by operating the operation keys 4306, thereby controlling communication of another electric apparatus. The present invention can be applied to the display portion 4303, a control circuit portion, and the like. According to the present invention, reliability is improved and quality of display is also improved. In addition, a manufacturing place, a distribution channel, and the like can be clarified when an ID chip manufactured in Embodiment 8 is mounted.

A plastic substrate having heat resistance in addition to a glass substrate can be used for a display device used for these electric apparatus depending on its size, intensity, or intended use. Accordingly, weight can be further reduced.

Further, an example described in this embodiment is just one example, and examples of the electronic apparatus to which the present invention can be applied are not limited to these uses.

This embodiment can be arbitrarily combined with any description of Embodiment Mode and Embodiments 1 to 8.

According to the present invention, damage due to etching in the case of forming a contact hole in an insulating film can be prevented. In addition, adhesiveness between the insulating film and a conductive film which is an electrode material can be improved. Thus, reliability or quality of a semiconductor apparatus can be improved.

This application is based on Japanese Patent Application serial No. 2004-139148 field in Japan Patent Office on May 7th, 2004, the contents of which are hereby incorporated by reference.

What is claimed is:

1. A method for manufacturing a semiconductor device comprising:
   forming a semiconductor layer, a gate insulating film, and a gate electrode over a substrate;
   forming an interlayer insulating film over the semiconductor layer, the gate insulating film, and the gate electrode;
   forming a conductive metal film over the interlayer insulating film; and
   forming a contact hole in the conductive metal film by dry etching and in the interlayer insulating film by dry etching.

2. The method for manufacturing the semiconductor device according to claim 1, wherein the conductive metal film contains Ti, Ta, W, or nitride thereof.

3. The method for manufacturing the semiconductor device according to claim 1, wherein the contact hole is penetrating the conductive metal film and the interlayer insulating film.

4. A method for manufacturing a semiconductor device comprising:
   forming a semiconductor layer, a gate insulating film, and a gate electrode over a substrate;
   forming an interlayer insulating film over the semiconductor layer, the gate insulating film, and the gate electrode;
   forming a conductive metal film over the interlayer insulating film;
   forming a contact hole in the conductive metal film by dry etching and in the interlayer insulating film by dry etching;

forming a second electrode connecting to the semiconductor layer or the gate electrode through the contact hole; and removing part of the conductive metal film in a self-aligned manner by using the second electrode as a mask.

5. The method for manufacturing a semiconductor device according to claim 4, wherein the conductive metal film contains Ti, Ta, W, or nitride thereof.

6. The method for manufacturing the semiconductor device according to claim 4, wherein the contact hole is penetrating the conductive metal film and the interlayer insulating film.

7. A method for manufacturing a semiconductor device comprising:
   forming a semiconductor layer, a gate insulating film, and a gate electrode over a substrate;
   forming a first interlayer insulating film over the semiconductor layer, the gate insulating film, and the gate electrode;
   forming a first conductive metal film over the first interlayer insulating film;
   forming a first contact hole in the first conductive metal film by dry etching and in the first interlayer insulating film by dry etching;
   forming a second electrode connecting to the semiconductor layer or the gate electrode through the first contact hole;
   removing part of the first conductive metal film in a self-aligned manner by using the second electrode as a mask;
   forming a second interlayer insulating film over the first interlayer insulating film and the second electrode;
   forming a second conductive metal film over the second interlayer insulating film; and
   forming a second contact hole in the second conductive metal film by dry etching and in the second interlayer insulating film by dry etching.

8. The method for manufacturing a semiconductor device according to claim 7, wherein a third electrode is formed through the second contact hole over the second conductive metal film.

9. The method for manufacturing a semiconductor device according to claim 7, wherein the second interlayer insulating film is a planarizing film.

10. The method for manufacturing a semiconductor device according to claim 7, wherein the first conductive metal film contains Ti, Ta,W, or nitride thereof.

11. The method for manufacturing a semiconductor device according to claim 7, wherein the second conductive metal film contains Ti, Ta, W, or nitride thereof.

12. The method for manufacturing a semiconductor device according to claim 7, wherein the second interlayer insulating film contains an organic material.

13. The method for manufacturing a semiconductor device according to claim 7, wherein the second interlayer insulating film contains a silicon oxide film formed using siloxane.

14. The method for manufacturing the semiconductor device according to claim 7, wherein the first contact hole is penetrating the first conductive metal film and the first interlayer insulating film, and
   wherein the second contact hole is penetrating the second conductive metal film and the second interlayer insulating film.

15. A method for manufacturing a semiconductor device comprising:
   forming a semiconductor layer over a substrate, a gate electrode over the semiconductor layer, and a gate insulating film interposed therebetween;
   forming an interlayer insulating film over the semiconductor layer, the gate insulating film, and the gate electrode;
   forming a conductive metal film over the interlayer insulating film; and
   forming a contact hole in the conductive metal film by dry etching and in the interlayer insulating film by dry etching.

16. The method for manufacturing a semiconductor device according to claim 15, wherein the patterning is conducted using a mask.

17. The method for manufacturing the semiconductor device according to claim 15, wherein the conductive metal film contains Ti, Ta, W, or nitride thereof.

18. The method for manufacturing the semiconductor device according to claim 15, wherein the contact hole is penetrating the conductive metal film and the interlayer insulating film.

* * * * *